(12) United States Patent
Yamamoto et al.

(10) Patent No.: US 9,490,294 B2
(45) Date of Patent: Nov. 8, 2016

(54) METHOD OF MANUFACTURING SEMICONDUCTOR DEVICE

(71) Applicant: RENESAS ELECTRONICS CORPORATION, Tokyo (JP)

(72) Inventors: Yuki Yamamoto, Tokyo (JP);
Tomohiro Yamashita, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/850,690

(22) Filed: Sep. 10, 2015

(65) Prior Publication Data

US 2016/0079305 A1    Mar. 17, 2016

(30) Foreign Application Priority Data

Sep. 11, 2014 (JP) ................... 2014-185422

(51) Int. Cl.
*H01L 21/265* (2006.01)
*H01L 21/266* (2006.01)
*H01L 27/146* (2006.01)
*H01L 29/10* (2006.01)

(52) U.S. Cl.
CPC ....... *H01L 27/14689* (2013.01); *H01L 21/266* (2013.01); *H01L 21/26513* (2013.01); *H01L 21/26586* (2013.01); *H01L 27/1463* (2013.01); *H01L 27/14641* (2013.01); *H01L 27/14643* (2013.01); *H01L 29/1033* (2013.01)

(58) Field of Classification Search
None
See application file for complete search history.

(56) References Cited

U.S. PATENT DOCUMENTS

| | | | |
|---|---|---|---|
| 7,705,380 B2 | 4/2010 | Yamaguchi et al. | |
| 2011/0294251 A1* | 12/2011 | Soda | H01L 21/26586 438/73 |
| 2012/0037789 A1* | 2/2012 | Tian | H01L 27/14603 250/208.1 |
| 2014/0120652 A1* | 5/2014 | Kawamura | H01L 27/14609 438/69 |

FOREIGN PATENT DOCUMENTS

JP  2008-91781 A  4/2008
JP  2009-130252 A  6/2009

* cited by examiner

*Primary Examiner* — Asok K Sarkar
(74) *Attorney, Agent, or Firm* — McDermott Will & Emery LLP

(57) ABSTRACT

To provide a semiconductor device having improved performance and reduce a production cost.
The semiconductor device has a plurality of photodiodes placed in array form on the main surface of a semiconductor substrate, a $p^+$ type semiconductor region surrounding each photodiode in plan view, and a plurality of transistors placed between the direction-Y adjacent photodiodes. A method of manufacturing the semiconductor device includes forming the $p^+$ type semiconductor region by implanting a p type impurity into the semiconductor substrate through a mask layer opened at a $p^+$ type semiconductor region formation region and implanting an n type impurity into the semiconductor substrate through the mask layer. In the latter step, in the main surface of the semiconductor substrate, an impurity ion is implanted into a region between photodiode formation regions adjacent in the Y direction but not into a region between the photodiode formation regions adjacent in the X direction.

19 Claims, 51 Drawing Sheets

METHOD OF MANUFACTURING SEMICONDUCTOR DEVICE

CROSS-REFERENCE TO RELATED APPLICATIONS

The disclosure of Japanese Patent Application No. 2014-185422 filed on Sep. 11, 2014 including the specification, drawings, and abstract is incorporated herein by reference in its entirety.

BACKGROUND

The present invention relates to a method of manufacturing a semiconductor device, for example, that suited for use in a method of manufacturing a semiconductor device including a solid state image sensor.

As a solid state image sensor, a solid state image sensor (CMOS image sensor) using a CMOS (complementary metal oxide semiconductor) is being developed. This CMOS image sensor is included of a plurality of pixels each having a photodiode and a transfer transistor.

Japanese Unexamined Patent Application Publication No. 2008-91781 (Patent Document 1) describes a technology of forming, in a CMOS image sensor, an element isolation layer between photodiodes adjacent to each other.

Japanese Unexamined Patent Application Publication No. 2009-130252 (Patent Document 2) describes a technology relating to multistage ion implantation.

PATENT DOCUMENTS

[Patent Document 1] Japanese Unexamined Patent Application Publication No. 2008-91781
[Patent Document 2] Japanese Unexamined Patent Application Publication No. 2009-130252

SUMMARY

There are semiconductor devices having a photoelectric conversion element. Such semiconductor devices are desired to have performance as improved as possible. Further, they are desired to be manufactured at a reduced cost. Alternatively, they are desired to have improved performance and be manufactured at a reduced cost.

The other problem and novel features will be apparent from the description herein and accompanying drawings.

According to one embodiment, a semiconductor device has a plurality of photoelectric conversion elements placed on the main surface of a semiconductor substrate in a first direction and a second direction intersecting therewith, thus in array form; a first semiconductor region of a first conductivity type formed in the semiconductor substrate so as to surround each of the photoelectric conversion elements in plan view; and a plurality of transistors placed between the photoelectric conversion elements adjacent to each other in the second direction of the main surface of the semiconductor substrate. A method of manufacturing this semiconductor device includes the steps of: (a) forming, on the semiconductor substrate, a mask layer having an opening portion opened at a formation region of the first semiconductor region; and (b) implanting an impurity ion of the first conductivity type into the semiconductor substrate with the mask layer as an ion implantation preventive mask and thereby forming the first semiconductor region of the first conductivity type in the semiconductor substrate. The method of manufacturing the semiconductor device further has the step of: (c) implanting an impurity ion of a second semiconductor type opposite to the first conductivity type into the semiconductor substrate with the mask layer as an ion implantation preventive mask. In the step (c), in the main surface of the semiconductor substrate, the impurity ion is implanted into a first region corresponding to a region between the photoelectric conversion elements adjacent to each other in the second direction, but the impurity ion is not implanted into a second region corresponding to a region between the photoelectric conversion elements adjacent to each other in the first direction.

According to the one embodiment, a semiconductor device having improved performance can be provided.

Or, a semiconductor device can be manufactured at a reduced cost.

Alternatively, a semiconductor device having improved performance and capable of being manufactured at a reduced cost can be provided.

DETAILED DESCRIPTION

Figure 1:
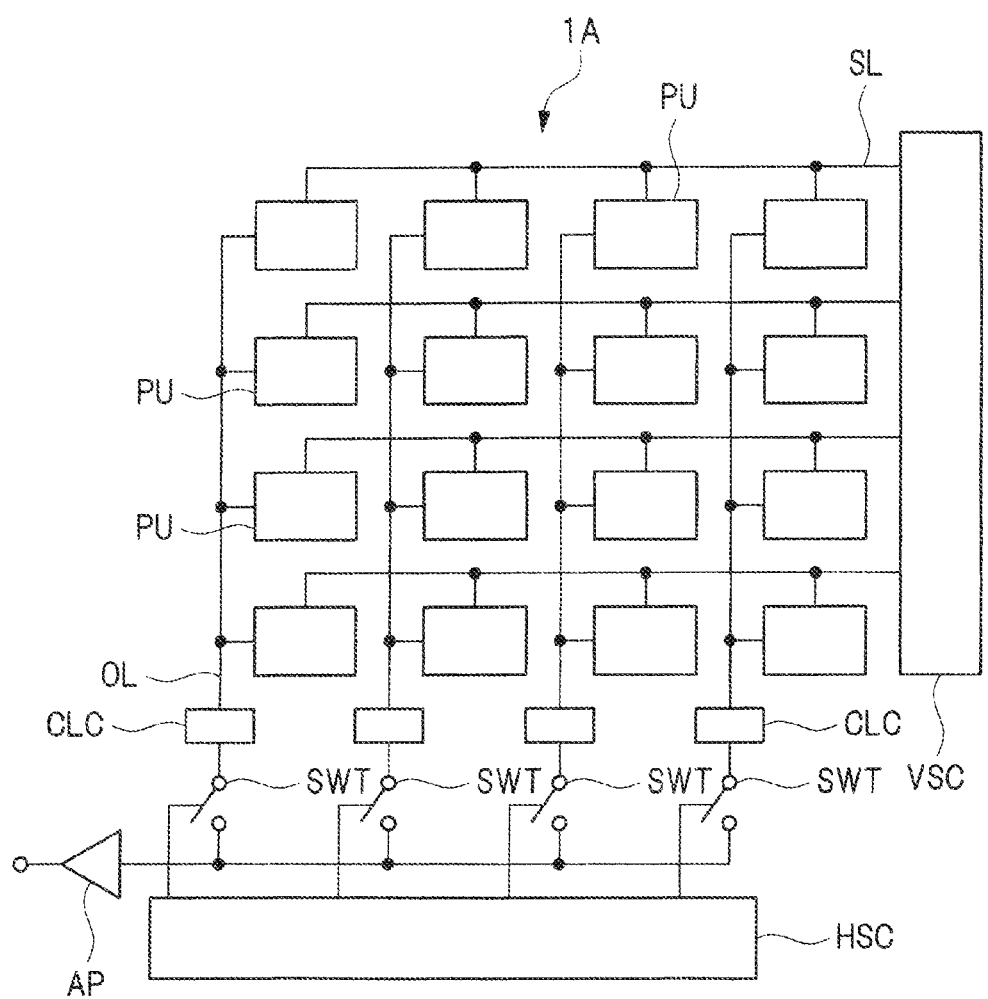
FIG. 1 is a circuit block diagram showing a constitution example of the semiconductor device of First Embodiment.

In the following embodiments, a description may be made after divided in a plurality of sections or embodiments if necessary for the sake of convenience. These sections or embodiments are not independent from each other unless otherwise particularly specified, but one of them may be a modification example, detailed description, complementary description, or the like of a part or whole of the other one. In the following embodiments, when a reference is made to the number of a component (including the number, value, amount, range, or the like), the number is not limited to a specific number but may be more or less than the specific number, unless otherwise particularly specified or principally apparent that the number is limited to the specific number. Further, in the following embodiments, it is needless to say that the constituent component (including component step or the like) is not always essential unless otherwise particularly specified or principally apparent that it is essential. Similarly, in the following embodiments, when a reference is made to the shape, positional relationship, or the like of the constituent component, that substantially approximate or analogous to it is also embraced unless otherwise particularly specified or principally apparent that it is not. This also applies to the above-mentioned number, range, or the like.

An embodiment will hereinafter be described in detail based on drawings. In all the drawings for describing the embodiment, members having the same function will be identified by the same reference numerals and overlapping descriptions will be omitted. In the following embodiments, a description on the same or similar portion is not repeated in principle unless otherwise particularly necessary.

In the drawings to be used in the following embodiment, even a cross-sectional view is sometimes not hatched to make it easier to understand. On the other hand, even a plan view is sometimes hatched to make it easier to understand.

Embodiment

The structure and manufacturing steps of the semiconductor device of the present embodiment will hereinafter be described referring to drawings. In First Embodiment, described is an example in which the semiconductor device is a surface-illuminated CMOS image sensor in which light is made incident from the surface side of a semiconductor substrate.

<Constitution of Semiconductor Device>

Figure 2:
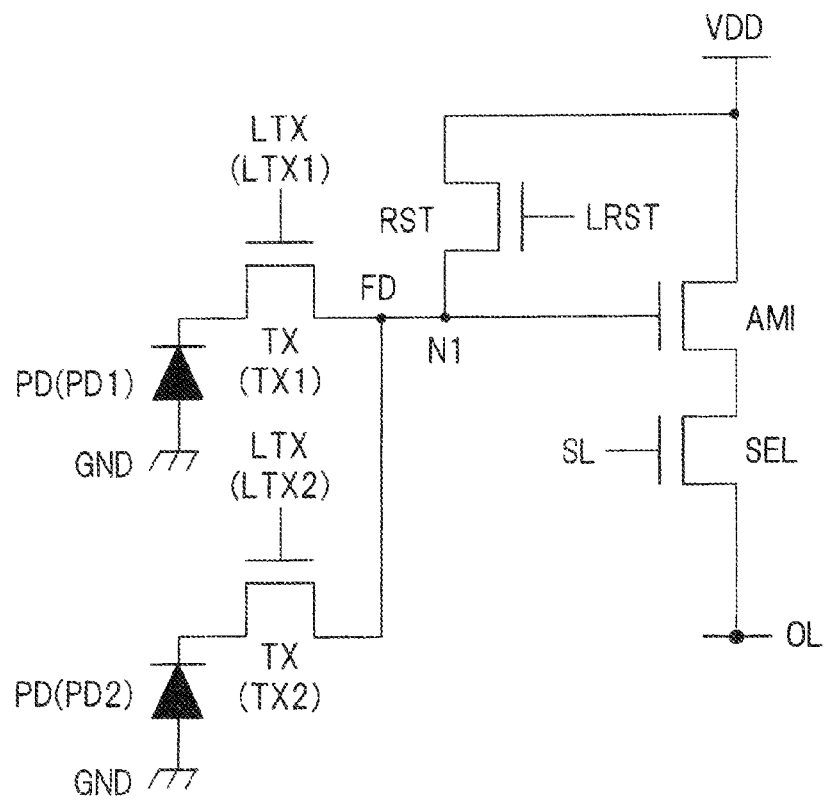
FIG. 2 is a circuit diagram showing a constitution example of a pixel.

FIG. 1 is a circuit block diagram showing a constitution example of the semiconductor device of the present embodiment. FIG. 2 is a circuit diagram showing a constitution example of a pixel. FIG. 1 shows pixels arranged in array form (matrix form). More specifically, 16 pixels are arranged in four rows and four columns. The number of pixels thus arranged is not limited to it, but can be changed. For example, electronic devices such as camera each use even several million pixels in practice.

In a pixel region 1A shown in FIG. 1, a plurality of pixels PU is arranged in an array form and drive circuits such as vertical scanning circuit VSC and horizontal scanning circuit HSC are arranged around the pixel region. Each of the pixels (cells or pixel unit) PU is placed at an intersection between select lines SL and output lines (output signal lines) OL. The select lines SL are each coupled to the horizontal scanning circuit VSC, while the output lines OL are coupled to column circuits CLC, respectively. The column circuits CLC are coupled to an output amplifier AP via switches SWT. The switches SWT are each coupled to the horizontal scanning circuit HSC and controlled by the horizontal scanning circuit HSC.

For example, an electrical signal read out from a pixel PU selected by the vertical scanning circuit VSC and the horizontal scanning circuit HSC is output via the output line OL and the output amplifier AP.

Figure 3:
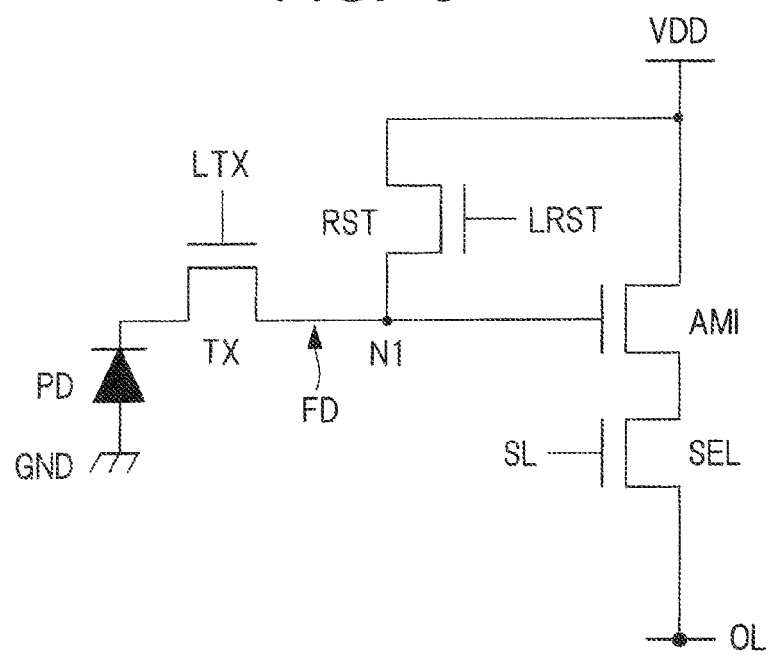
FIG. 3 is a circuit diagram showing another constitution example of a pixel.

The pixel PU is included of, for example, as shown in FIG. 2 or 3, a photodiode PD and transistors RST, TX, SEL, and AMI. These transistors RST, TX, SEL, and AMI are each included of an n channel MISFET (metal insulator semiconductor field effect transistor). Among them, the transistor RST is a reset transistor (transistor for reset), the transistor TX is a transfer transistor (transistor for transfer), the transistor SEL is a select transistor (transistor for selection), and the transistor AMI is an amplifier transistor (transistor for amplification). The transfer transistor TX is a transistor for transferring charges generated by the photodiode PD. The pixel sometimes has, in addition to these transistors, another transistor or element such as capacitive element. These transistors are coupled in various modification or application forms.

FIG. 2 shows a circuit constitution example of two pixels PU. More specifically, FIG. 2 shows a circuit constitution example of a pixel PU having a photodiode PD1 and a pixel PU having a photodiode PD2, two pixels PU in total.

The example shown in FIG. 2 is a circuit in which two pixels PU share an amplifier transistor AMI, a select transistor SEL, and a reset transistor RST. Different from a circuit having a transfer transistor TX per photodiode PD, a set of an amplifier transistor AMI, a select transistor SEL, and a reset transistor RST is provided for two photodiodes PD (PD1 and PD2). The transfer transistor TX provided for the photodiode PD1 is a transfer transistor TX1 and the transistor TX provided for the photodiode PD2 is a transfer transistor TX2.

In the example of the circuit shown in FIG. 2, a ground potential GNC and a node N1 have therebetween the photodiode PD1 and the transfer transistor TX1 coupled in series and the ground potential GND and the node N1 have therebetween the photodiode PD2 and the transfer transistor TX2 coupled in series. The photodiodes (PD1 and PD2) are on the side of the ground potential GND and the transfer transistors (TX1 and TX2) are on the side of the node N1. A series circuit between the photodiode PD1 and the transfer transistor TX1 and a series circuit between the photodiode PD2 and the transfer transistor TX2 are coupled in parallel between the ground potential GND and the node N1. This means that the photodiode PD1 and the photodiode PD2 are coupled to a common floating diffusion FD via the transfer transistor TX1 and the transfer transistor TX2, respectively. The photodiode PD is a PN junction diode and is included of, for example, a plurality of n type or p type impurity diffusion regions (semiconductor regions). The floating diffusion FD has a function as a charge storage portion or floating diffusion layer and is included of, for example, an n type impurity diffusion region (semiconductor region).

The reset transistor RST is coupled to between the node N1 and a power supply potential (power supply potential line) VDD. The select transistor SEL and the amplifier transistor AMI are coupled in series to between the power potential potential VDD and the output line (output signal line) OL. The gate electrode of this amplifier transistor AMI is coupled to the node N1. The gate electrode of the reset transistor RST is coupled to a reset line LRST. The gate electrode of the select transistor SEL is coupled to a select line SL. The gate electrode of the transfer transistor TX is coupled to a transfer line (second select line) LTX. However, the gate electrode of the transfer transistor TX1 is coupled to a transfer line LTX1 and the gate electrode of the transfer transistor TX2 is coupled to a transfer line LTX2.

For example, the transfer lines LTX (LTX1 and LTX2) and the reset line LRST are started (brought to a high level) to turn on the transfer transistors TX (TX1 and TX2) and the reset transistor RST. As a result, charges are extracted and the photodiodes PD (PD1 and PD2) are depleted. Then, the transfer transistors TX (TX1 and TX2) are turned OFF.

Then, for example, when a mechanical shutter of an electronic device such as camera is opened, charges are generated and stored at the photodiodes PD (PD1 and PD2) by incident light during when the shutter is opened. This means that the photodiodes PD (PD1 and PD2) generate charges, receiving incident light.

Next, after the shutter is closed, the reset line LRST is started (brought to a low level) to turn off the reset transistor RST. Further, the select line SL and the transfer line LTX1 are started (brought to a high level) to turn ON the select transistor SEL and the transfer transistor TX1. As a result, charges generated at the photodiode PD1 are transferred to the end portion (floating diffusion FD) of the transfer transistor TX1 on the side of the node N1. At this time, the potential of the floating diffusion FD changes according to the charges transferred from the photodiode PD1 and after amplified by the amplifier transistor AMI, is output to the output line OL. The potential of this outline line OL becomes an electrical signal (light receiving signal) and is read out as an output signal from the output amplifier AP via the column circuit CL and the switch SWT.

The transfer line LTX2 is started (brought to a high level) at a timing different from that of the transfer line LTX1 to turn ON the transfer transistor TX2. Charges generated at the photodiode PD2 are transferred to the end portion (floating diffusion FD) of the transfer transistor TX2 on the side of the node N1. Also in this case, the potential of the floating diffusion FD is amplified by the amplifier transistor AMI and output to the output line OL. This potential of the outline OL becomes an electrical signal (light receiving signal) and is read out as an output signal from the output amplifier AP via the column circuit CL and the switch SWT.

FIG. 3 shows a circuit constitution example of one pixel PU shown in FIG. 1.

In FIG. 3 different from FIG. 2, a set of the transfer transistor TX, the amplifier transistor AMI, the select transistor SEL, and the reset transistor RST is provided for one photodiode PD. This means that in FIG. 2, the amplifier transistor AMI, the select transistor SEL, and the reset transistor RST are shared by two PUs, while in FIG. 3, the amplifier transistor AMI, the select transistor SEL, and the reset transistor RST are shared by one PU not by two PUs. The coupling relationship among the photodiode PD, the transfer transistor TX, the amplifier transistor AMI, the select transistor SEL, and the reset transistor RST, and their function and operation in the circuit constitution of FIG. 3 is basically similar to those in the circuit constitution of FIG. 2 so that overlapping description is omitted here.

Figure 4:
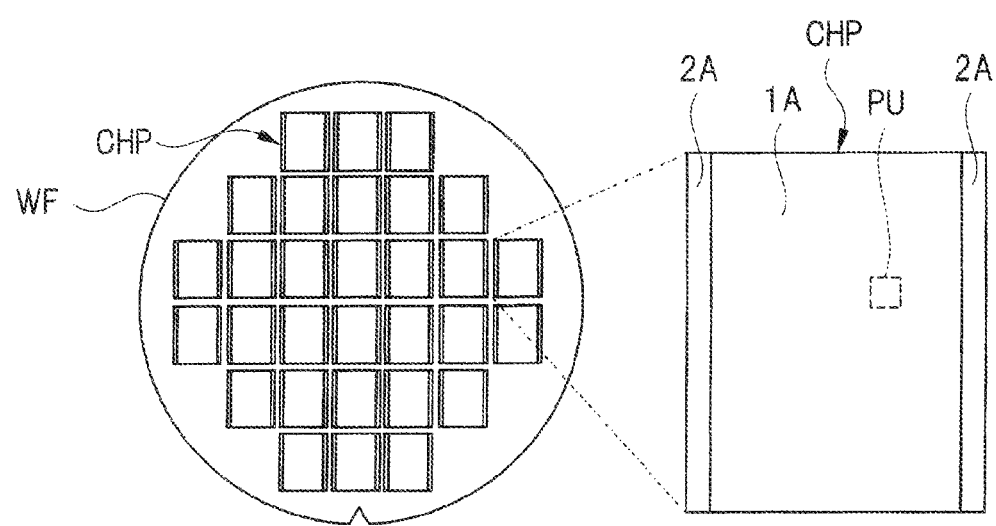
FIG. 4 is a plan view showing a semiconductor wafer and a chip region in which the semiconductor device of First Embodiment is to be formed.

FIG. 4 is a plan view showing a semiconductor wafer and a chip region in which the semiconductor device of the present embodiment is to be formed. As shown in FIG. 4, a semiconductor wafer WF (semiconductor wafer corresponding to a semiconductor substrate SB described later) has a plurality of chip regions CHP. The pixel region 1A shown in FIG. 1 is formed, together with a peripheral circuit region 2A, in one of the chip regions CHP. As described above, the pixel region 1A of each of the chip regions CHP has therein a plurality of the pixels PU in array form. The peripheral circuit region 2A of each of the chip regions CHP has therein a logic circuit. This logic circuit outputs image data based on the arithmetic results obtained, for example, by arithmetic processing of signals output from the pixel region 1A. The chip region CHP is a region from which one of the semiconductor chips can be acquired. The same constitution (the pixel region 1A and the peripheral circuit region 2A) is formed in each of the chip regions CHP in the semiconductor wafer. The semiconductor wafer WF is cut later by dicing and individual chip regions thus obtained become semiconductor chips.

<Planar Layout of Semiconductor Device>

Figure 7:
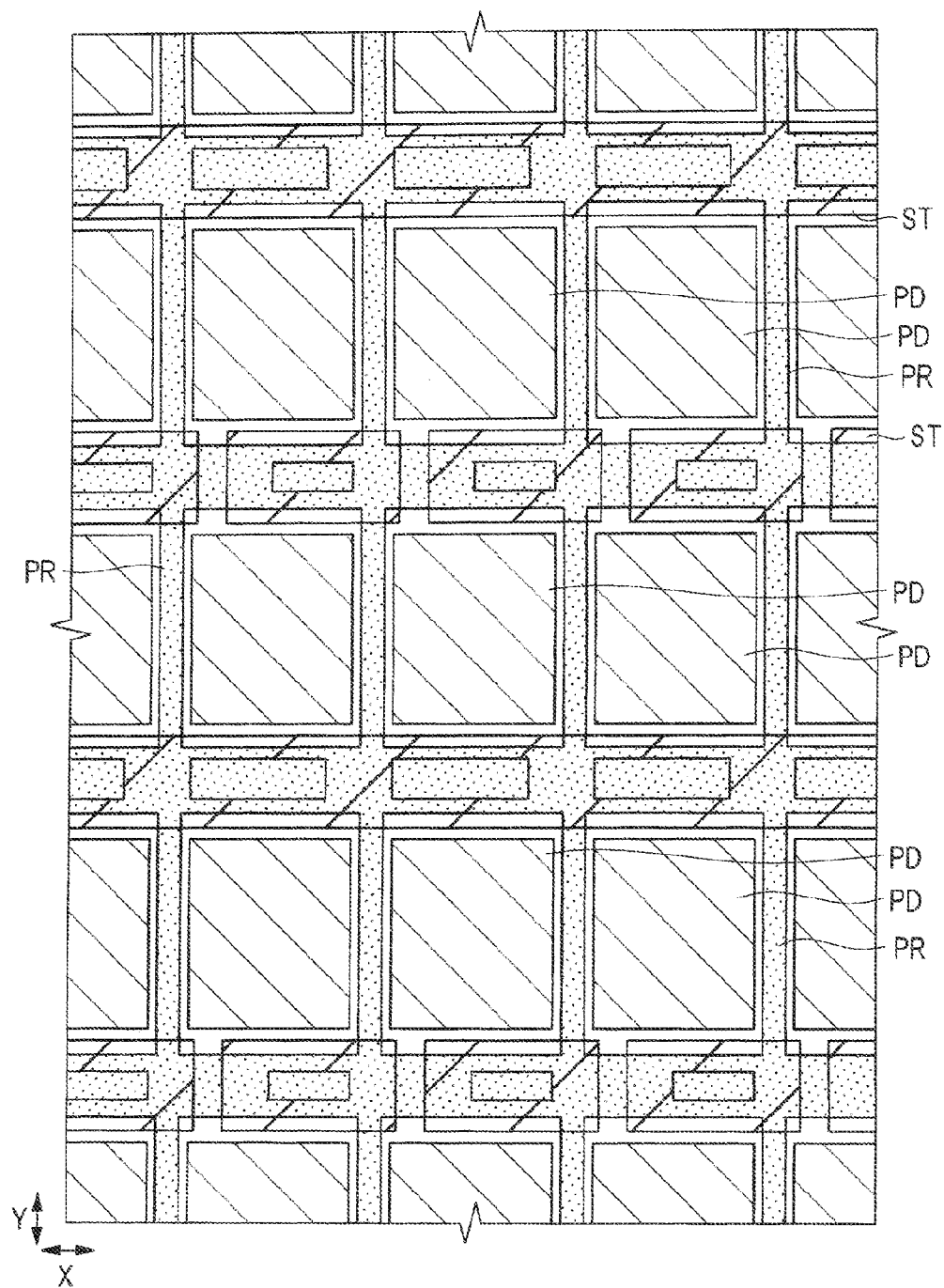
FIG. 7 is a fragmentary plan view of the semiconductor device of First Embodiment.
Figure 8:
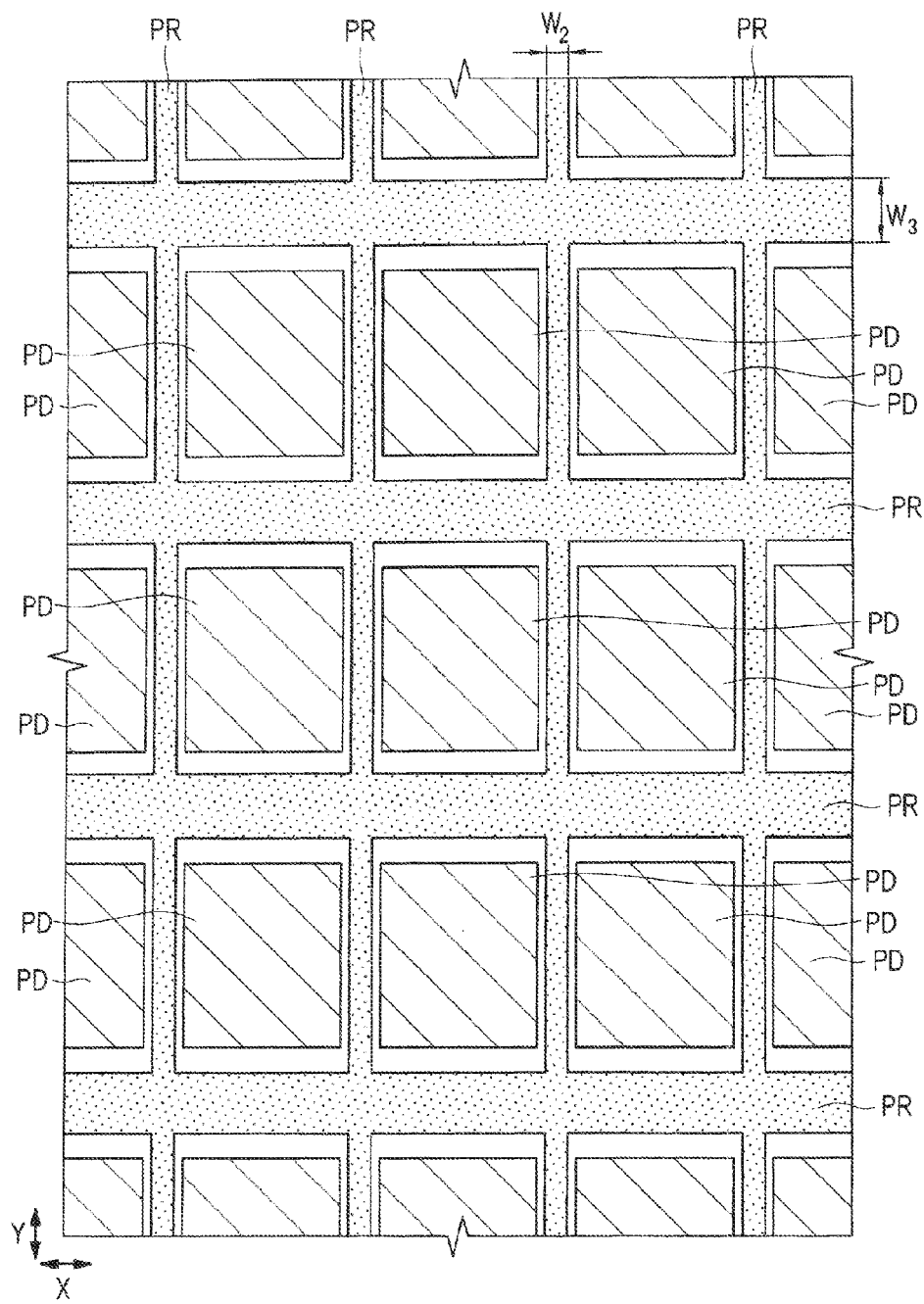
FIG. 8 is a fragmentary plan view of the semiconductor device of First Embodiment.
Figure 9:
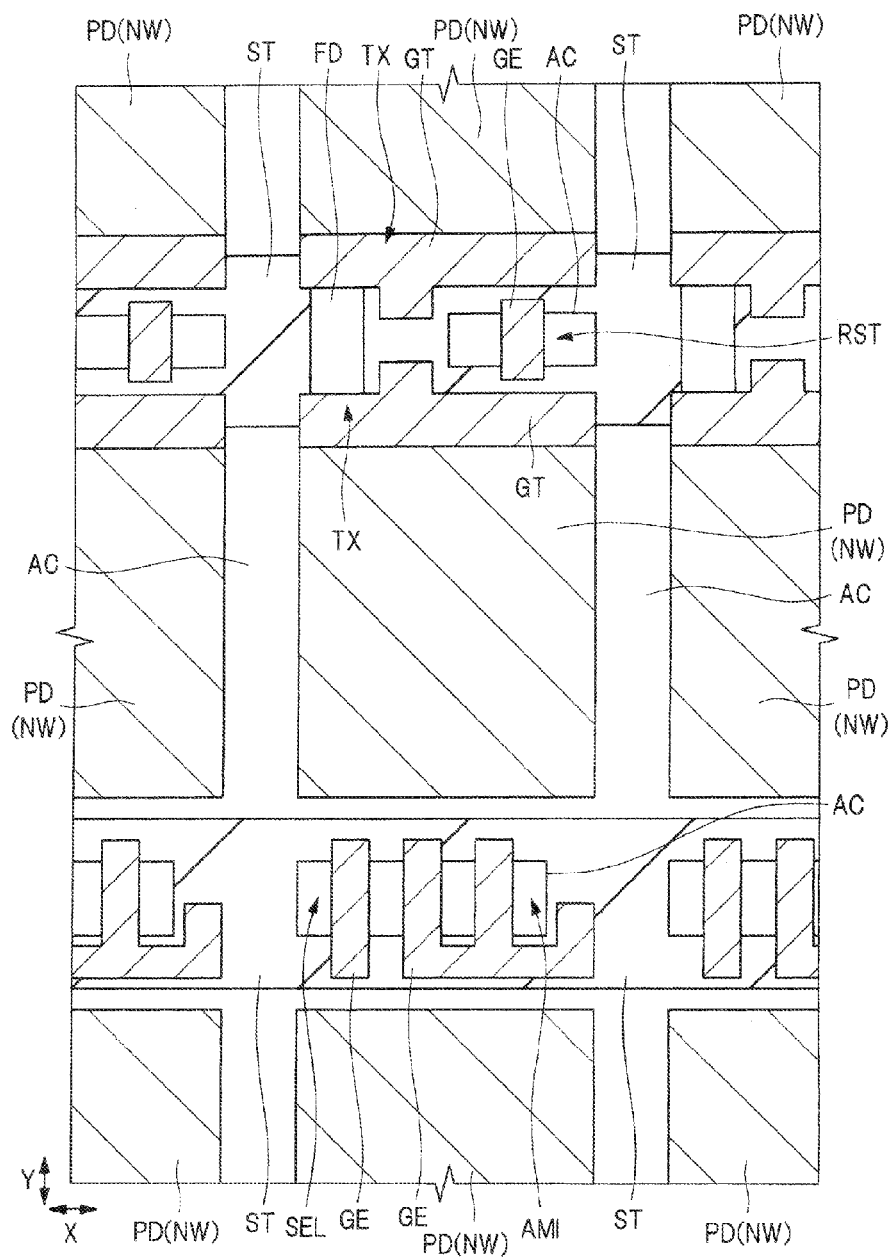
FIG. 9 is a partially enlarged plan view showing a portion of FIG. 5.

FIGS. 5 to 8 are each a plan view showing a portion of the pixel region 1A of the semiconductor device of the present embodiment. FIGS. 5 to 8 show the same plane region. FIG. 9 is a partially enlarged plan view showing a portion of FIG. 5. FIGS. 10 to 14 are fragmentary cross-sectional views of the semiconductor device of the present embodiment.

Figure 5:
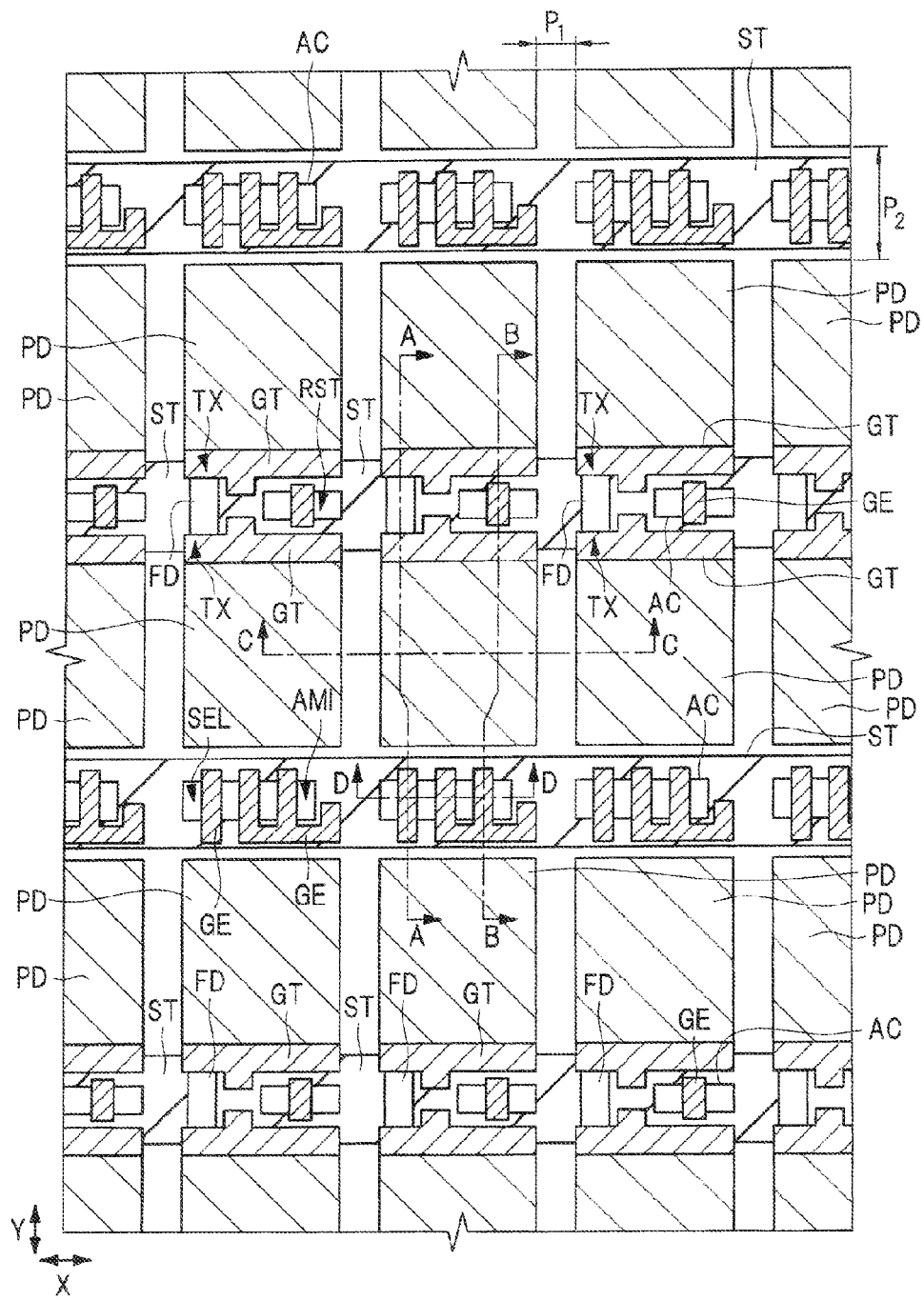
FIG. 5 is a fragmentary plan view of the semiconductor device of First Embodiment.
Figure 6:
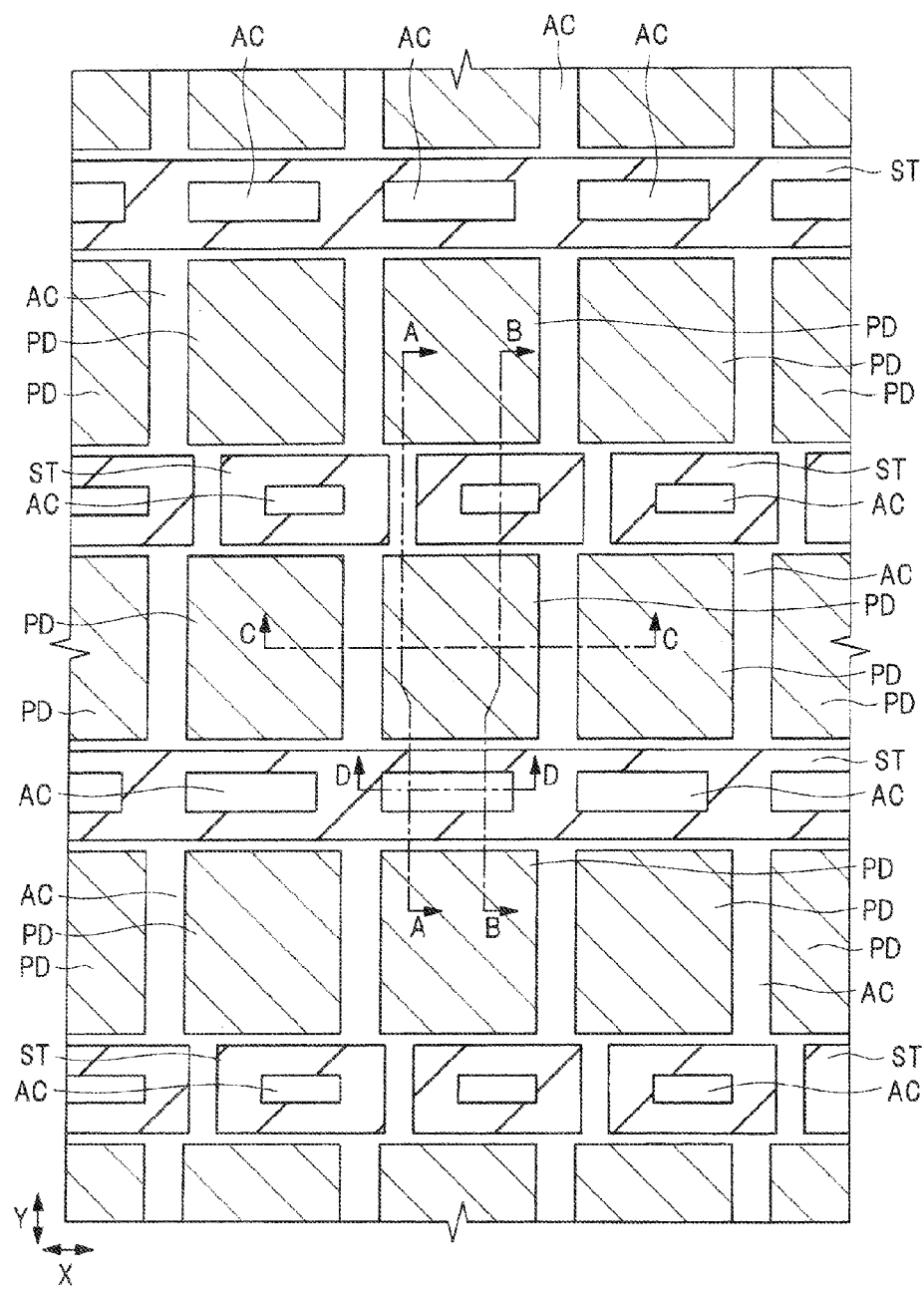
FIG. 6 is a fragmentary plan view of the semiconductor device of First Embodiment.

FIG. 6 is a view obtained by removing gate electrodes GT and GE from FIG. 5; FIG. 7 is a view obtained by adding the layout of a $p^+$ type semiconductor region PR to FIG. 6; FIG. 8 is a view obtained by removing an element isolation region ST from FIG. 7. FIG. 7 is therefore a view obtained by overlapping FIG. 6 with FIG. 8. FIGS. 5 to 9 are plan views. To make them easier to understand, however, the photodiode PD, the gate electrodes GT and GE, and element isolation region ST in FIGS. 5 and 9 are hatched with oblique lines; the photodiode PD and the element isolation region ST are hatched with oblique lines in FIG. 6; the photodiode PD and the element isolation region ST are hatched with oblique lines and the $p^+$ type semiconductor region PR is hatched with dots in FIG. 7; and the photodiode PD is hatched with oblique lines and the $p^+$ type semiconductor region PR is hatched with dots in FIG. 8. This means that the region hatched with dots in FIG. 7 corresponds to the $p^+$ type semiconductor region PR but a portion of the $p^+$ type semiconductor region PR overlaps with the element isolation region ST in plan view.

Figure 12:
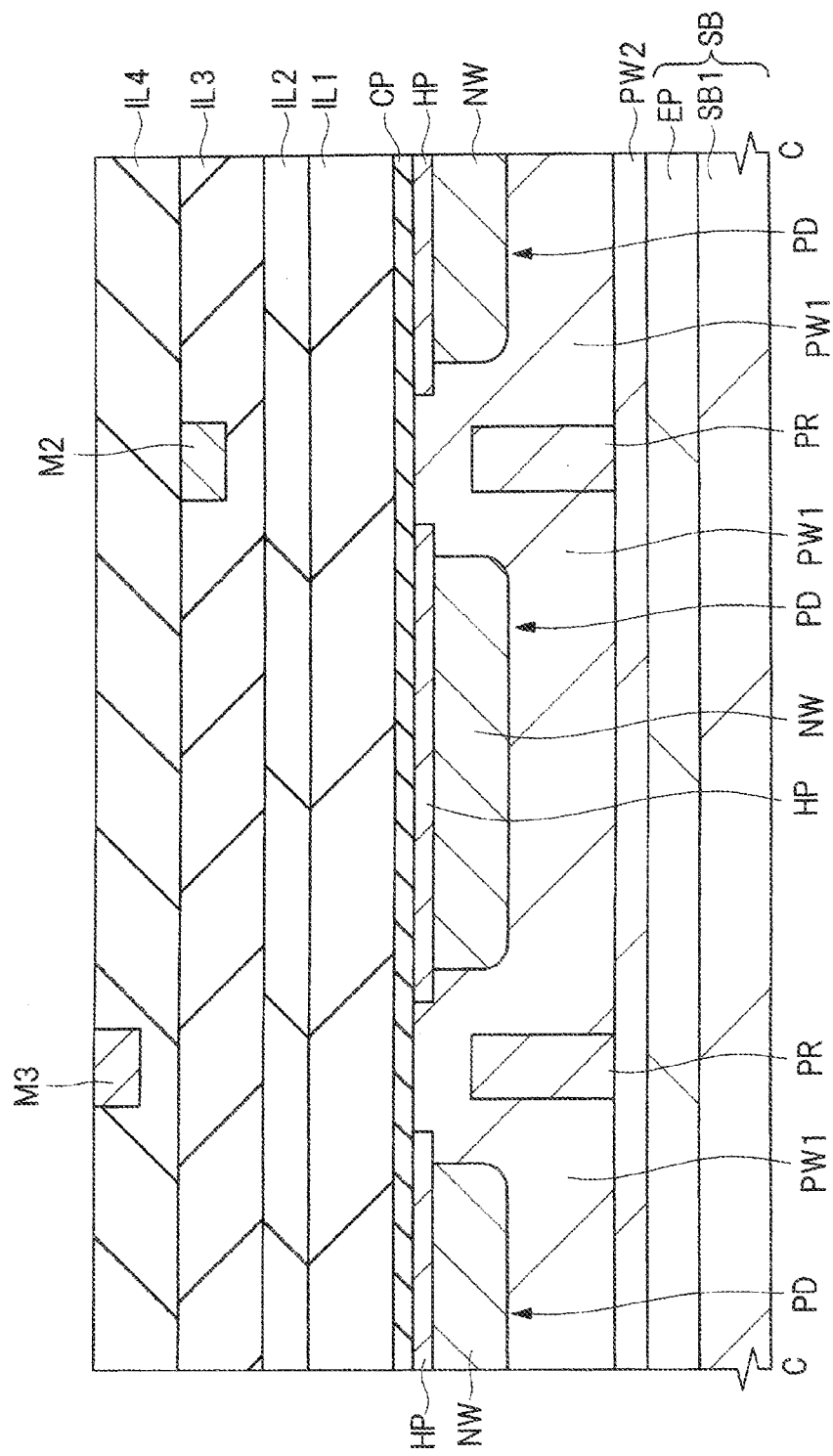
FIG. 12 is a fragmentary cross-sectional view of the semiconductor device of First Embodiment.
Figure 13:
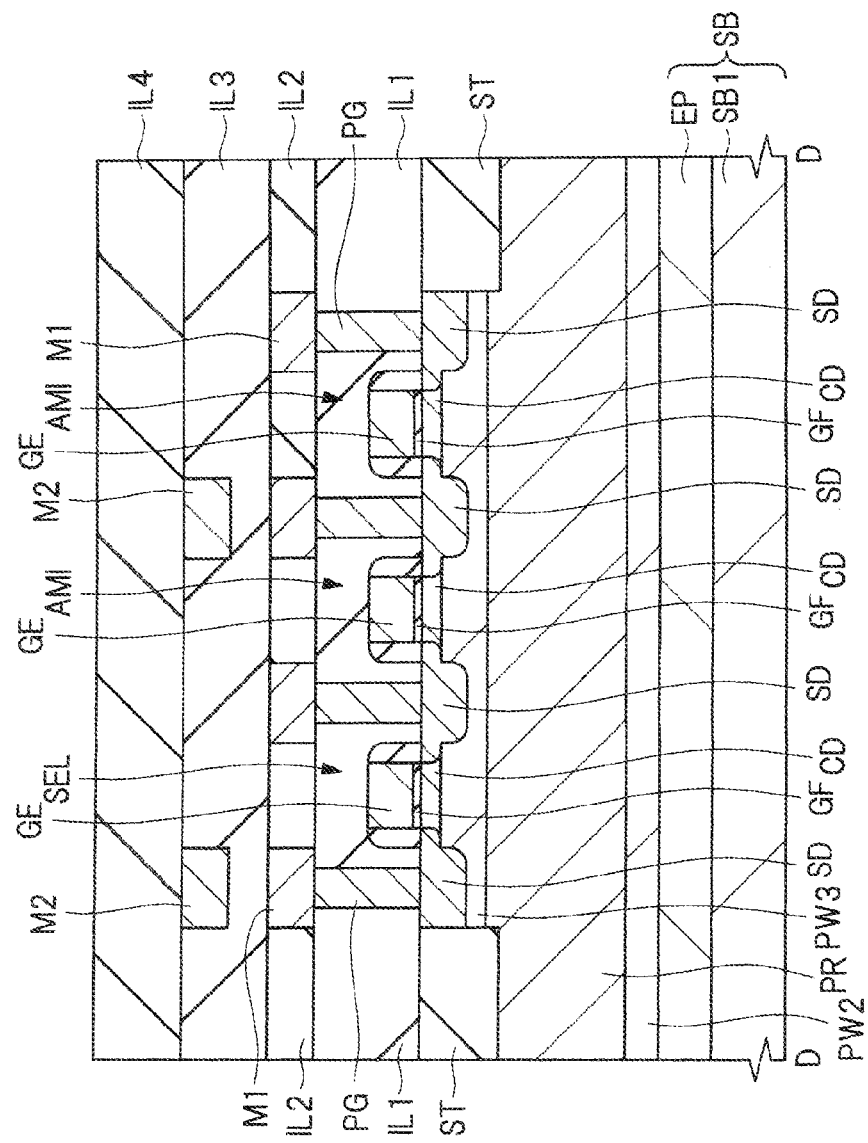
FIG. 13 is a fragmentary cross-sectional view of the semiconductor device of First Embodiment.
Figure 14:
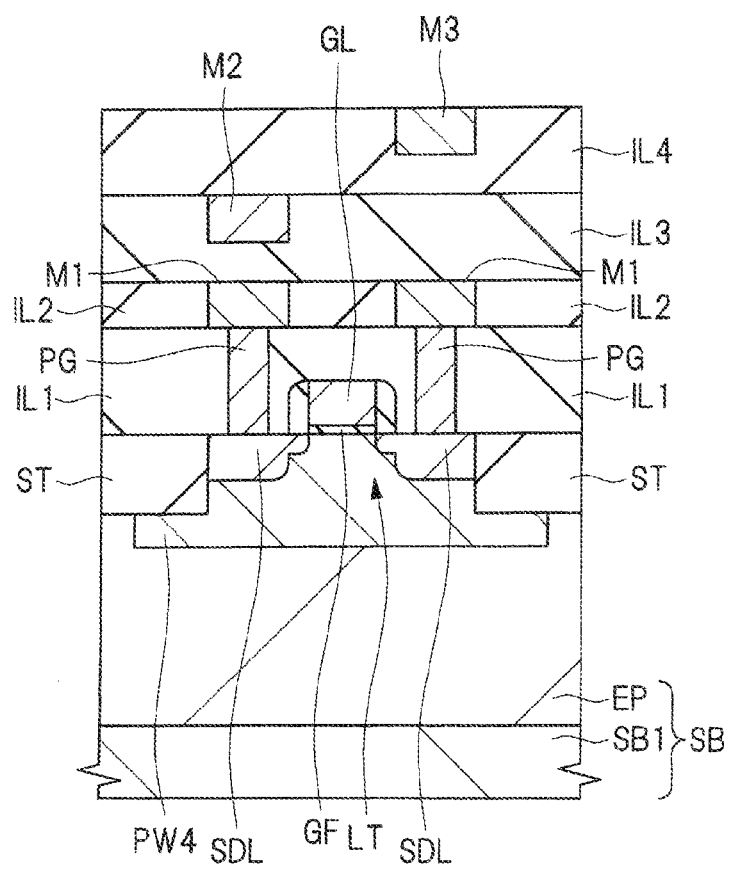
FIG. 14 is a fragmentary cross-sectional view of the semiconductor device of First Embodiment.

Among FIGS. 10 to 14, FIGS. 10 to 13 are fragmentary cross-sectional view of the pixel region 1A (refer to FIG. 4); and FIG. 14 is a fragmentary cross-sectional view of the peripheral circuit region 2A (refer to FIG. 4). The cross-sectional view taken along the line A-A of FIGS. 5 and 6 substantially corresponds to FIG. 10; the cross-sectional view taken along the line B-B of FIGS. 5 and 6 substantially corresponds to FIG. 11; the cross-sectional view taken along the line C-C of FIGS. 5 and 6 substantially corresponds to FIG. 12; and the cross-sectional view taken along the line D-D of FIGS. 5 and 6 substantially corresponds to FIG. 13.

The term "plan view" or "viewed planarly" as used herein means that an object is viewed in a plane parallel to the main surface a semiconductor substrate (corresponding to the semiconductor substrate SB described later) including a semiconductor device.

First, the plane layout of the pixel region 1A of the semiconductor device of the present embodiment will be described referring to FIGS. 5 to 9.

As described above, the pixel region 1A has therein a plurality of pixels PU in array (matrix) form, more specifically, in array form in the X direction and in the Y direction. The X direction and the Y direction intersect with each other, preferably are orthogonal to each other. They are shown in FIG. 5. Further, the X direction and the Y direction are parallel to the main surface of the semiconductor substrate SB described later.

As described above referring to FIGS. 2 and 3, each of the pixels PU has the photodiode PD and the transfer transistor TX. As shown in FIGS. 5 to 9, therefore, the pixel region 1A has therein a plurality of the photodiodes PD in array (matrix) form, more specifically, in array form in the X direction and the Y direction. In the pixel region 1A, the photodiodes PD arranged in array form in the X direction and the Y direction are separated from each other.

In the present embodiment, the transfer transistor TX, the amplifier transistor AMI, the select transistor SEL, and the reset transistor RST are each arranged between the photodiodes PD adjacent to each other in the Y direction. This will equally apply to both the circuit constitution of FIG. 2 and the circuit constitution of FIG. 3. The photodiodes PD adjacent to each other in the X direction have therein none of the transfer transistor TX, the amplifier transistor AMI, the select transistor SEL, and the reset transistor RST. FIG. 5 shows an example of the layout of the circuit constitution of FIG. 2.

More specifically, in plan view, the photodiode PD has, at one of both end portions thereof in the Y direction, the transfer transistor TX. The gate electrode GT of the transfer transistor TX extends in the X direction along the end portion (end side) of the photodiode PD. The gate length direction of the gate electrode GT is the Y direction and the gate width direction of the gate electrode GT is the X direction. In plan view, therefore, the gate electrode GT of the transfer transistor TX has, at one of both sides (both sides in the Y direction, that is, the gate length direction) thereof, the photodiode PD and, at the other side, the floating diffusion FD.

Two transfer transistors TX (corresponding to the transfer transistor TX1 and the transfer transistor TX2 shown in FIG.

2) share the floating diffusion FD between the photodiodes PD adjacent to each other in the Y direction.

The photodiodes PD adjacent to each other in the Y direction via the two transfer transistors TX have therebetween the reset transistor RST at a position neighboring to the floating diffusion FD in the X direction. This reset transistor RST is sandwiched in the Y direction by the gate electrodes GT of the transfer transistors TX extending in the X direction.

In plan view, the photodiodes PD each have the amplifier transistor AMI and the select transistor SEL on one of the Y-direction both end portions of the photodiode opposite to the end portion having the transfer transistor TX thereat. Therefore, the photodiodes PD adjacent to each other in the Y direction have therebetween the amplifier transistor AMI and the select transistor SEL.

Therefore, a region between the two photodiodes PD adjacent to each other in the Y direction has therein two transfer transistors TX and one reset transistor RST or one amplifier transistor AMI and one select transistor SEL. This means that in the column in which the photodiodes PD are arranged in the Y direction, a region having therein two transfer transistors TX and one reset transistor RST and a region having therein one amplifier transistor AMI and one select transistor SEL, each between the photodiodes PD adjacent to each other in the Y direction, are arranged alternately in the Y direction.

When viewed in the X direction, regions each having therein two transfer transistors TX and one reset transistor RST between the photodiodes PD adjacent to each other in the Y direction are arranged in the X direction, while regions having therein one amplifier transistor AMI and one select transistor SEL between the photodiodes PD adjacent to each other in the Y direction are arranged in the X direction.

On the other hand, the photodiodes PD adjacent to each other in the X direction have therebetween none of transfer transistor TX, amplifier transistor AMI, select transistor SEL, and reset transistor RST. In short, the photodiodes PD adjacent to each other in the X direction have therebetween no transistors (MISFETs).

Thus, in the present embodiment, the transfer transistor TX, amplifier transistor AMI, select transistor SEL, and reset transistor RST are arranged not separately in two regions, that is, a region between the photodiodes PD adjacent to each other in the Y direction and a region between the photodiodes PD adjacent to each other in the X direction but only in a region between the photodiodes PD adjacent to each other in the Y direction.

Therefore, a distance $P_2$ of the photodiodes PD adjacent to each other in the Y direction is preferably larger ($(P_2>P_1)$) than a distance $P_1$ of the photodiodes PD adjacent to each other in the X direction. In other words, a distance $P_1$ of the photodiodes PD adjacent to each other in the X direction is preferably smaller ($P_2>P_1$) than a distance $P_2$ of the photodiodes PD adjacent to each other in the Y direction. The distances $P_1$ and $P_2$ are shown in FIG. 5. By making the Y-direction distance $P_2$ larger than the X-direction distance $P_1$ ($P_2>P_1$), transistors can be placed more easily between the photodiodes PD adjacent to each other in the Y direction and at the same time, by making the X-direction distance $P_1$ smaller than the Y-direction distance $P_2$ ($P_2>P_1$), the number of the pixels PU which can be arranged in the pixel region 1A can be increased. When the number of the pixels PU is the same, the area of the pixel region 1A can be narrowed, making it possible to provide a downsized semiconductor device (a semiconductor device having a small area).

The distance $P_1$ of the photodiodes PD adjacent to each other in the X direction corresponds to the distance between n type semiconductor regions NW which are adjacent to each other in the X direction and will be described later, and the distance $P_2$ of the photodiodes PD adjacent to each other in the Y direction corresponds to the distance between n type semiconductor regions NW which are adjacent to each other in the Y direction and will be described later.

The following is one example. The distance $P_1$ between the photodiodes PD adjacent to each other in the X direction can be set at, for example, from about 0.5 to 0.9 μm and the distance $P_2$ between the photodiodes PD adjacent to each other in the Y direction can be set at, for example, from about 0.9 to 1.6 μm.

In the present embodiment, in plan view, the photodiodes PD adjacent to each other in the Y direction have therebetween an element isolation region ST included of an insulator (insulating film). On the other hand, the photodiodes PD adjacent to each other in the X direction have therebetween no element isolation region ST included of an insulator (insulating film).

In plan view, the photodiodes PD adjacent to each other in the Y direction have therebetween the element isolation region ST, because transistors (TX, AMI, SEL, and RST) to be formed between the photodiodes PD adjacent to each other in the Y direction must be formed in an active region defined by the element isolation region ST. Therefore, the photodiodes PD adjacent to each other in the Y direction have therebetween the element isolation region ST and an active region AC defined (surrounded) by the element isolation region ST. The active region AC has therein the transistors (TX, AMI, SEL, and RST). More specifically, in plan view, the element isolation region ST extends in the X direction between the photodiodes PD adjacent to each other in the Y direction and the element isolation region ST has therein the active region (AC) for transistor formation.

In other words, between the photodiodes PD adjacent to each other in the Y direction, the active region AC defined by the element isolation region ST has thereon gate electrodes (GT and GE) including the transistors (TX, AMI, SEL, and RST) and the gate electrodes (GT and GE) in the active region AC have on both sides thereof source and drain regions (semiconductor regions for source and drain). The amplifier transistor AMI, select transistor SEL, and reset transistor RST are each included of the gate electrode GE formed on the active region via a gate insulating film and source and drain regions formed in the active region. The active region AC also has therein the photodiode PD and the floating diffusion FD.

As is apparent from the circuit diagrams shown in FIG. 2 and FIG. 3, one of the source and drain of the amplifier transistor AMI is electrically coupled to one of the source and drain of the select transistor SEL. Both the amplifier transistor AMI and the select transistor SEL can therefore be formed in one active regions (AC) having a periphery surrounded by the element isolation region ST. In this case, one of the source and drain regions of the amplifier transistor AMI and one of the source and drain regions of the select transistor SEL can be included of a common semiconductor region. On the other hand, the active region (AC) having therein the reset transistor RST has therein no another transistor.

In FIGS. 5 and 9, the gate electrode of the transfer transistor TX is marked with GT and indicated as a gate electrode GT and the gate electrode of each of the amplifier transistor AMI, the select transistor SEL, and the reset transistor RST is marked with GE and indicated as a gate electrode GE. In FIGS. 5 and 9, the gate length direction of the gate electrode GE is the X direction and the gate width direction of the gate electrode GE is the Y direction.

The element isolation region ST may be formed between the photodiodes PD adjacent to each other in the X direction, but in the present embodiment, the photodiodes PD adjacent to each other in the X direction have preferably no element isolation region ST.

Formation of no element isolation region ST between the photodiodes PD adjacent to each other in the X direction is achieved by formation of no transistors between the photodiodes PD adjacent to each other in the X direction. This means that in order to form a transistor between the photodiodes PD adjacent to each other in the X direction, the element isolation region ST that defines the active region for the formation of the transistor must be formed between the photodiodes adjacent to each other in the X direction. In the present embodiment, however, no transistor is formed between the photodiodes PD adjacent to each other in the X direction, making it unnecessary to form the element isolation region ST between the photodiodes PD adjacent to each other in the X direction.

In the present, no transistor is formed and no element isolation region ST is arranged between the photodiodes PD adjacent to each other in the X direction. This brings the following advantages.

The distance $P_1$ of the photodiodes PD adjacent to each other in the X direction can be made smaller by not placing a transistor and not forming the element isolation region ST between the photodiodes PD adjacent to each other in the X direction. The number of the pixels PU which can be placed in the pixel region 1A can therefore be increased further. When the number of the pixels PU is the same, the area of the pixel region 1A can be narrowed further so that the semiconductor device thus obtained can have a smaller size (smaller area) further.

The element isolation region ST can be formed preferably by STI (shallow trench isolation) but this method is likely to cause stress or crystal defects in a substrate region adjacent to the element isolation region ST. When the element isolation region ST is present near the photodiode PD and stress or crystal defect occurs due to the element isolation region ST, noise may occur. In the present embodiment, on the other hand, since no element isolation region ST is provided between the photodiodes PD adjacent to each other in the X direction, the amount of the element isolation region ST present at a position adjacent to the photodiode PD in plan view can be reduced compared with the amount when the element isolation region ST is provided between the photodiodes PD adjacent to each other in the X direction. This makes it possible to suppress the influence of the stress or crystal defect caused due to the element isolation region ST and thereby suppress generation of noise. As a result, the semiconductor device thus obtained can have improved performance.

In the present embodiment, as shown in FIGS. 7 and 8, in the pixel region 1A, a $p^+$ type semiconductor region PR surrounds each of the photodiodes PD arranged in array form in plan view. In FIGS. 7 and 8, the region hatched with dots corresponds to a region having therein the $p^+$ type semiconductor region PR. As is apparent from FIGS. 7 and 8, each of the photodiodes PD is surrounded by the $p^+$ type semiconductor region PR in plan view. The $p^+$ type semiconductor region PR is provided so as to electrically isolate the photodiodes PD adjacent to each other in the X direction or Y.

More specifically, the $p^+$ type semiconductor region PR lies in lattice form in plan view and the lattice has therein the photodiode PD. This means that the $p^+$ type semiconductor region PR has, in plan view, a portion extending, in the Y direction, between the photodiodes PD adjacent to each other in the X direction and a portion extending, in the X direction, between the photodiodes PD adjacent to each other in the Y direction. These portions are coupled into one body to include the $p^+$ type semiconductor region PR. Since the photodiodes PD adjacent to each other in the Y direction have therebetween the element isolation region ST as described above, a portion of the $p^+$ type semiconductor region PR overlaps with the element isolation region ST in plan view. Between the photodiodes PD adjacent to each other in the Y direction, the $p^+$ type semiconductor region PR extends in the X direction below the element isolation region ST.

The $p^+$ type semiconductor region PR can function so as to suppress or prevent leakage (leakage current) of signals (charges) between pixels PU adjacent to each other in the X direction or Y. Therefore, it is preferred to form the $p^+$ type semiconductor region PR so that each of the photodiodes PD is surrounded by the $p^+$ type semiconductor region PR in plan view. This makes it possible to more surely suppress or prevent leakage (leakage current) of signals (charges) between the pixels PU (the photodiodes PD) adjacent to each other in the X direction or Y.

The width $W_2$ of the $p^+$ type semiconductor region PR extending in the Y direction is preferably smaller than the width $W_3$ of the $p^+$ type semiconductor region PR extending in the X direction ($W_2<W_3$). In other words, the width $W_3$ of the $p^+$ type semiconductor region PR extending in the X direction is preferably greater than the width $W_2$ of the $p^+$ type semiconductor region PR extending in the Y direction ($W_2<W_3$). The width $W_2$ of the $p^+$ type semiconductor region PR extending in the Y direction corresponds to the X-direction size (width) of the $p^+$ type semiconductor region PR extending in the Y direction and is shown in FIG. 8. The width $W_3$ of the $p^+$ type semiconductor region PR extending in the X direction corresponds to the Y-direction size (width) of the $p^+$ type semiconductor region PR extending in the X direction and is shown in FIG. 8. The reason why the width $W_2$ is made smaller than the width $W_3$ ($W_2<W_3$) is because as described above, the distance $P_1$ between the photodiodes PD adjacent to each other in the X direction is smaller than the distance $P_2$ of the photodiodes PD adjacent to each other in the Y direction ($P_1<P_2$).

As one example, the width $W_3$ of the $p^+$ type semiconductor region PR extending in the Y direction can be set at, for example, from about 0.6 to 1.2 μm and the width $W_2$ of the $p^+$ type semiconductor region PR extending in the X direction can be set at, for example, from about 0.3 to 10.6 μm.

The plane layout of the pixel region 1A described referring to FIGS. 5 to 9 is provided for describing a preferred mode and the circuit constitution of the pixel PU can be changed. The layout of transistors including the pixel PU can also be changed. It is however desired to follow the technical concept described referring to FIGS. 5 to 9 even when the circuit constitution of the pixel PU or layout of transistors including the pixel PU is changed. For example, FIG. 5 shows a preferred example of the layout of pixel transistors (TX, RST, SEL, and AMI) according to the circuit constitution of FIG. 2. When the circuit constitution of FIG. 3 is adopted, the number of pixels arranged between the photodiodes PD adjacent to each other in the Y direction becomes larger than that in FIG. 5 or 9.

<Structure of Semiconductor Device>

Next, the structure (cross-sectional structure) of the semiconductor device of the present embodiment will be described referring to the plan views of FIGS. 5 to 9 and the cross-sectional views of FIGS. 10 to 14.

First, the structure (cross-sectional structure) of the pixel region 1A will be described.

Figure 10:
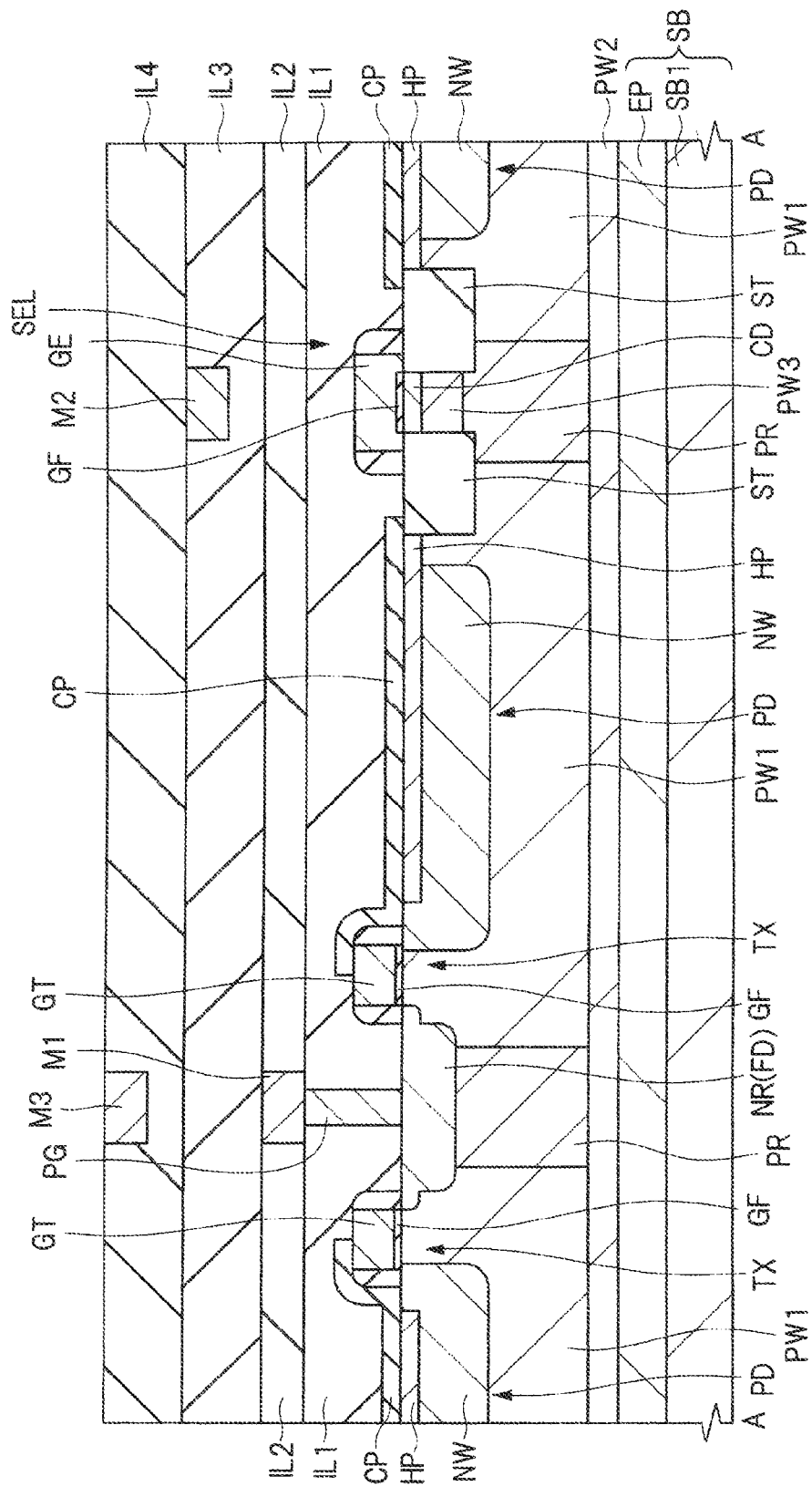
FIG. 10 is a fragmentary cross-sectional view of the semiconductor device of First Embodiment.
Figure 11:
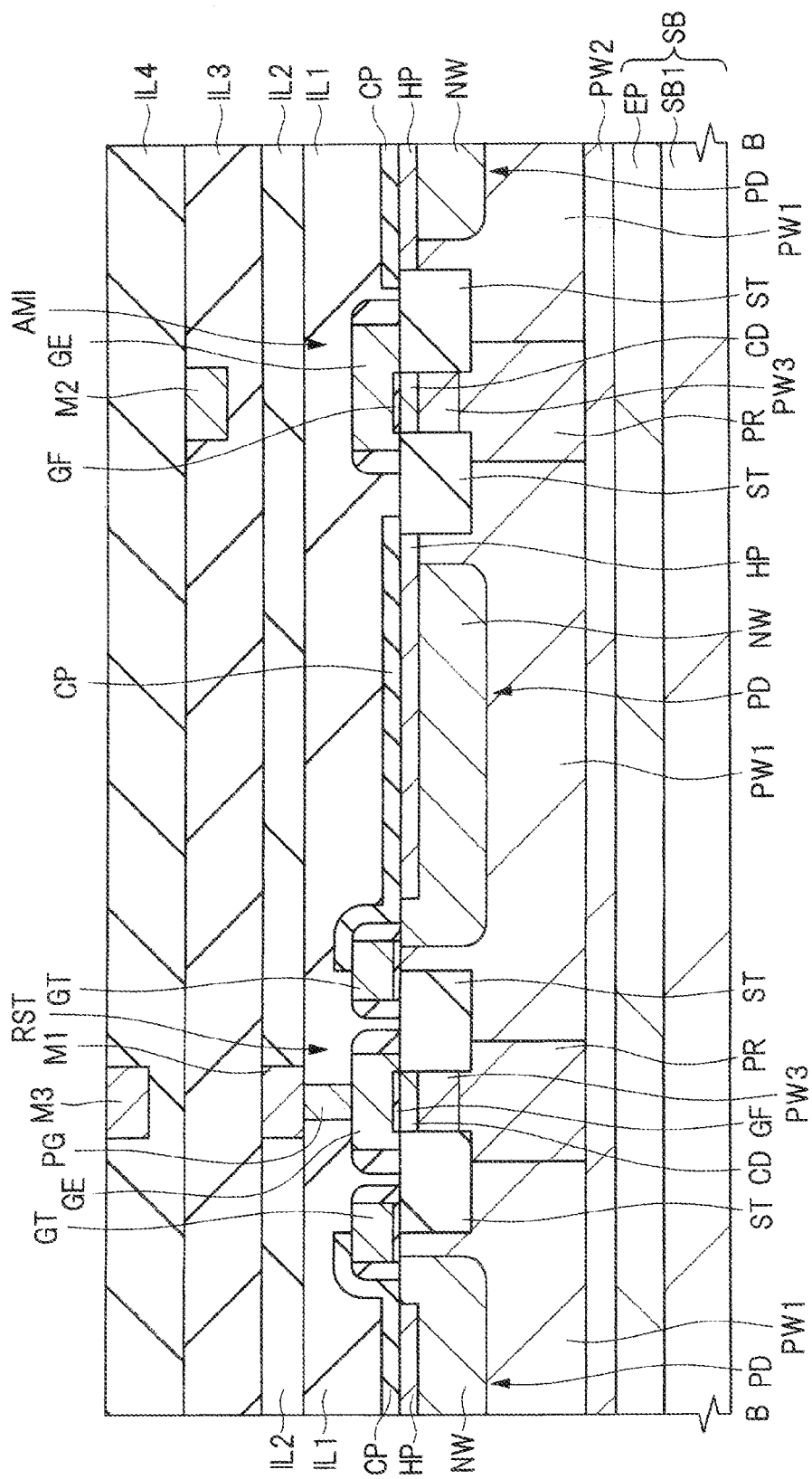
FIG. 11 is a fragmentary cross-sectional view of the semiconductor device of First Embodiment.

The semiconductor substrate SB including the semiconductor device of the present embodiment has, in the pixel region 1A thereof, the photodiode PD and the transfer transistor TX as shown in FIGS. 10 to 12. The photodiode PD is included of a p well PW1, an n type semiconductor region NW, and a $p^+$ type semiconductor region HP each formed in the semiconductor substrate SB.

The semiconductor substrate SB has a substrate body (semiconductor substrate, semiconductor wafer) SB1 made of, for example, p type single crystal silicon obtained by implantation of a p type impurity and a semiconductor layer (epitaxial layer, epitaxial semiconductor layer) EP formed on the main surface of the substrate body SB1 and made of, for example, $n^-$ type single crystal silicon. The semiconductor layer EP is an epitaxial layer (epitaxial semiconductor layer) and is formed on the main surface of the substrate body SB1 by epitaxial growth. The semiconductor substrate SB is therefore a so-called epitaxial wafer. As another mode, the semiconductor substrate SB1 may be an n type one instead of the p type one. As a further mode, the semiconductor substrate SB may be a semiconductor substrate (semiconductor wafer) made of n type single crystal silicon obtained by implantation of an n type impurity instead of the epitaxial wafer.

The p well (p type semiconductor region) PW1 extends to a predetermined depth from the main surface of the semiconductor substrate SB. The p well PW1 extends over a region having therein the photodiode PD and a region having therein the transfer transistor TX. The p well PW1 is a p type semiconductor region obtained by implantation of a p type impurity such as boron (B).

As shown in FIGS. 10 to 12, in the semiconductor substrate SB, the n type semiconductor region NW is embraced in the p well PW1. The n type semiconductor region NW is an n type semiconductor region obtained by implantation of an n type impurity such as phosphorus (P) or arsenic (As). The n type semiconductor region NW has a substantially rectangular planar shape.

The n type semiconductor region NW is a region for the formation of the photodiode PD, but the source region of the transfer transistor TX is also included of the n type semiconductor region NW. This means that the n type semiconductor region NW lies mainly in a region having therein the photodiode PD but a portion of the n type semiconductor region NW planarly (in plan view) overlaps with the gate electrode GT of the transfer transistor TX. The depth of (the bottom surface of) the n type semiconductor region NW is shallower than the depth of (the bottom surface of) the p well PW1 and the n type semiconductor region NW is embraced in the p well PW1. It is to be noted that a region shown as the photodiode PD in the plan view of FIGS. 5 to 9 corresponds to a region having therein the n type semiconductor region NW.

The n type semiconductor region NW has, in a portion of the surface thereof, the $p^+$ type semiconductor region HP. The $p^+$ type semiconductor region HP is a $p^+$ type semiconductor region obtained by implanting (doping) with a p type impurity such as boron (B) at a high concentration and the impurity concentration (p type impurity concentration) of the $p^+$ type semiconductor region HP is higher than the impurity concentration (p type impurity concentration) of the p well PW1. The conductivity (electroconductivity) of the $p^+$ type semiconductor region HP is higher than the conductivity (electroconductivity) of the p well PW1.

The depth of (the bottom surface of) the $p^+$ type semiconductor region HP is shallower than the depth of (the bottom surface) of the n type semiconductor region NW. The $p^+$ type semiconductor region HP is formed mainly in the surface layer portion (surface portion) of the n type semiconductor region NW. When viewed in the thickness direction of the semiconductor substrate SB, the $p^+$ type semiconductor region HP as the uppermost layer has therebelow the n type semiconductor region NW and the n type semiconductor region NW has therebelow the p well PW1.

In a region having therein no n type semiconductor region NW, a portion of the $p^+$ type semiconductor region HP is contiguous to the p well PW1. In other words, the $p^+$ type semiconductor region HP has a portion having rightly therebelow the n type semiconductor region NW and contiguous to this n type semiconductor region NW and a portion having rightly therebelow the p well PW1 and contiguous to this p well PW1.

A PN junction is formed between the p well PW1 and the n type semiconductor region NW. A PN junction is also formed between the $p^+$ type semiconductor region HP and the n type semiconductor region NW. A photodiode (PN junction diode) PD is formed by the p well PW1 (p type semiconductor region), the n type semiconductor region NW, and the $p^+$ type semiconductor region HP.

The photodiode (PN junction diode) is mainly included of the n type semiconductor region NW and the p well PW1 (more specifically, included of a PN junction between the n type semiconductor region NW and the p well PW1).

The $p^+$ type semiconductor region HP is a region formed for the purpose of suppressing generation of electrons due to many interface levels formed in the surface of the semiconductor substrate SB. Described specifically, in the surface region of the semiconductor substrate SB, an increase in dark current may be caused by electrons generated by the influence of the interface levels though it is not exposed to light. By forming the $p^+$ type semiconductor region HP having holes as a major carrier on the surface of the n type semiconductor region NW having electrons as a major carrier, generation of electrons without exposure to light is suppressed and an increase in dark current can be suppressed. Therefore, the $p^+$ type semiconductor region HP has a role of recombining electrons gushing out from the uppermost surface of the photodiode with the holes of the $p^+$ type semiconductor region HP and thereby reducing dark current.

The photodiode PD is a light receiving element. The photodiode PD can also be regarded as a photoelectric conversion element. The photodiode PD has a function of photoelectrically converting incident light into charges and storing these charges. The transfer transistor TX has a role as a switch at the time of transferring, from the photodiode PD, the charges stored in the photodiode PD.

The gate electrode GT is formed so as to overlap with a portion of the n type semiconductor region NW in plan view. This gate electrode GT is a gate electrode of the transfer transistor TX and formed (placed) on the semiconductor substrate SB via a gate insulating film GF. The gate electrode GT may have, on the side wall thereof, a sidewall insulating film called "sidewall spacer".

The semiconductor substrate SB has, on one side of both sides (both sides in the gate length direction) of the gate electrode GT, the n type semiconductor region NW and has, on the other side, an n type semiconductor region NR. The n type semiconductor region NR is an n+ type semiconductor region obtained by implanting (doping) an n type impurity such as phosphorus (P) or arsenic (As) at a high concentration. The n type semiconductor region NR is a semiconductor region as a floating diffusion (floating diffusion layer) FD and is also a drain region of the transfer transistor TX. The n type semiconductor region NR can be formed in the p well PW1 but the p+ type semiconductor region PR (a portion of the p+ type semiconductor region PR extending in the X direction) extends below the n type semiconductor region NR.

The n type semiconductor region NR functions as the drain region of the transfer transistor TX but it can also be regarded as a floating diffusion (floating diffusion layer) FD. The n type semiconductor region NW is a constituent component of the photodiode PD but can also function as a semiconductor region for the source of the transfer transistor TX. In short, the source region of the transfer transistor TX is included of the n type semiconductor region NW. The n type semiconductor region NW and the gate electrode GT have preferably such a positional relationship that a portion (source side) of the gate electrode GT overlaps with a portion of the n type semiconductor region NW in plan view. The n type semiconductor region NW and the n type semiconductor region NR are separated from each other while having therebetween a channel formation region (corresponding to a substrate region rightly below the gate electrode GT) of the transfer transistor TX. The gate electrode GT and the channel formation region of the transfer transistor TX have therebetween the gate insulating film GF.

The photodiode PD has, on the surface thereof, more specifically, on the surface of the n type semiconductor region NW and the p+ type semiconductor region HP, a cap insulating film CP. This cap insulating film CP can function as a protective film and can function so as to satisfactorily keep the surface characteristics, that is, interface characteristics, of the semiconductor substrate SB. The cap insulating film CP may function as an antireflective film. A portion (end portion) of the cap insulating film CP may ride on the gate electrode GT.

The semiconductor substrate SB has therein the p+ type semiconductor region PR. The p+ type semiconductor region PR is a p type semiconductor region obtained by implanting a p type impurity such as boron (B) at a high concentration. As shown in FIGS. 7 and 8, in plan view, the p+ type semiconductor region PR extends in the Y direction between the photodiodes PD adjacent to each other in the X direction and extends in the X direction between the photodiodes PD adjacent to each other in the Y direction. Therefore, in plan view, the p well PW1 is surrounded by the p+ type semiconductor region PR and the p well PW1 surrounded by the p+ type semiconductor region PR has therein the n type semiconductor region NW. The n type semiconductor region NW including the photodiode PD is, in plan view, surrounded by the p+ type semiconductor region PR.

More specifically, the p+ type semiconductor region PR is present in lattice form in plan view and by the p+ type semiconductor region PR in lattice form, the p well PW1 is partitioned. The p well PW1 partitioned by the p+ type semiconductor region PR has therein the n type semiconductor region NW. This means that the p well PW1 surrounded in plan view by the p+ type semiconductor region PR has therein the n type semiconductor region NW.

The p+ type semiconductor region PR extends to a position significantly deeper than the bottom surface (lower surface) of the n type semiconductor region NW and it has a depth of, for example, from about 2 to 4 μm. This means that the bottom surface (lower surface) of the p+ type semiconductor region PR exists at a position deeper than the bottom surface (lower surface) of the n type semiconductor region NW, for example, at a position from about 2 to 4 μm deep from the surface of the semiconductor substrate SB.

In addition, the bottom surface (lower surface) of the p+ type semiconductor region PR is present at a position significantly deeper than the bottom surface (lower surface) of the element isolation region ST. This means that the p+ type semiconductor region PR extends to a position significantly deeper than the element isolation region ST. The bottom surface (lower surface) of the element isolation region ST is present, for example, at a position from about 0.1 to 0.4 μm deep from the surface of the semiconductor substrate SB, while the p+ type semiconductor region PR extends to, for example, a depth of from about 2 to 4 μm from the surface of the semiconductor substrate SB as described above. As is apparent from FIGS. 7, 10, 11, and 13, the p+ type semiconductor region PR extending in the X direction extends below the element isolation region ST. This means that the photodiodes PD adjacent to each other in the Y direction have therebetween the element isolation region ST so that between the photodiodes PD adjacent to each other in the Y direction, the p+ type semiconductor region PR extends in the X direction below the element isolation region ST.

The bottom surface (lower surface) of the n type semiconductor region NW is present, for example, at a position from about 0.25 to 0.5 μm deep from the surface of the semiconductor substrate SB. The bottom surface (lower surface) of the n type semiconductor region NR is present, for example, at a position from about 0.2 to 0.5 μm deep from the surface of the semiconductor substrate SB.

The p+ type semiconductor region PR is not required to start from the surface of the semiconductor substrate SB and the upper surface of the p+ type semiconductor region PR may be separated by a predetermined distance from the surface of the semiconductor substrate SB. In other words, the p+ type semiconductor region PR can be formed in the semiconductor substrate SB except for the surface layer portion thereof. For example, the position of the upper surface of the p+ type semiconductor region PR can be set at a depth position almost equal to the bottom surface (lower surface) of the element isolation region ST. For example, the position of the upper surface of the p+ type semiconductor region PR can be set at a position from about 0.1 to 0.4 μm deep from the surface of the semiconductor substrate SB.

In plan view, the p+ type semiconductor region PR extending in the Y direction crosses the n type semiconductor region NR, but at the intersection between the p+ type semiconductor region PR and the n type semiconductor region NR, the p+ type semiconductor region PR extends in the Y direction below the n type semiconductor region NR. In FIG. 10, the p+ type semiconductor region PR is contiguous to the bottom surface (lower surface) of the n type semiconductor region NR, but the bottom surface (lower surface) of the n type semiconductor region NR may be separated from the p+ type semiconductor region PR. In this case, the bottom surface (lower surface) of the n type semiconductor region NR and the p+ type semiconductor region PR have therebetween a portion of the p well PW1.

The p+ type semiconductor region PR has preferably therebelow a p+ type semiconductor layer (p+ type semiconductor region) PW2 having an impurity concentration higher than that of the p well PW1. The p+ type semiconductor layer PW2 is a p type semiconductor region obtained by implanting a p type impurity such as boron (B) at a high concentration. This p$^+$ type semiconductor layer PW2 extends over the entirety of the pixel region 1A and is positioned in the middle of the thickness of the semiconductor substrate SB. In other words, the p$^+$ type semiconductor layer PW2 is present at a position significantly deeper than the bottom surface (lower surface) of the n type semiconductor region NW and the n type semiconductor region NW and the p$^+$ type semiconductor layer PW2 have therebetween the p well PW1. The bottom surface (lower surface) of the p well PW1 is neighboring to the upper surface of the p$^+$ type semiconductor layer PW2.

The bottom portion of the p$^+$ type semiconductor region PR preferably reaches the p$^+$ type semiconductor layer PW2. The n type semiconductor region NW is formed in the p well PW1. The p well PW1 is surrounded, at the bottom surface (lower surface) thereof, by the p$^+$ type semiconductor layer PW2 and, at the side surface other than the surface layer portion thereof, by the p$^+$ type semiconductor region PR. This means that the n type semiconductor region NW is formed in the p well PW1, the bottom surface (lower surface) of the p well PW1 is adjacent to the p$^+$ type semiconductor layer PW2, and a portion of the side surface of the p well PW1 other than the side surface of the surface layer portion of the p well PW1 is adjacent to the p$^+$ type semiconductor region PR. In other words, the n type semiconductor region NW is formed in the p well PW1 and the p well PW1 is almost surrounded by the p$^+$ type semiconductor region PR and the p$^+$ type semiconductor layer PW2 each having a high impurity concentration.

The impurity concentration (p type impurity concentration) of the p$^+$ type semiconductor region PR is higher than the impurity concentration (p type impurity concentration) of the p well PW1 and the impurity concentration (p type impurity concentration) of the p$^+$ type semiconductor layer PW2 is higher than the impurity concentration (p type impurity concentration) of the p well PW1. In other words, the impurity concentration (p type impurity concentration) of the p well PW1 is lower than the impurity concentration (p type impurity concentration) of the p$^+$ type semiconductor region PR and is lower than the impurity concentration (p type impurity concentration) of the p$^+$ type semiconductor region PW2. Therefore, the conductivity (electroconductivity) of the p$^+$ type semiconductor region PR is higher than the conductivity (electroconductivity) of the p well PW1 and the conductivity (electroconductivity) of the p$^+$ type semiconductor layer PW2 is higher than the conductivity (electroconductivity) of the p well PW1.

For example, the impurity concentration (p type impurity concentration) of the p$^+$ type semiconductor region PR can be set at from about $1 \times 10^{17}$ to $1 \times 10^{18}$/cm$^3$, the impurity concentration (p type impurity concentration) of the p$^+$ type semiconductor layer PW2 can be set at from about $1 \times 10^{17}$ to $1 \times 10^{18}$/cm$^3$, and the impurity concentration (p type impurity concentration) of the p well PW1 can be set at from $1 \times 10^{16}$ to $5 \times 10^{16}$/cm$^3$.

In plan view, a p well PW1 and an n type semiconductor region NW including a certain photodiode PD and a p well PW1 and an n type semiconductor region NW including another photodiode PD adjacent to the certain photodiode PD in the Y direction have therebetween an element isolation region ST extending in the X direction and a p$^+$ type semiconductor region PR extending in the X direction below the element isolation region ST. The element isolation region ST and the p$^+$ type semiconductor region PR can suppress or prevent leakage (leakage current) of signals (charges) between the photodiodes PD adjacent to the Y direction. In plan view, a p well PW1 and an n type semiconductor region NW including a certain photodiode PD and a p well PW1 and an n type semiconductor region NW including another photodiode PD adjacent to the certain photodiode PD in the X direction have therebetween a p$^+$ type semiconductor region PR extending in the Y direction. This p$^+$ type semiconductor region PR can suppress or prevent leakage (leakage current) of signals (charges) between the photodiodes PD adjacent to each other in the X direction. Further, since the p$^+$ type semiconductor layer PW2 is provided, leakage (leakage current) of signals (charges) between the photodiodes PD adjacent to each other in the X direction or Y direction can be suppressed or prevented.

As shown in the plan views of FIGS. 5 and 9 and the cross-sectional views of FIGS. 10 to 13, between the photodiodes PD adjacent to each other in the Y direction in plan view, the reset transistor RST, the amplifier transistor AMI, and the select transistor SEL are present in an active region surrounded by the element isolation region.

As shown in FIG. 11, in the active region for the formation of the reset transistor RST therein, the semiconductor substrate SB (the p well PW3) has thereon a gate electrode GE for reset transistor RST via the gate insulating film GF, and the semiconductor substrate SB (the p well PW3) on both sides of the gate electrode GE has therein source and drain regions SD for reset transistor RST. Further, in the active region for the formation of the amplifier transistor AMI and the select transistor SEL therein, as shown in FIGS. 11 and 13, the semiconductor substrate SB (the p well PW3) has thereon a gate electrode GE for amplifier transistor AMI and a gate electrode GE for select transistor SEL via the gate insulating film GF. In the active region for the formation of the amplifier transistor AMI and the select transistor SEL therein, as shown in FIG. 11 and FIG. 13, semiconductor substrate SB (the p well PW3) on both sides of the gate electrode GE has therein source and drain regions SD for amplifier transistor AMI and source and drain regions SD for select transistor SEL. The select transistor SEL and the amplifier transistor AMI are coupled in series so that they share one of the source and drain regions SD. The gate electrode GE may have, on the side wall thereof, a sidewall insulating film called "side wall spacer". The source and drain regions SD are included of an n type semiconductor region but it may have an LDD (lightly doped drain) structure.

The p well PW3 lies in the semiconductor substrate SB in the active region for the formation of the reset transistor RST, the amplifier transistor AMI, or the select transistor SEL and in plan view, it is surrounded at the periphery thereof by the element isolation region ST. The p well PW3 may have therebelow the p$^+$ type semiconductor region PR.

The reset transistor RST, the amplifier transistor AMI, and the select transistor SEL have, in the channel formation region thereof (corresponding to the substrate region rightly below the gate electrode GE), a channel dope layer CD. This channel dope layer CD is a region (semiconductor region) obtained by implanting (injecting) an impurity by ion implantation IM2 described later.

Next, the structure (cross-sectional structure) of the peripheral circuit region 2A (refer to FIG. 4) of the semiconductor device of the present embodiment will be described referring to FIG. 14.

As shown in FIG. 14, the semiconductor substrate SB in the peripheral circuit region 2A has thereon a peripheral transistor LT.

Described specifically, the semiconductor substrate SB in the peripheral circuit region 2A has therein a p well PW4 and the p well PW4 has thereon a gate electrode GL of the peripheral transistor LT via the gate insulating film GF. The p well PW4 on both sides of the gate electrode GL has therein source and drain regions SDL of the peripheral transistor LT. The gate electrode GL may have, on the side wall thereof, a sidewall insulating film called "sidewall spacer". The source and drain regions SDL are included of an n type semiconductor region, but may have an LDD structure.

The peripheral circuit region 2A actually has therein a plurality of n channel MISFETs and a plurality of p channel MISFETs as a transistor including a logic circuit, but FIG. 14 shows, as the peripheral transistor LT, one of the n channel MISFETs among the transistors including the logic circuit.

The semiconductor substrate SB has therein the above-described p wells PW1, PW3, and PW4, n type semiconductor region NR, n type semiconductor region NW, p+ type semiconductor region HP, p+ type semiconductor region PR, p+ type semiconductor layer PW2, channel dope layer CD, and source and drain regions SD and SDL. When the semiconductor substrate SB is an epitaxial wafer, the semiconductor layer EP has them therein.

Next, referring to FIGS. 10 to 14, interlayer insulating films and wirings formed on the semiconductor substrate SB will be described.

As shown in FIGS. 10 to 14, the semiconductor substrate SB has, on the entire main surface thereof including the pixel region 1A and the peripheral circuit region 2A, an interlayer insulating film IL1 so as to cover the gate electrodes GT, GE, and GL and the cap insulating film CP. The interlayer insulating film IL1 is formed on the entirety of the main surface of the semiconductor substrate SB.

The interlayer insulating film IL1 is made of a silicon oxide film using, for example, TEOS (tetra ethyl ortho silicate) as a raw material. The interlayer insulating film IL1 has therein contact holes (through-holes) and the contact holes are each filled with a conductive plug PG. The plug PG is, for example, on the n type semiconductor region NR, the source and drain regions SD and SDL, the gate electrodes GT, GE, and GL, or the like.

The interlayer insulating film IL1 having the plug PG buried therein has a wiring M1 on the interlayer insulating film. The wiring M1 is a wiring of a first-layer wiring. FIGS. 10 to 13 show the wiring M1 formed by the damascene process so that the wiring M1 has been buried in a wiring trench of an interlayer insulating film IL2 formed on the interlayer insulating film ILL In this case, the wiring M1 is, for example, a copper wiring (buried copper wiring).

After formation of the wiring M1, the interlayer insulating film IL2 has thereon an interlayer insulating film IL3 made of, for example, a silicon oxide film and the interlayer insulating film IL3 has therein a wiring M2. After formation of the wiring M2, the interlayer insulating film IL3 has thereon an interlayer insulating film IL4 made of, for example, a silicon oxide film and the interlayer insulating film IL4 has therein the wiring M3. The wiring M2 is a wiring of a second-layer wiring and the wiring M3 is a wiring of a third-layer wiring. The wirings M1, M2, and M3 can be formed not only by the damascene wiring (buried wiring) but also by patterning a conductive film formed on the interlayer insulating film. For example, an aluminum wiring may be used. In the above drawings and description, the semiconductor substrate SB has thereon three wiring layers, but the number of the wiring layers is not limited to three.

The wirings M1, M2, and M3 each do not overlap with the photodiode PD in plan view in order to prevent light incident on the photodiode PD from being blocked by the wirings M1, M2, and M3.

Further, in the pixel region 1A, a microlens (not shown) may be mounted on the interlayer insulating film IL4 having the wiring M3 therein. The microlens and the interlayer insulating film IL4 may have therebetween a color filter (not shown).

When the pixel PU (refer to FIG. 1) is exposed to light, the incident light passes through the microlens (not shown) and after passage through the interlayer insulating films IL1 to IL4 which are transparent to visible light, it is incident on the cap insulating film CP. At the cap insulating film CP, reflection of the incident light is suppressed and a sufficient amount of light is incident on the photodiode PD. At the photodiode PD, energy of the incident light is greater than the band bap of silicon so that the incident light is absorbed and hole-electron pair is generated by the photoelectric conversion. Electrons generated at this time are stored in the n type semiconductor region NW. The transfer transistor TX is turned ON in appropriate timing. More specifically, a voltage equal to or greater than the threshold voltage is applied to the gate electrode GT of the transistor transfer TX. Then a channel region (inversion region) is formed in the channel formation region rightly below the gate insulating film GF below the gate electrode GT of the transfer transistor TX, leading to electric conduction between the n type semiconductor region NW as a source region of the transfer transistor TX and the n type semiconductor region NR as a drain region of the transfer transistor TX. As a result, the electrons stored in the n type semiconductor region NW pass through the channel region, reach the drain region (n type semiconductor region NR), travel through the plug PG or wiring from the drain region (the n type semiconductor region NR), and are input into the gate electrode GE of the amplifier transistor AMI.

<Method of Manufacturing Semiconductor Device>

Next, the method of manufacturing a semiconductor device of the present embodiment will be described referring to FIGS. 15 to 52.

FIGS. 15 to 52 are fragmentary plan views or fragmentary cross-sectional views of the semiconductor device of the present embodiment during manufacturing steps. Among FIGS. 15 to 52, FIGS. 15, 24, 29, 30, 34, 35, 39, and 44 are plan views and they are plan views of a region corresponding to FIG. 5. Among FIGS. 15 to 52, FIGS. 16, 20, 25, 31, 36, 40, 45, and 49 are cross-sectional views corresponding to FIG. 10, that is, cross-sectional views taken along the line A-A of FIG. 5. Among FIGS. 15 to 52, FIGS. 17, 21, 26, 32, 37, 41, 46, and 50 are cross-sectional views corresponding to FIG. 12, that is, cross-sectional views taken along the line C-C of FIG. 5. Among FIGS. 15 to 52, FIGS. 18, 22, 27, 33, 38, 42, 47, and 51 are cross-sectional views corresponding to FIG. 13, that is, cross-sectional views taken along the line D-D of FIG. 5. Among FIGS. 15 to 52, FIGS. 19, 23, 28, 43, 48, and 52 are cross-sectional views corresponding to FIG. 14, that is, cross-sectional views of the peripheral circuit region 2A.

For the manufacture for the semiconductor device of the present embodiment, first, a semiconductor substrate (semiconductor wafer) SB is provided (prepared) as shown in FIGS. 15 to 19.

The semiconductor substrate SB has a substrate body (semiconductor substrate, semiconductor wafer) SB1 made of, for example, p type single crystal silicon implanted with a p type impurity and a semiconductor layer EP formed on the main surface of the substrate body SB1 and made of, for example, n⁻ type single crystal silicon. The semiconductor layer EP is an epitaxial layer and is formed on the main surface of the substrate body SB1 by epitaxial growth. The semiconductor substrate SB is therefore a so-called epitaxial wafer. As another mode, not a p type but an n type may be used as the substrate body SB1. As a further mode, the semiconductor substrate SB may be, instead of the epitaxial wafer, a semiconductor substrate (semiconductor wafer) made of n type single crystal silicon obtained by implantation of an n type impurity may be used.

Next, an element isolation region ST made of an insulator (insulator buried in a trench) is formed using, for example, STI (shallow trench isolation) in the main surface of the semiconductor substrate SB.

Described specifically, after forming an element isolation trench (trench) in the main surface of the semiconductor substrate SB by etching or the like, an insulating film made of silicon oxide (for example, an ozone TEOS oxide film) or the like is formed on the semiconductor substrate SB so as to fill the element isolation trench. Then, the resulting insulating film is polished using CMP (chemical mechanical polishing) or the like to remove an unnecessary portion of the insulating film outside the element isolation trench and leave the other portion of the insulating film in the element isolation trench to form an element isolation region ST included of the insulating film (insulator) buried in the element isolation trench. The active region of the semiconductor substrate SB is defined (partitioned) by the element isolation region ST. FIGS. 15 to 19 show the stage after formation of the element isolation region ST.

Figure 15:
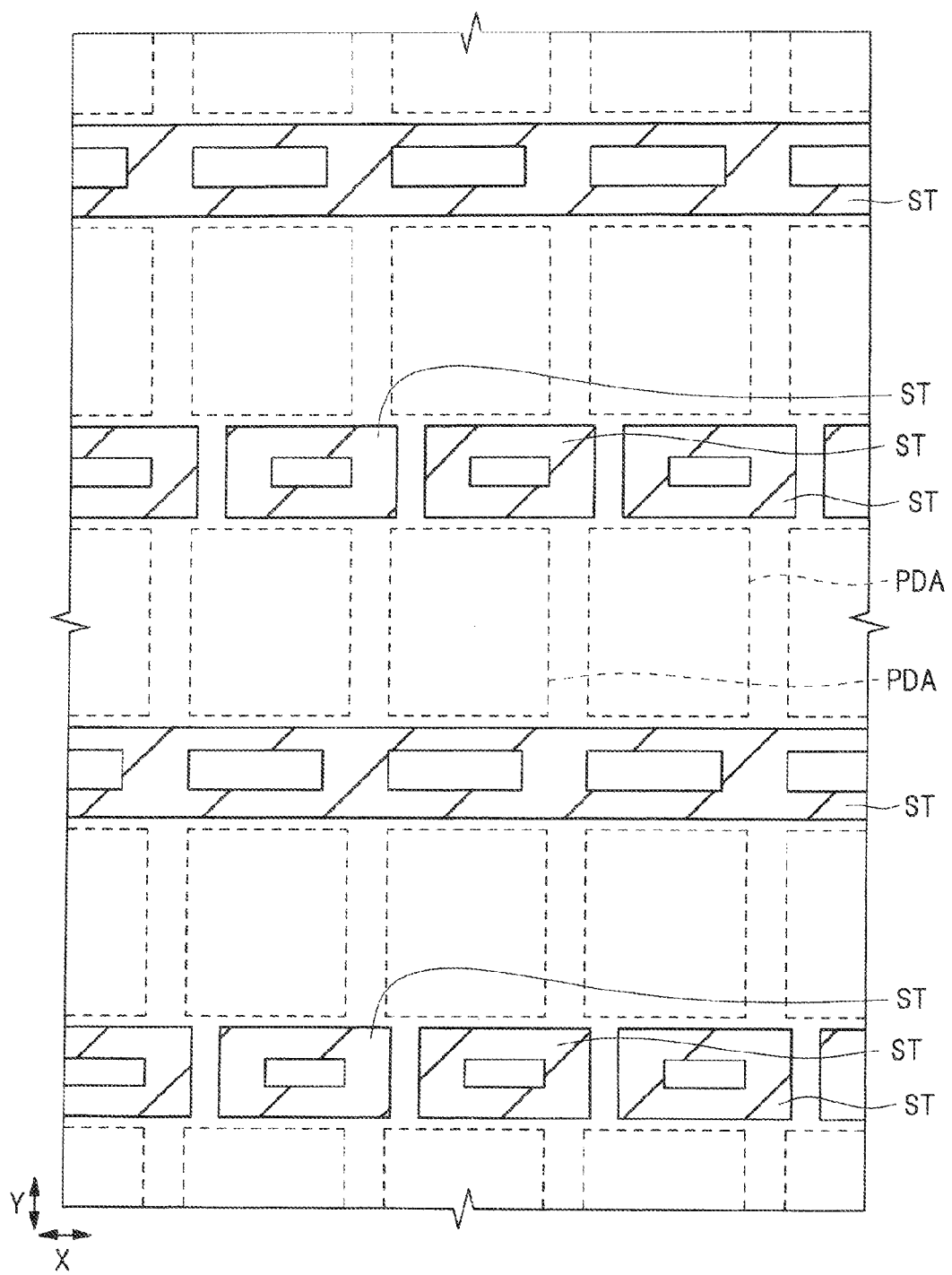
FIG. 15 is a fragmentary plan view of the semiconductor device of First Embodiment during a manufacturing step.
Figure 16:
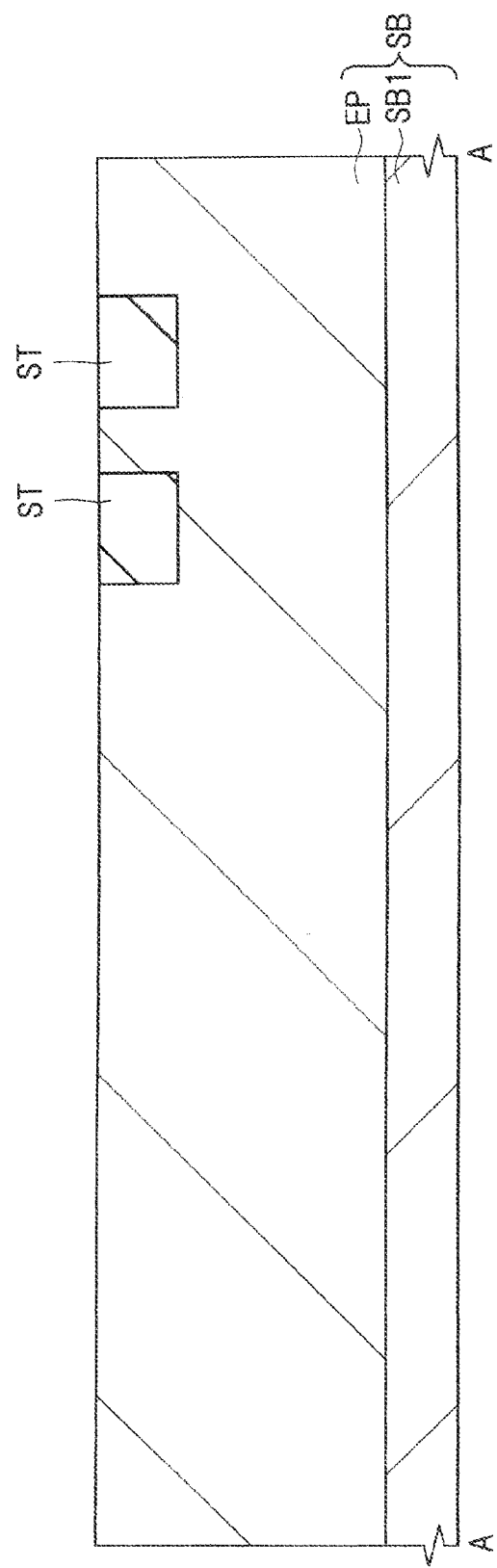
FIG. 16 is a fragmentary cross-sectional view of the semiconductor device during the manufacturing step same as that of FIG. 15.
Figure 17:
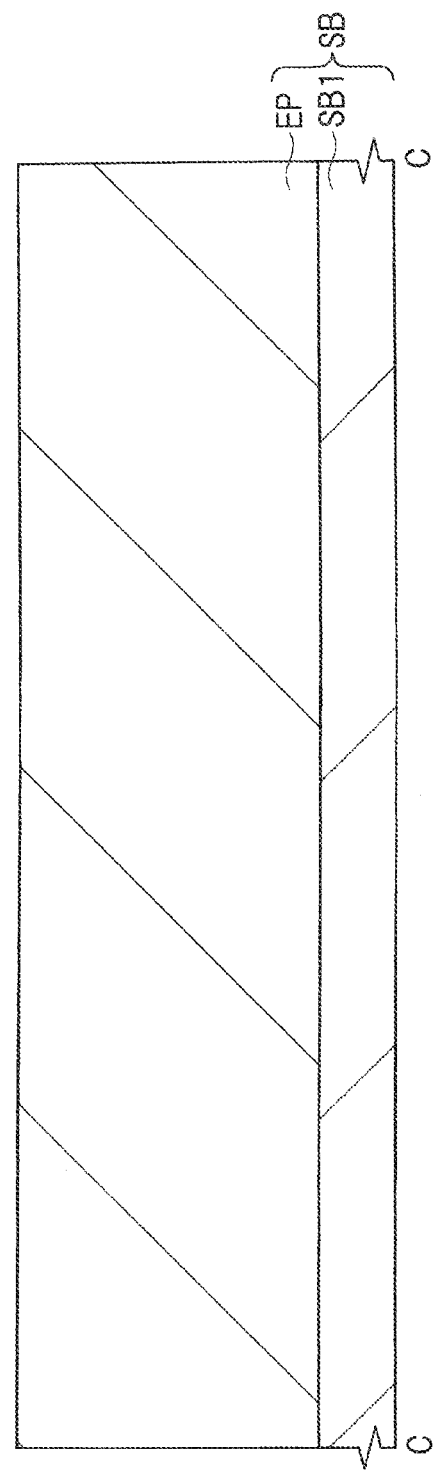
FIG. 17 is a fragmentary cross-sectional view of the semiconductor device during the manufacturing step same as that of FIG. 15.
Figure 18:
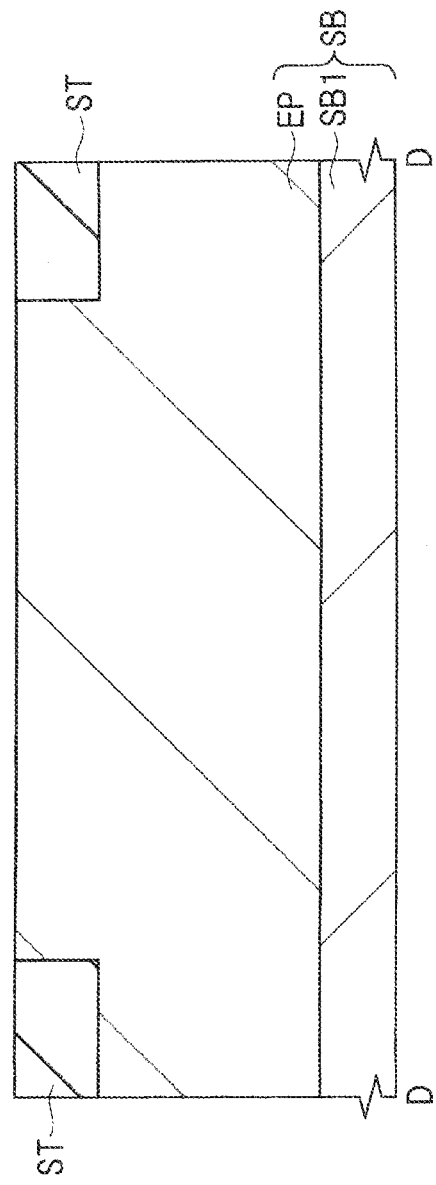
FIG. 18 is a fragmentary cross-sectional view of the semiconductor device during the manufacturing step same as that of FIG. 15.
Figure 19:
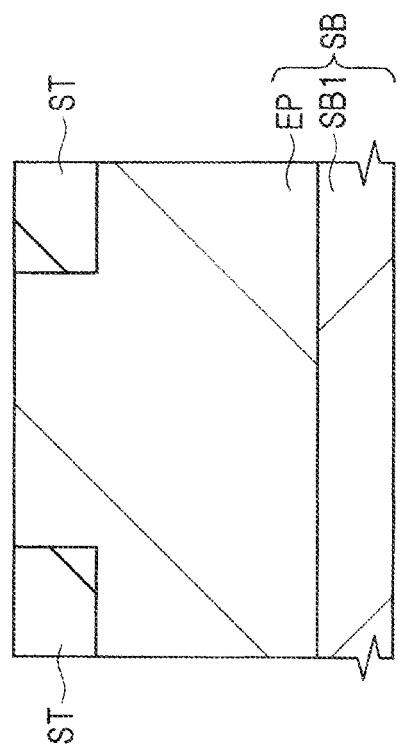
FIG. 19 is a fragmentary cross-sectional view of the semiconductor device during the manufacturing step same as that of FIG. 15.
Figure 20:
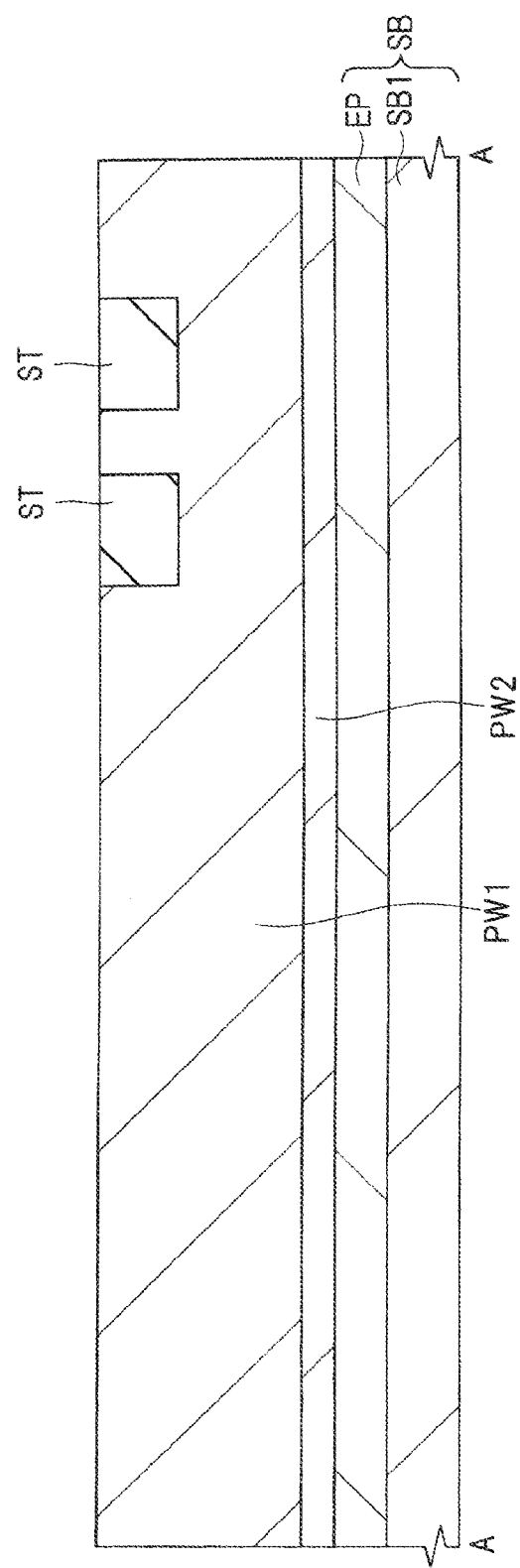
FIG. 20 is a fragmentary cross-sectional view of the semiconductor device during a manufacturing step following that of FIGS. 15 to 19.
Figure 21:
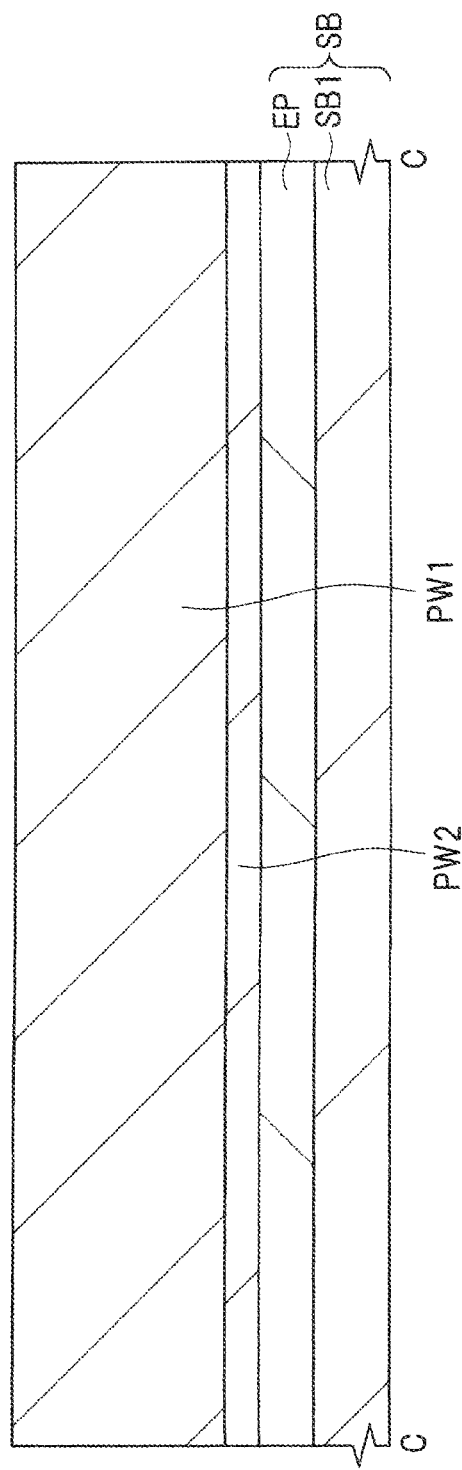
FIG. 21 is a fragmentary cross-sectional view of the semiconductor device during the manufacturing step same as that of FIG. 20.
Figure 22:
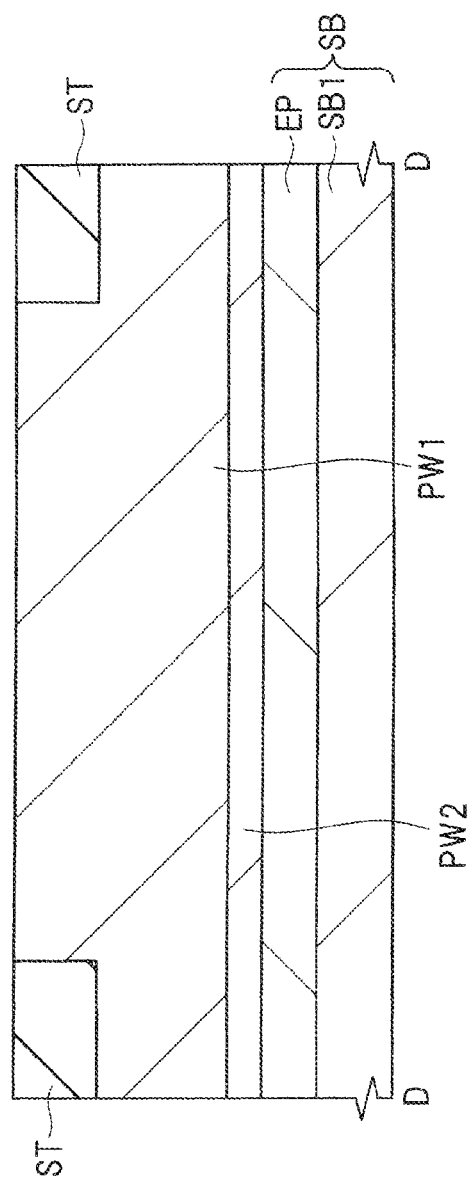
FIG. 22 is a fragmentary cross-sectional view of the semiconductor device during the manufacturing step same as that of FIG. 20.

FIG. 15 is a plan view but to make it easier to understand, the element isolation region ST is hatched with oblique lines. Further, to facilitate understanding of the formation position of the element isolation region ST, a photodiode formation region PDA is shown by a dotted line. The term "photodiode formation region PDA" as used herein means a region where the photodiode PD is to be formed later (more specifically, a region where an n type semiconductor region NW is to be formed later).

The element isolation region ST may be formed by LOCOS (local oxidation of silicon) instead of STI. Formation of the element isolation region ST by STI is however advantageous because the distance $P_2$ (refer to FIG. 5) of the photodiodes PD adjacent to each other in the Y direction can be made smaller compared with the case where LOCOS is used. This can increase the number of pixels (PU) which can be arranged in the pixel region 1A. When the number of the pixels (PU) is the same, the area of the pixel region 1A can be reduced and therefore, the semiconductor device thus obtained can have a smaller size (smaller area). Therefore, the element isolation region ST is formed preferably by STI.

After formation of the element isolation region ST, in plan view, the photodiode formation regions PDA adjacent to each other in the Y direction have therebetween the element isolation region ST and an active region (active region for transistor formation) surrounded by the element isolation region ST. On the other hand, in plan view, no element isolation region ST is formed between the photodiode formation regions PDA adjacent to each other in the X direction.

Next, as shown in FIGS. 20 to 23, a p well (p type semiconductor region) PW1 and a p⁺ type semiconductor layer (the p⁺ type semiconductor region) PW2 are formed in the semiconductor substrate SB (the semiconductor layer EP) in the pixel region 1A, while a p well (the p type semiconductor region) PW4 is formed in the semiconductor substrate SB (the semiconductor layer EP) in the peripheral circuit region 2A.

The p well PW1 is a p type semiconductor region for the formation of the photodiode PD and also a p well region for the formation of an n channel type transfer transistor TX. The p well PW4 is a p well region for the formation of an n channel type peripheral transistor LT.

The p well PW1, the p⁺ type semiconductor layer PW2, and the p well PW4 can each be formed by ion implantation of a p type impurity such as boron (B) into the semiconductor substrate SB.

The p well PW1 and the p well PW4 are each formed so as to extend from the main surface of the semiconductor substrate SB to a predetermined depth, while the p⁺ type semiconductor layer PW2 is formed at a position deeper than the main surface of the semiconductor substrate SB, that is, in the middle of the thickness of the semiconductor substrate SB. Therefore, the p⁺ type semiconductor layer PW2 can also be regarded as a p⁺ type buried layer. After formation of the p well PW1 and the p⁺ type semiconductor layer PW2, in the pixel region 1A, the p well PW1 has therebelow the p⁺ type semiconductor layer PW2, in other words, the p⁺ type semiconductor layer PW2 has thereon the p well PW1.

The p well PW1 extends the entirety of the pixel region 1A at this stage. Since a p⁺ type semiconductor region PR has not yet been formed, the p well PW1 has not yet partitioned by the p⁺ type semiconductor region PR.

The impurity concentration of the p well PW1 is not always uniform in the depth direction. For example, it may have a concentration distribution in which an impurity concentration (p type impurity concentration) decreases as the depth decreases in the depth direction.

Figure 23:
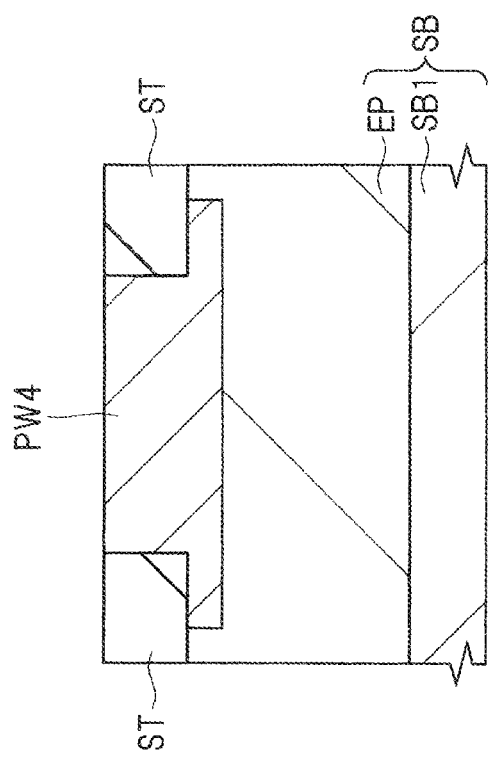
FIG. 23 is a fragmentary cross-sectional view of the semiconductor device during the manufacturing step same as that of FIG. 20.

FIG. 23 shows the peripheral circuit region 2A having no p⁺ type semiconductor layer PW2 therein. In another mode, the p⁺ type semiconductor layer PW2 may be formed in not only the pixel region 1A but also the peripheral circuit region 2A. The p well PW4 of the peripheral circuit region 2A may be formed by the same ion implantation as that used in the formation of the p well PW1 and in this case, the p well PW4 has a depth almost equal to that of the p well PW1.

Next, performed are channel doping ion implantation for the transistors (corresponding to the above-mentioned transfer transistor TX, amplifier transistor AMI, select transistor SEL, and reset transistor RST) to be formed in the pixel region 1A and channel doping ion implantation for the peripheral transistor LT to be formed in the peripheral circuit region 2A. In the channel doping ion implantation for the transistors (TX, AMI, SEL, and RST) to be formed in the pixel region 1A, ion implantation of an n type or p type impurity into a surface layer portion of the semiconductor substrate SB in the pixel region 1A (more specifically, the surface layer portion of the active region for transistors to be formed in the pixel region 1A) is performed. In the channel doping ion implantation for the peripheral transistor LT to be formed in the peripheral circuit region 2A, ion implantation of an n type or p type impurity into the surface layer portion of the semiconductor substrate SB in the peripheral circuit region 2A (more specifically, the surface layer portion of the active region for the peripheral transistor LT to be formed in the peripheral circuit region 2A) is performed. Since the transistors (TX, AMI, SEL, and RST) to be formed in the pixel region 1A are n channel type ones so that the n channel type peripheral transistor LT to be formed in the peripheral circuit region 2A is formed preferably by the channel doping ion implantation common to them. This means that channel doping ion implantation for the transistors (TX, AMI, SEL, and RST) to be formed in the pixel region 1A and the channel doping ion implantation for the peripheral transistor LT to be formed in the peripheral circuit region 2A are preferably performed by the same (common) ion implantation. In other words, it is preferred to implant, by the same (common) ion implantation, an n type or p type impurity into the surface layer portion of the semiconductor substrate SB in the active region for the transistors (TX, AMI, SEL, and RST) to be formed in the pixel region 1A and the surface layer portion of the semiconductor substrate SB in the active region for the peripheral transistor LT to be formed in the peripheral circuit region 2A. This makes it possible to reduce the number of manufacturing steps of a semiconductor device.

Next, as shown in FIGS. 24 to 28, a mask layer MK is formed on the main surface of the semiconductor substrate SB. The mask layer MK is included of a resist pattern like a photoresist pattern. For example, the mask layer MK included of a photoresist pattern can be formed by forming a photoresist film on the main surface of the semiconductor substrate SB and then carrying out exposure and development of the photoresist film.

Figure 24:
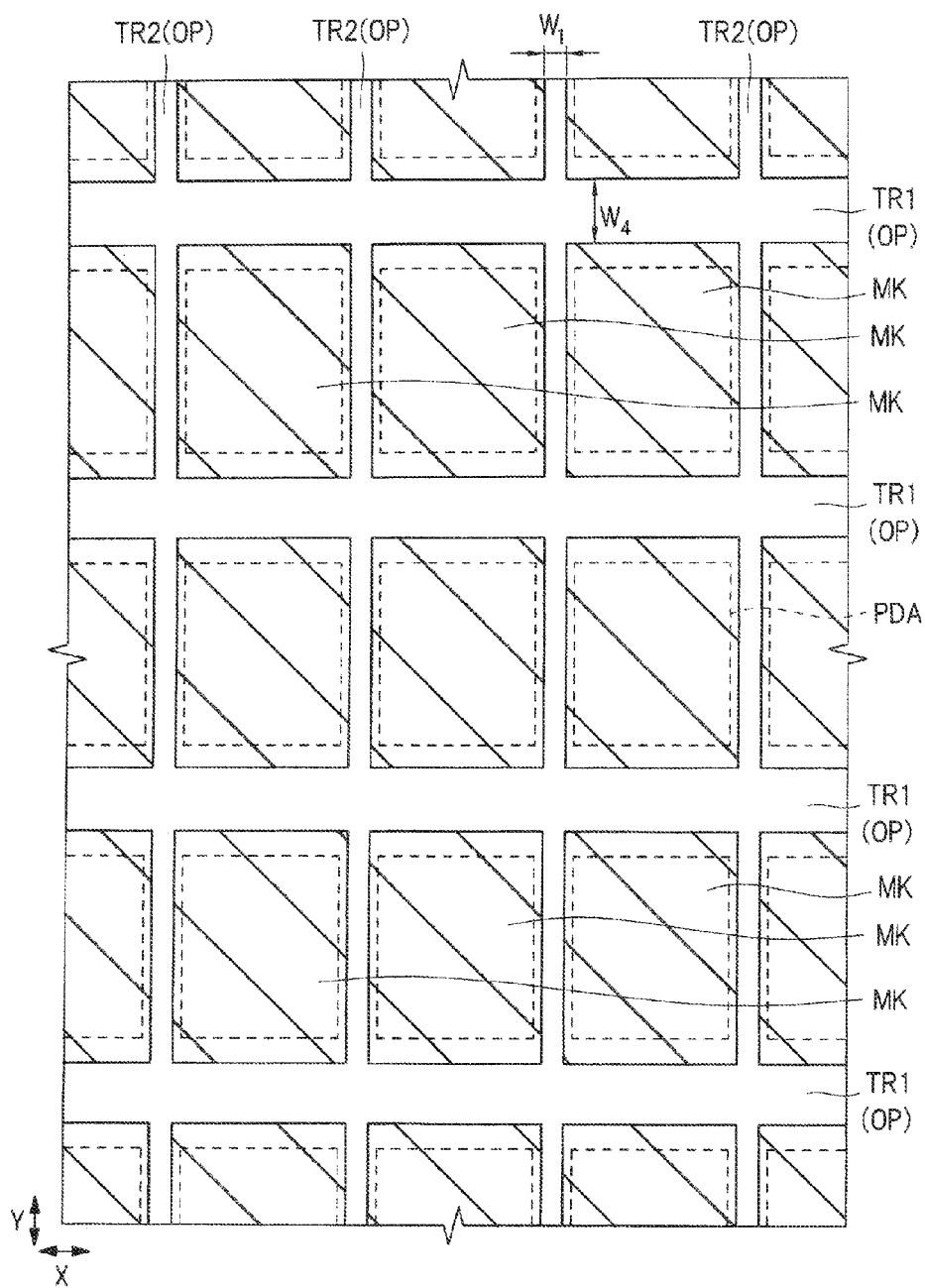
FIG. 24 is a fragmentary plan view of the semiconductor device during a manufacturing step following that of FIGS. 20 to 23.

FIGS. 24 to 28 show the stage after formation of the mask layer MK. FIG. 24 is a plan view but the mask layer MK is hatched with oblique lines to make the drawing easier to understand. In addition, the photodiode formation region PDA is shown by a dotted line to facilitate understanding of the position of the mask layer MK.

The mask layer MK has an opening portion OP at which a formation region of the $p^+$ type semiconductor region PR is opened. This means that the plane layout of the opening portion OP of the mask layer MK substantially agrees with that of the $p^+$ type semiconductor region PR shown in FIGS. 7 and 8.

Figure 28:
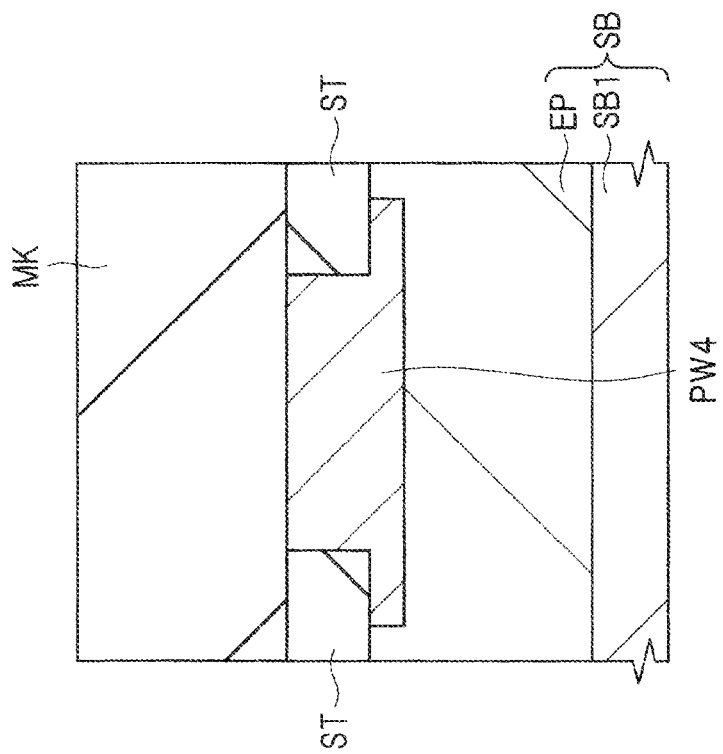
FIG. 28 is a fragmentary cross-sectional view of the semiconductor device during the manufacturing step same as that of FIG. 24.

More specifically, the opening portion OP has a plurality of trenches TR1 extending in the X direction and a plurality of trenches TR2 extending in the Y direction. The plurality of trenches TR1 extending in the X direction intersects with the plurality of trenches TR2 extending in the Y direction. These trenches TR1 and TR2 are coupled to each other to form the opening portion OP. This means that the opening portion OP is present in lattice form in plan view. The trenches TR1 each extend in the X direction between the photodiode formation regions PDA adjacent to each other in the Y direction and the trenches TR2 each extend in the Y direction between the photodiode formation regions PDA adjacent to each other in the X direction. As shown in FIG. 28, the entirety of the peripheral circuit region 2A is covered with the mask layer MK.

The mask layer has preferably a sufficient thickness for functioning as an ion implantation preventive mask in ion implantations IM1 and IM2 which will be described later. The implantation depth in the ion implantation IM2 described later is greater than that in the ion implantation IM1 described later. The thickness of the mask layer may therefore be set to prevent an impurity ion from being implanted by the ion implantation IM1 into a region of the semiconductor substrate SB covered with the mask layer MK. This means that the thickness of the mask layer MK is made greater than the implantation depth of an impurity ion by the ion implantation IM1 into the semiconductor substrate SB exposed from the opening portion OP. In other words, the thickness of the mask layer MK is made greater than the depth (distance) from the surface of the semiconductor substrate SB to the bottom surface (lower surface) of the $p^+$ type semiconductor region PR to be formed by the ion implantation IM1 described later. The thickness of the mask layer MK, meaning a height $H_1$ of a side wall of the trench TR2 described later, can be set at, for example, from about 4 to 8 μm.

Figure 25:
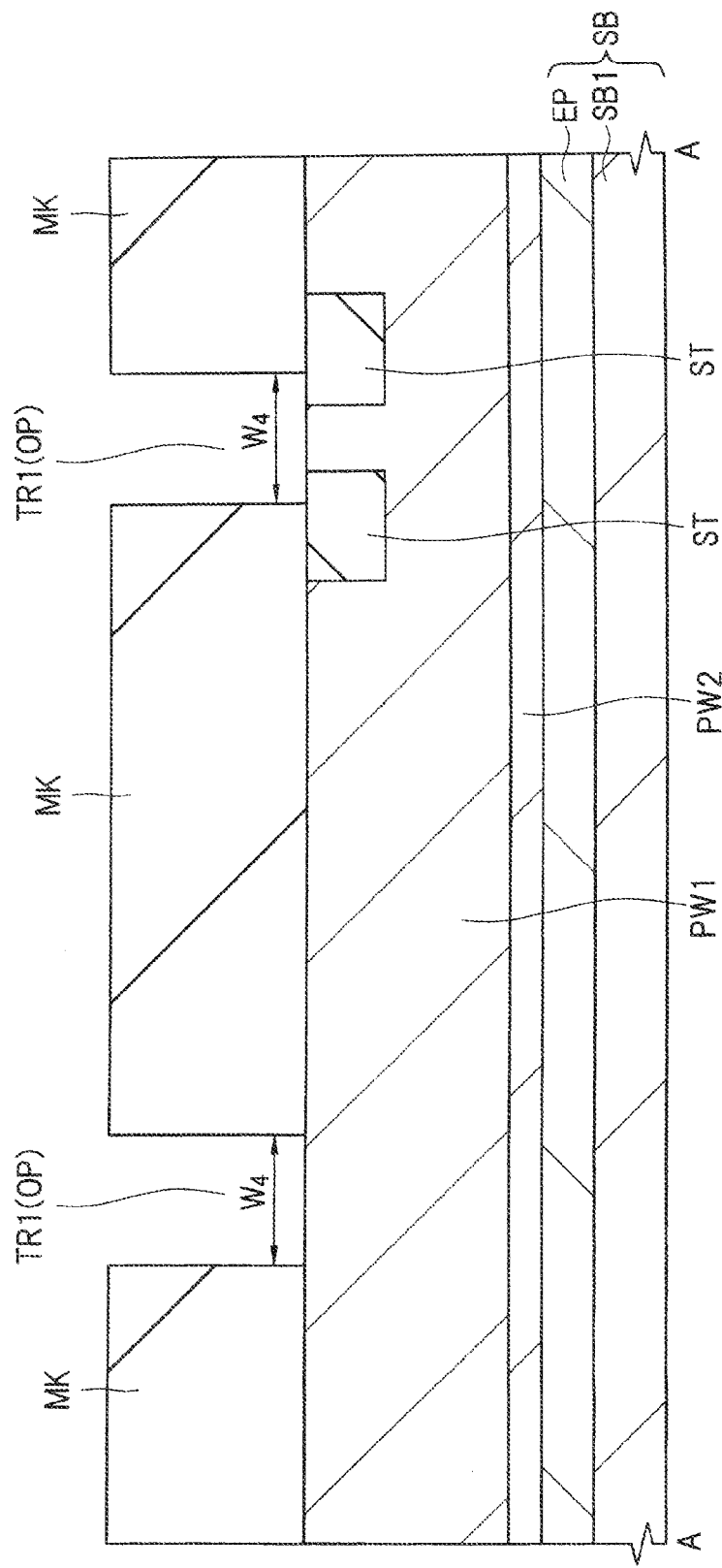
FIG. 25 is a fragmentary cross-sectional view of the semiconductor device during the manufacturing step same as that of FIG. 24.
Figure 26:
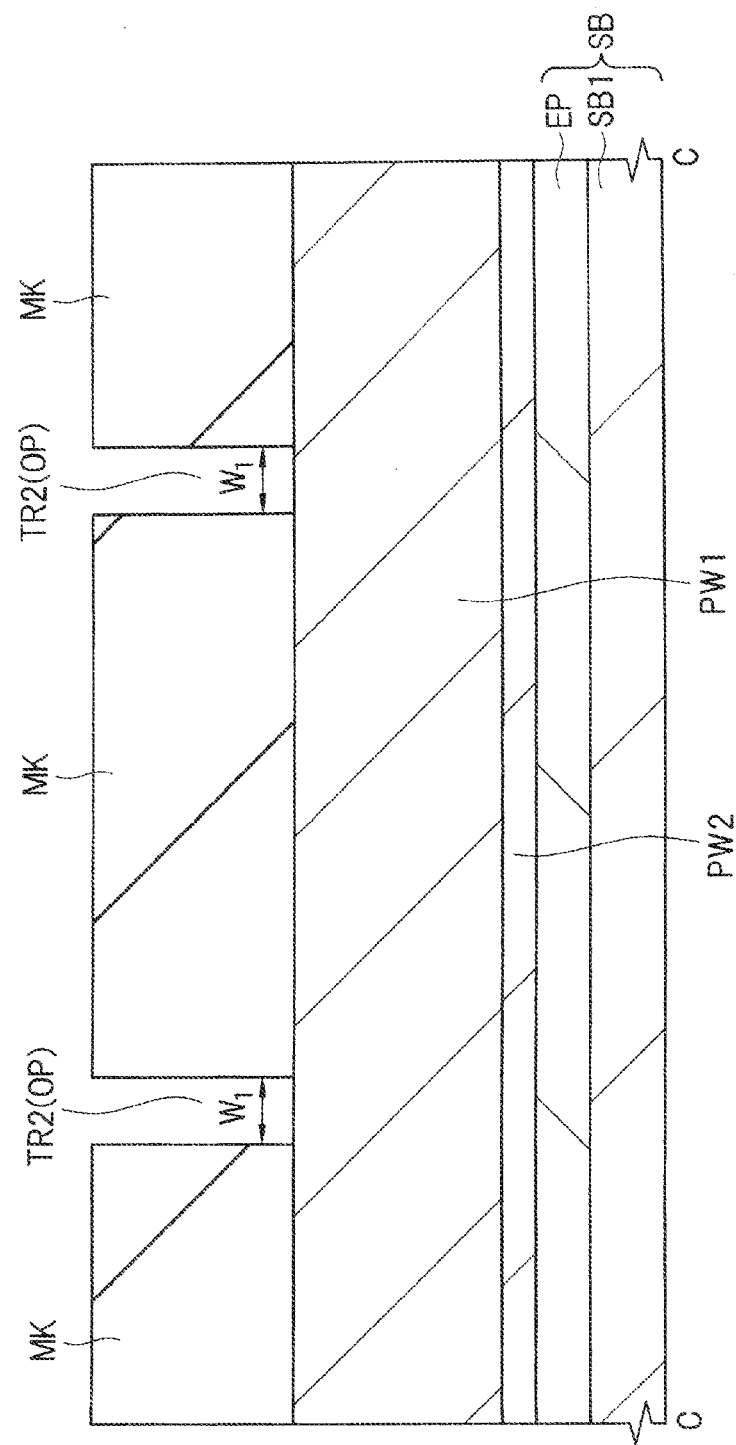
FIG. 26 is a fragmentary cross-sectional view of the semiconductor device during the manufacturing step same as that of FIG. 24.
Figure 27:
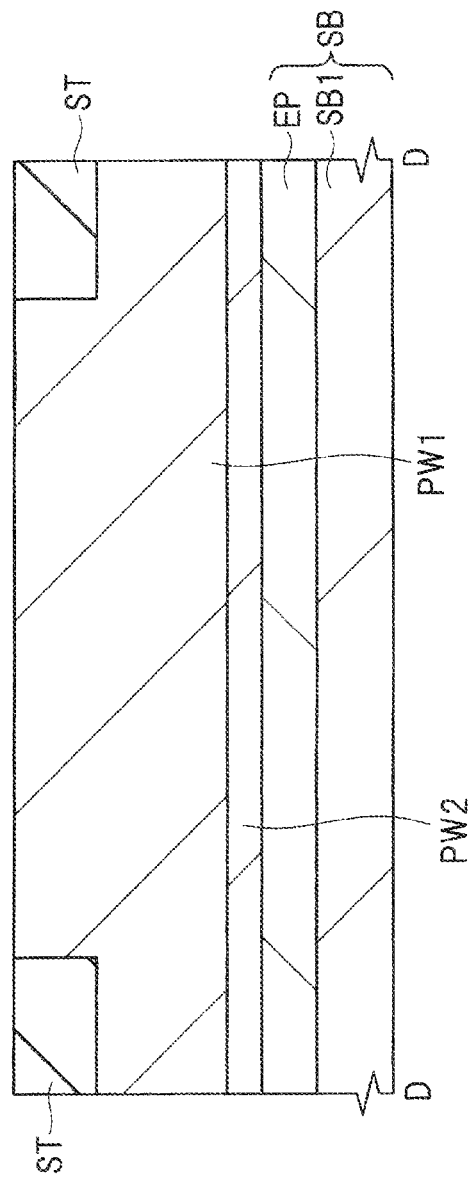
FIG. 27 is a fragmentary cross-sectional view of the semiconductor device during the manufacturing step same as that of FIG. 24.

In plan view, the opening portion OP of the mask layer MK agrees with the formation region of the $p^+$ type semiconductor region PR and therefore after the ion implantation IM1, it almost agrees with a region where the $p^+$ type semiconductor region PR has been formed. In plan view, therefore, the trench TR1 extending in the X direction almost agrees with a region where the $p^+$ type semiconductor region PR extending in the X direction is to be formed and the trench TR2 extending in the Y direction almost agrees with a region where the $p^+$ type semiconductor region PR extending in the Y direction is to be formed. The width $W_1$ of the trench TR2 extending in the Y direction almost agrees with the width $W_2$, shown in FIG. 8, of the $p^+$ type semiconductor region PR extending in the Y direction ($W_1=W_2$) and the width $W_4$ of the trench TR1 extending in the X direction almost agrees with the width $W_3$, shown in FIG. 8, of the $p^+$ type semiconductor region PR extending in the X direction ($W_3=W_4$). The width $W_1$ of the trench TR2 corresponds to the X-direction width (size) of the trench TR2 extending in the Y direction and it is shown in FIGS. 24 and 26. The width $W_4$ of the trench TR1 corresponds to the Y-direction width (size) of the trench TR1 extending in the X direction and it is shown in FIGS. 24 and 25. As described above, the width $W_2$ of the $p^+$ type semiconductor region PR extending in the Y direction is preferably smaller than the width $W_3$ of the $p^+$ type semiconductor region PR extending in the X direction ($W_2<W_3$) so that the width $W_1$ of the trench TR2 extending in the Y direction is preferably smaller than the width $W_4$ of the trench TR1 extending in the X direction ($W_1<W_4$).

Figure 29:
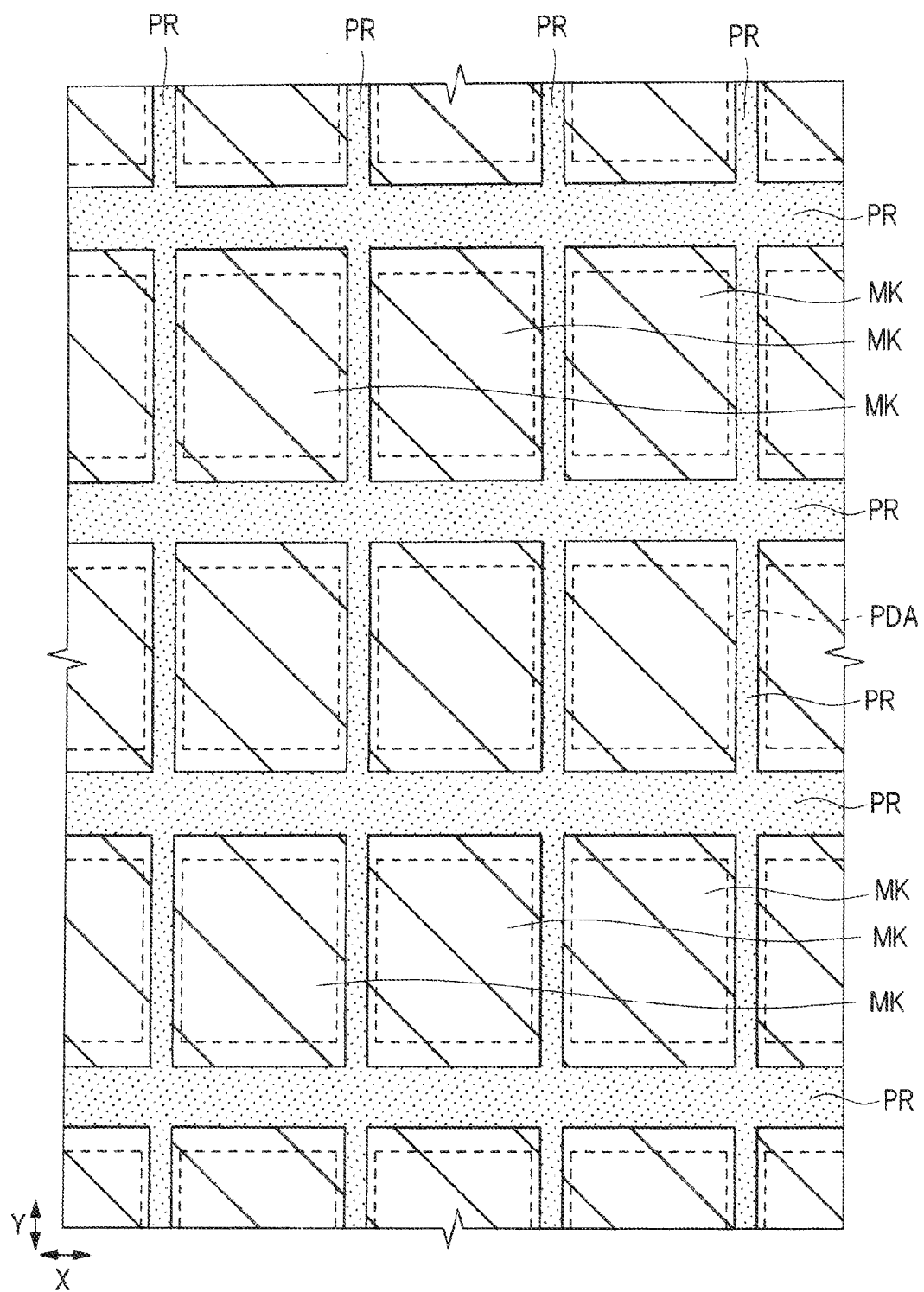
FIG. 29 is a fragmentary plan view of the semiconductor device during a manufacturing step following that of FIGS. 24 to 28.
Figure 30:
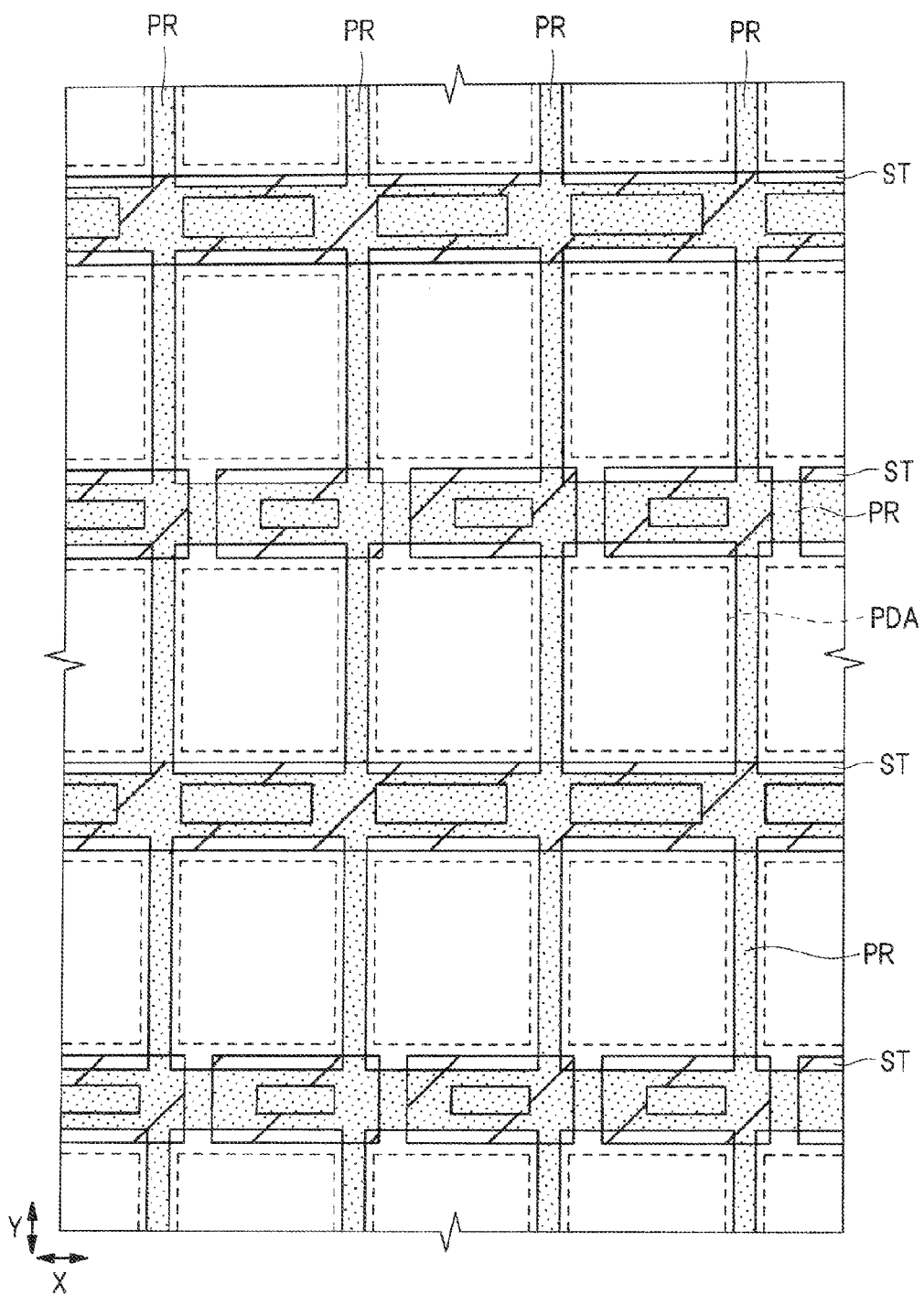
FIG. 30 is a fragmentary plan view of the semiconductor device during the manufacturing step same as that of FIG. 29.
Figure 31:
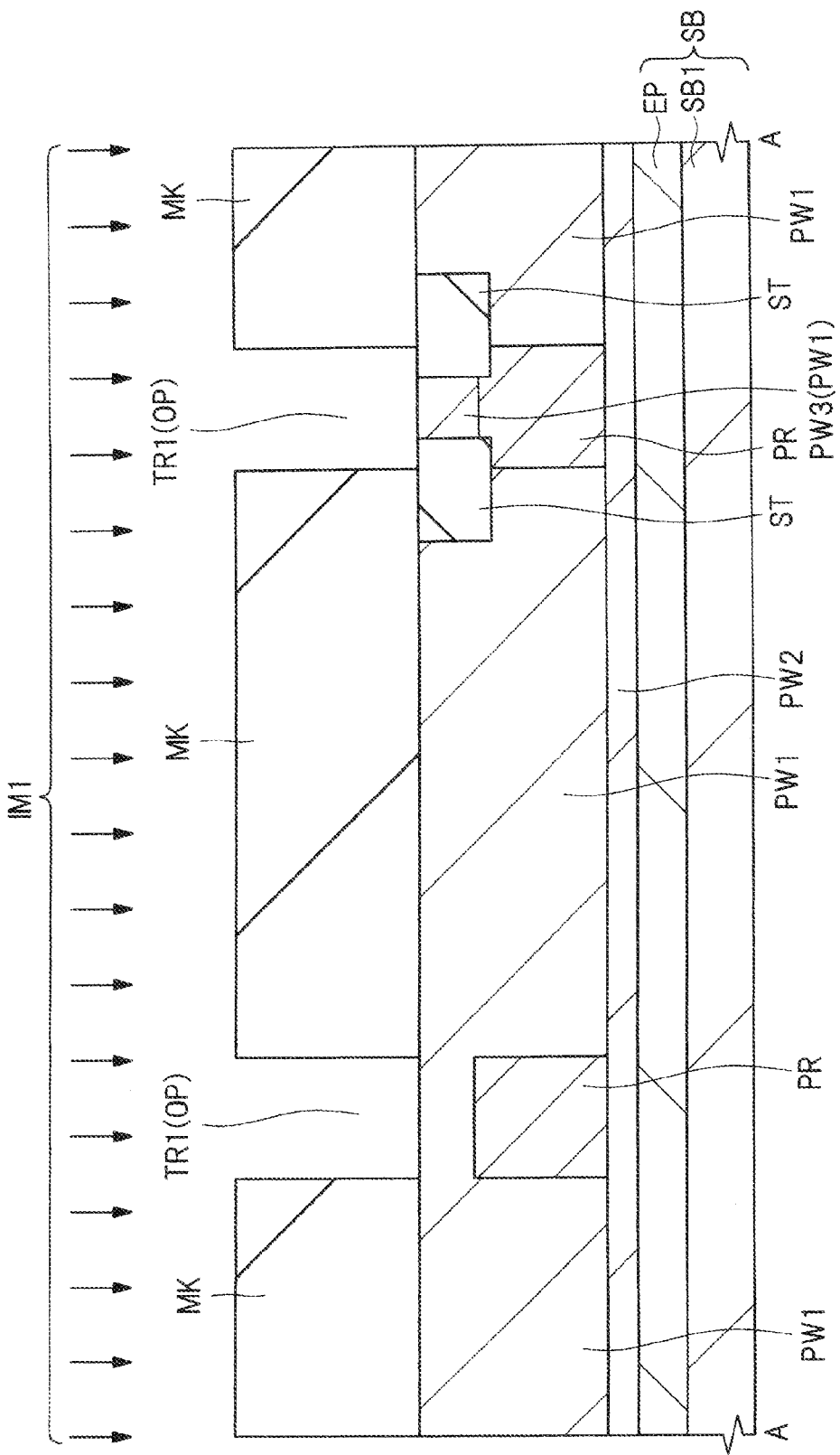
FIG. 31 is a fragmentary cross-sectional view of the semiconductor device during the manufacturing step same as that of FIG. 29.
Figure 32:
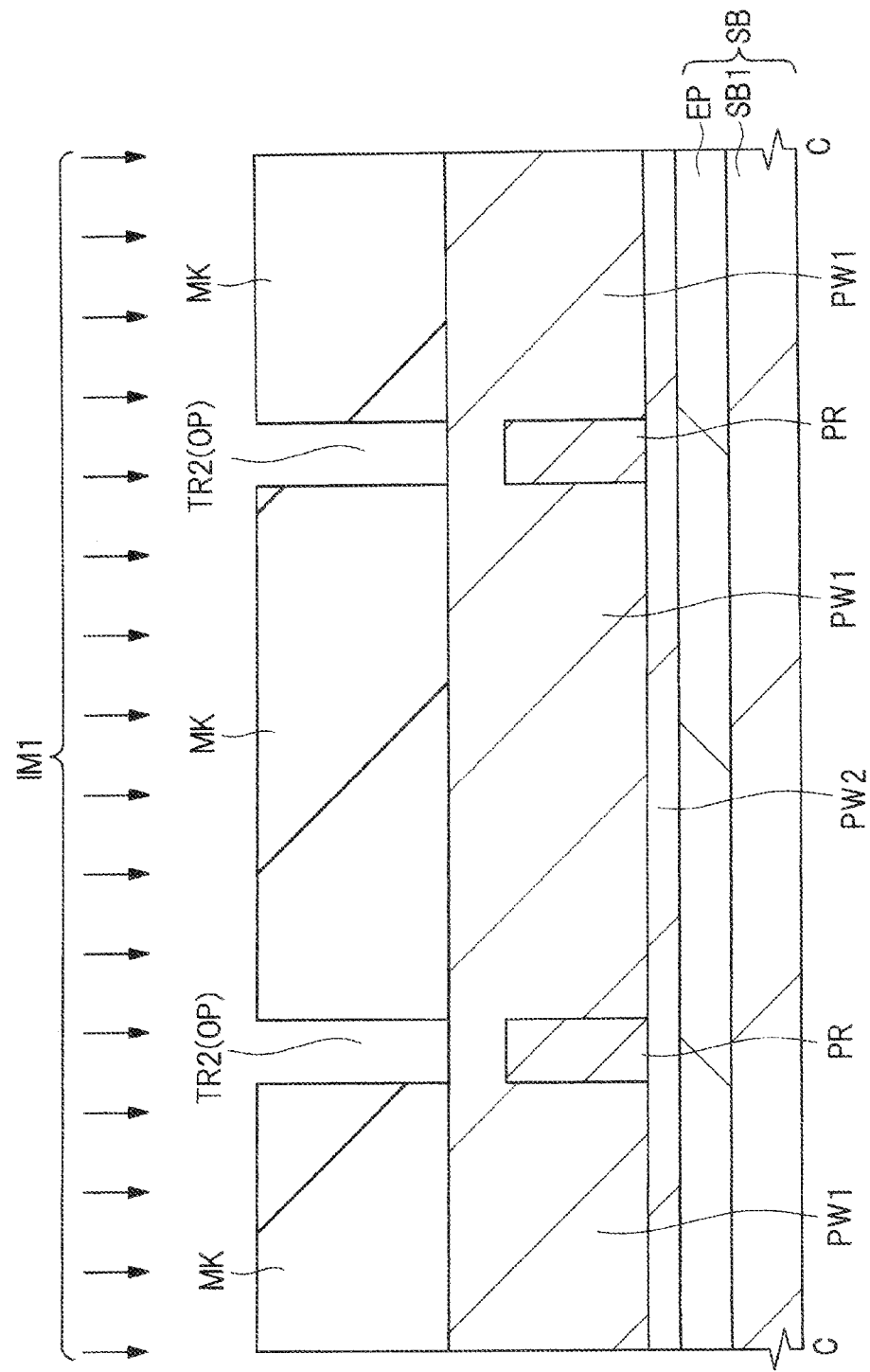
FIG. 32 is a fragmentary cross-sectional view of the semiconductor device during the manufacturing step same as that of FIG. 29.
Figure 33:
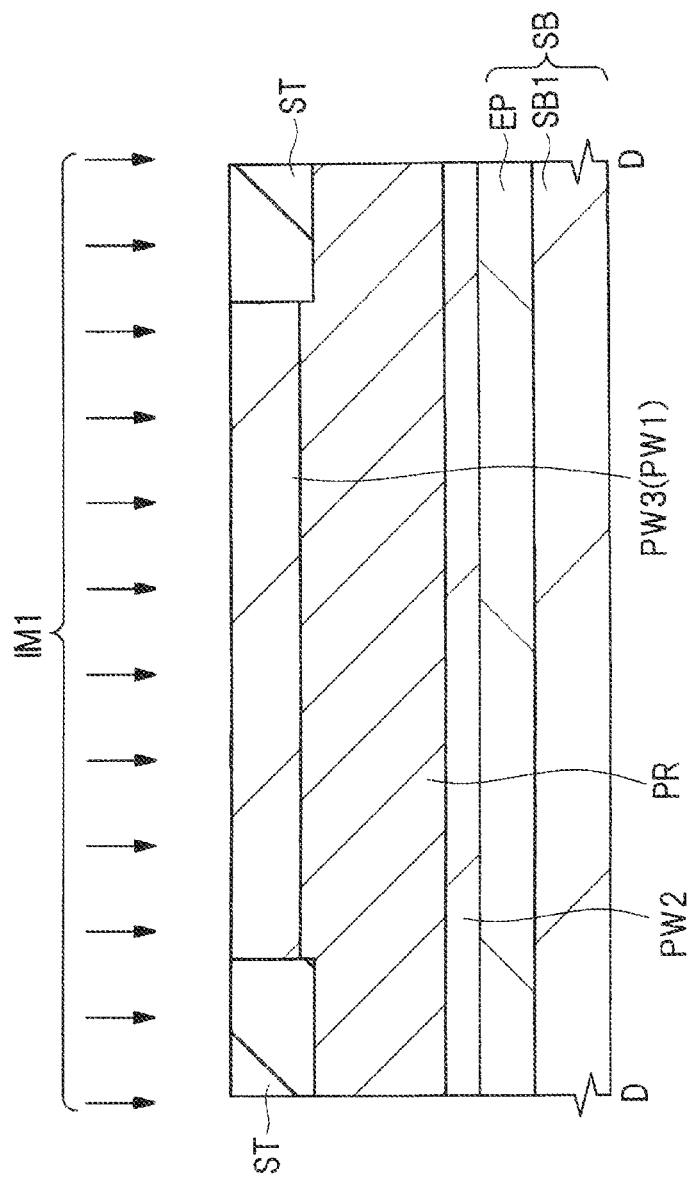
FIG. 33 is a fragmentary cross-sectional view of the semiconductor device during the manufacturing step same as that of FIG. 29.

Next, as shown in FIGS. 29 to 33, a $p^+$ type semiconductor region PR is formed in the semiconductor substrate SB of the pixel region 1A by the ion implantation of a p type impurity into the semiconductor substrate SB by using the mask layer MK as an ion implantation preventive mask. This ion implantation for the formation of the $p^+$ type semiconductor region PR will hereinafter be called "ion implantation IM1". FIGS. 31 to 33 schematically show the ion implantation IM1 by an arrow. The direction of the arrow is a traveling direction (incident direction) of an impurity ion (ion beam) and it corresponds to the direction of ion implantation.

FIG. 29 is a plan view, but to make it easier to understand, the mask layer MK is hatched with oblique lines as in FIG. 24, a region in which an impurity ion is to be implanted by the ion implantation IM1 is hatched with dots, and the photodiode formation region PDA is shown by a dotted line. FIG. 30 is a plan view showing the region same as that of FIG. 29, but to facilitate understanding of the positional relationship between the element isolation region ST and the $p^+$ type semiconductor region PR, the element isolation region ST is hatched with oblique lines as in FIG. 15, a region in which an impurity ion is to be implanted by the ion implantation IM1 is hatched with dots, and the photodiode formation region PDA is shown by a dotted line.

In the ion implantation IM1, ion implantation is performed so as to implant a p type impurity ion into the semiconductor substrate SB exposed from the opening portion OP. In other words, ion implantation is performed so as to implant a p type impurity into the semiconductor substrate SB exposed from the trench TR1 and the semiconductor substrate SB exposed from the trench TR2.

In the ion implantation IM1, therefore, the ion implantation direction is set to permit implantation of a p type impurity ion into the semiconductor substrate SB exposed from the trench TR1 and the semiconductor substrate SB exposed from the trench TR2. More specifically, the ion implantation IM1 is vertical ion implantation.

The vertical ion implantation is ion implantation performed in a direction substantially perpendicular to the main surface of the semiconductor substrate SB (that is, a normal line direction of the main surface of the semiconductor substrate SB). In vertical ion implantation, an impurity ion is incident on the main surface of the semiconductor substrate SB in a substantially perpendicular direction. The ion implantation direction corresponds to, in the ion implantation, the direction of an impurity ion (ion beam) incident on the main surface of the semiconductor substrate SB.

In the ion implantation IM1, therefore, a p type impurity ion can be implanted into the semiconductor substrate SB both from the trench TR1 and from the trench TR2. This means that in the ion implantation IM1, an impurity ion is not implanted into a region of the semiconductor substrate SB rightly below the mask layer MK but implanted into a region overlapping with the opening portion OP of the mask layer MK in plan view. The plane layout of the $p^+$ type semiconductor region PR therefore becomes almost equal to that of the opening portion OP of the mask layer MK. As a result, the $p^+$ type semiconductor region PR is formed in lattice form in plan view, each of the photodiode formation regions PDA is surrounded by the $p^+$ type semiconductor region PR, and therefore each of the photodiodes PD which will be formed later is surrounded by the $p^+$ type semiconductor region PR in plan view.

When the $p^+$ type semiconductor region PR is formed by the ion implantation IM1, the $p^+$ type semiconductor region PR extends in the X direction below the element isolation region ST extending in the X direction between the photodiode formation regions PDA adjacent to each other in the Y direction. Therefore, between the photodiode formation regions PDA adjacent to each other in the Y direction, a portion of the p well PW1 formed in the semiconductor substrate SB in the active region surrounded at the periphery thereof by the element isolation region ST has rightly therebelow the $p^+$ type semiconductor region PR. Between the photodiode formation regions PDA adjacent to each other in the direction Y, a portion of the p well PW1 formed in the semiconductor substrate SB in the active region surrounded at the periphery thereof by the element isolation region ST may be called "p well PW3". The p well PW3 has therebelow the $p^+$ type semiconductor region PR and this p well PW3 is surrounded at the periphery thereof by the element isolation region ST in plan view. In the surface layer portion of the p well PW3, a channel dope layer CD will be formed by the ion implantation IM2 described later (refer to FIGS. 36 and 38 described later). Then, source and drain regions SD are formed (refer to FIG. 51 described later).

In the ion implantation IM1 for the formation of the $p^+$ type semiconductor region PR, ion implantation is preferably performed, for example, a plurality of times at varied implantation energies. In short, the ion implantation IM1 for the formation of the $p^+$ type semiconductor region PR is preferably performed by so-called multistage ion implantation. In the multistage ion implantation, ion implantation into the same plane region is performed a plurality of times at respectively different implantation energies. This means that in the multistage ion implantation, ion implantation is performed into the same plane region a plurality of times and the implantation energy is changed each time ion implantation is performed.

When the ion implantation IMI for the formation of the $p^+$ type semiconductor region PR is performed by multistage ion implantation, vertical ion implantation is employed consistently for a plurality of times of ion implantation including the multistage ion implantation and at the same time, the mask layer MK is functioned as an ion implantation preventive mask.

The $p^+$ type semiconductor region PR is preferably formed so as to extend to a considerably deep position in the semiconductor substrate SB. Therefore, the $p^+$ type semiconductor region PR can be extended to a considerably deep position in the semiconductor substrate SB more certainly by the multistage ion implantation compared with the formation of the $p^+$ type semiconductor region PR by single ion implantation.

When the ion implantation IM1 is performed by multistage ion implantation, the $p^+$ type semiconductor region PR can be formed by carrying out ion implantation a plurality of times while changing the implantation energy, for example, from about 100 keV to 2000 keV.

When the ion implantation IM1 is performed, the entirety of the peripheral circuit region 2A is covered with the mask layer MK as shown in FIG. 28 so that no impurity is implanted (ion-implanted) into the semiconductor substrate SB of the peripheral circuit region 2A.

Figure 34:
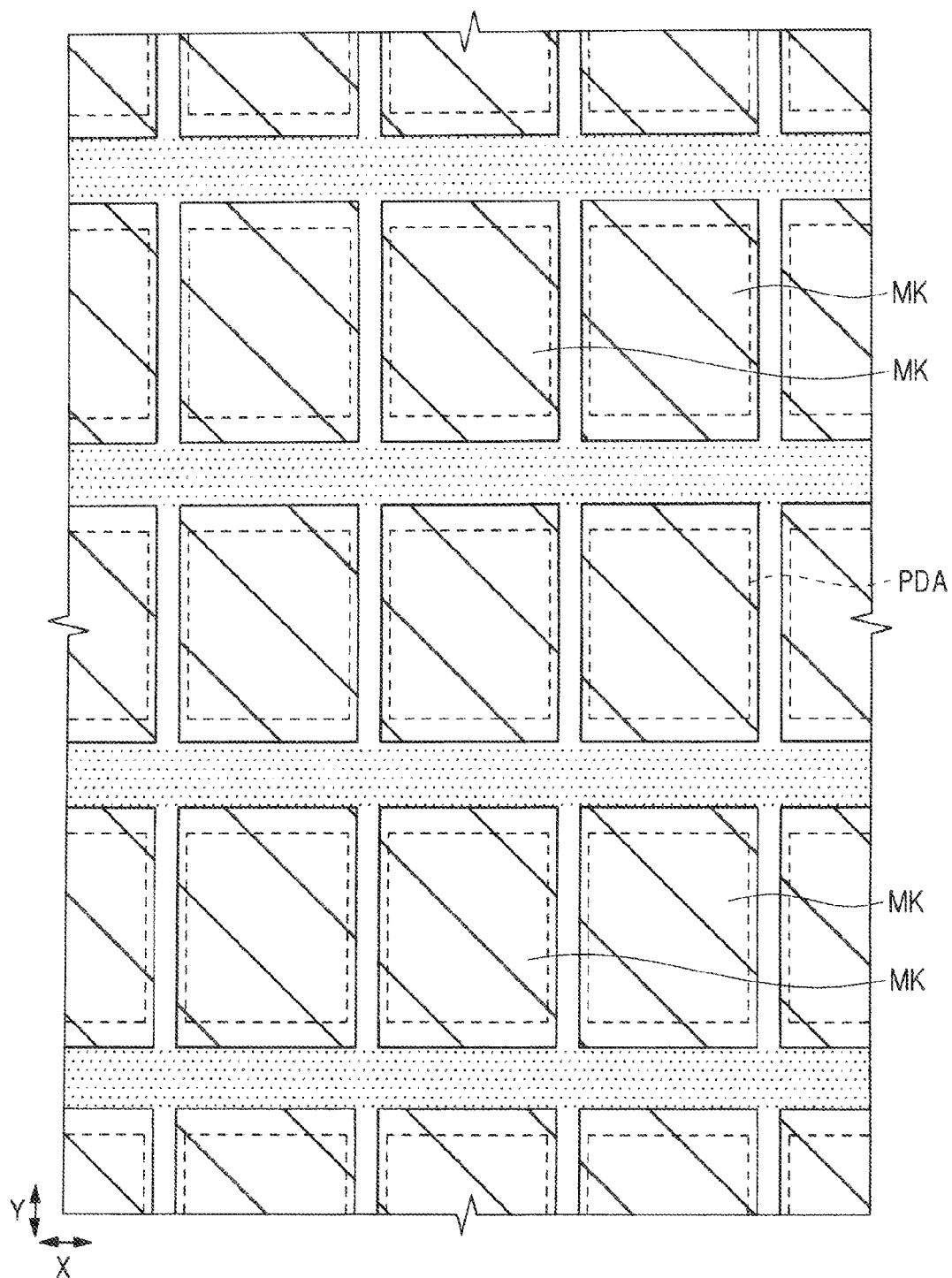
FIG. 34 is a fragmentary plan view of the semiconductor device during a manufacturing step following that of FIGS. 29 to 33.
Figure 38:
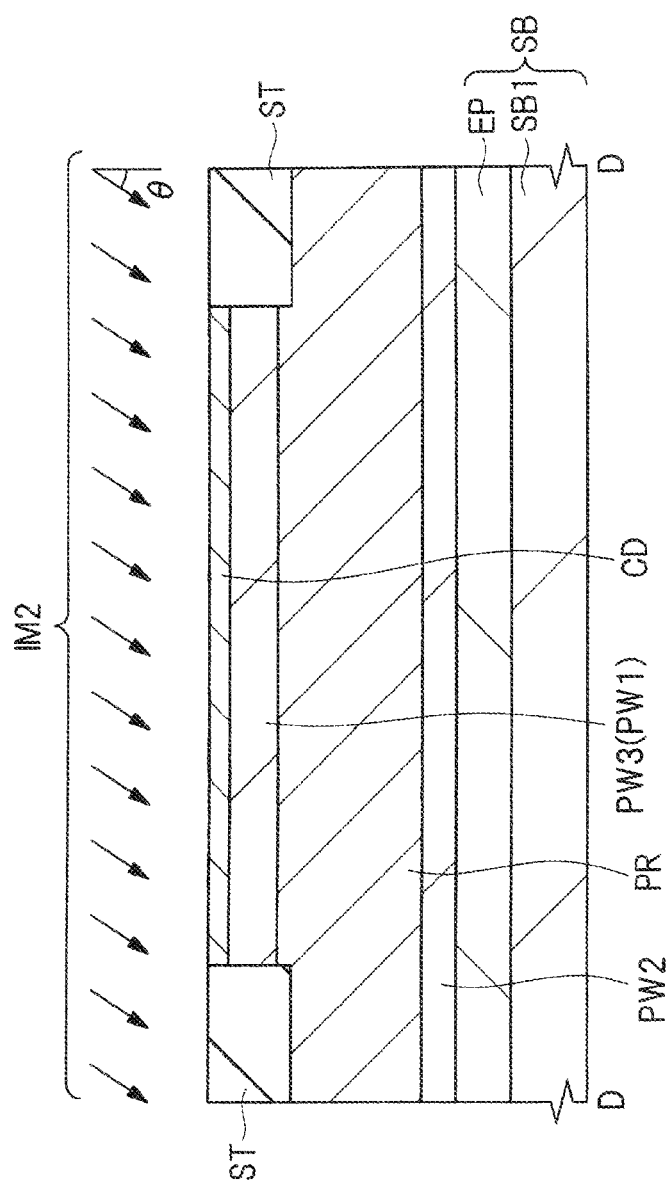
FIG. 38 is a fragmentary cross-sectional view of the semiconductor device during the manufacturing step same as that of FIG. 34.
Figure 39:
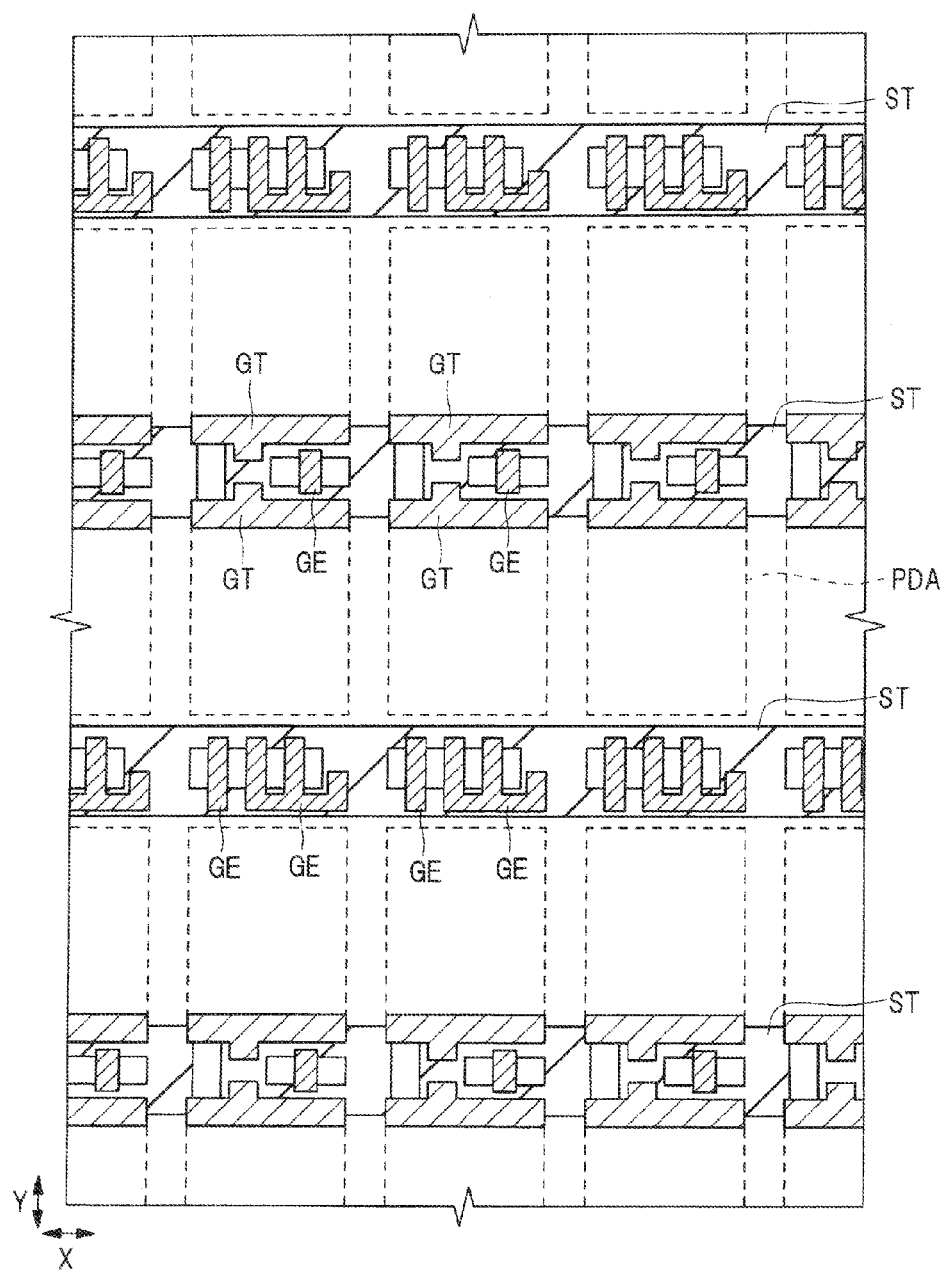
FIG. 39 is a fragmentary plan view of the semiconductor device during a manufacturing step following that of FIGS. 34 to 38.
Figure 40:
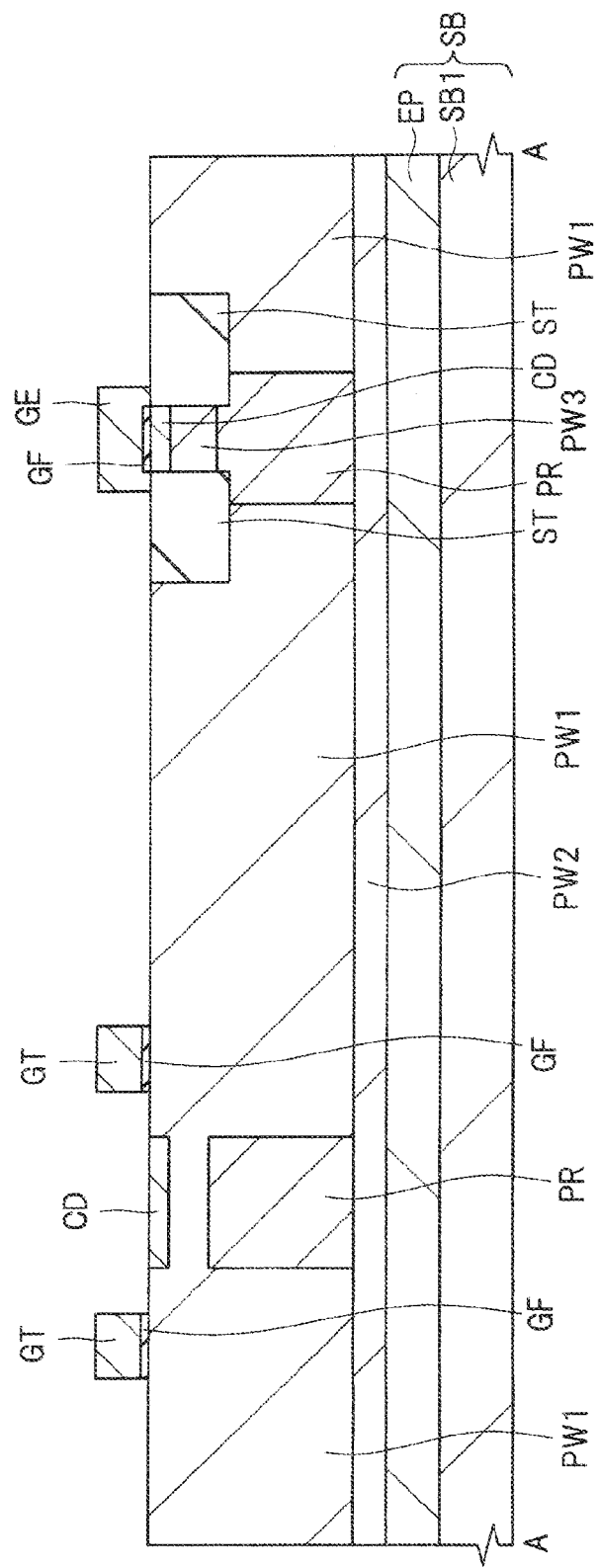
FIG. 40 is a fragmentary cross-sectional view of the semiconductor device during the manufacturing step same as that of FIG. 39.
Figure 41:
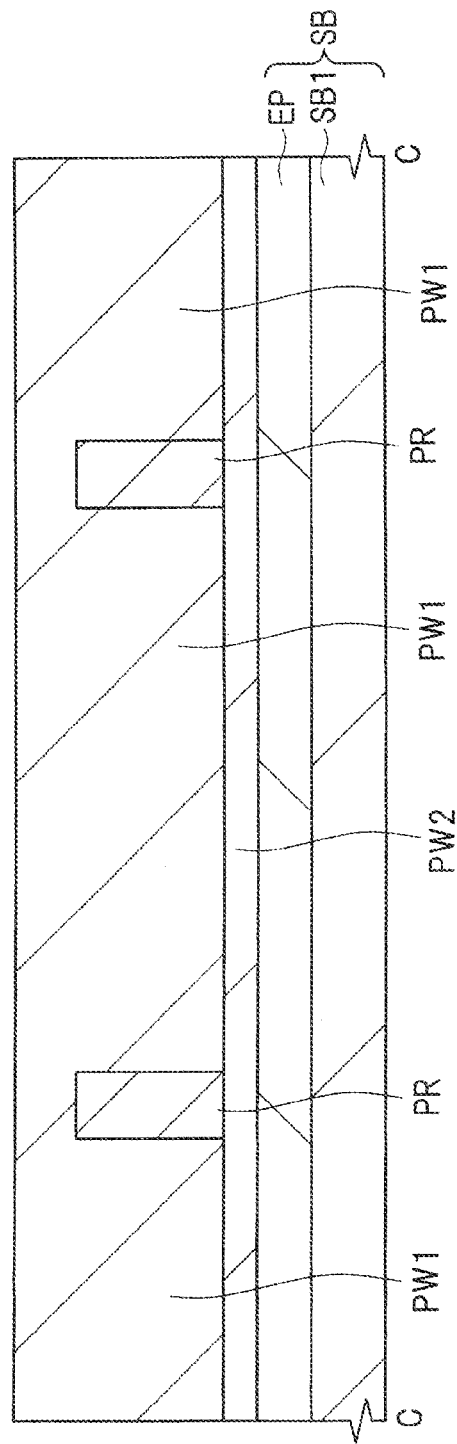
FIG. 41 is a fragmentary cross-sectional view of the semiconductor device during the manufacturing step same as that of FIG. 39.
Figure 42:
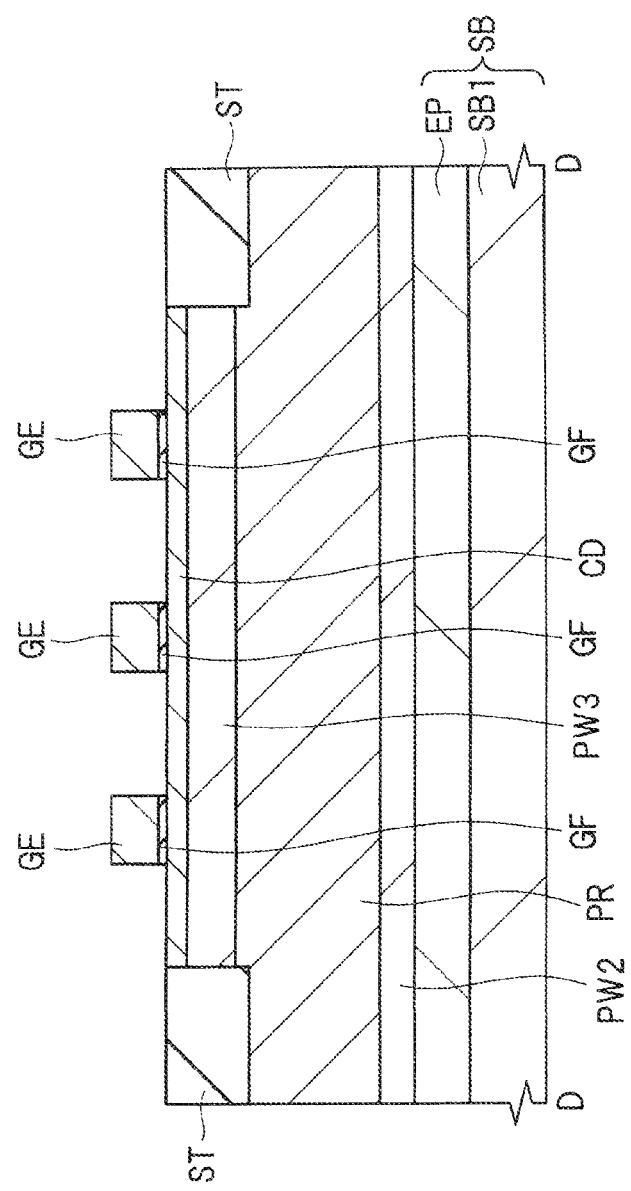
FIG. 42 is a fragmentary cross-sectional view of the semiconductor device during the manufacturing step same as that of FIG. 39.
Figure 43:
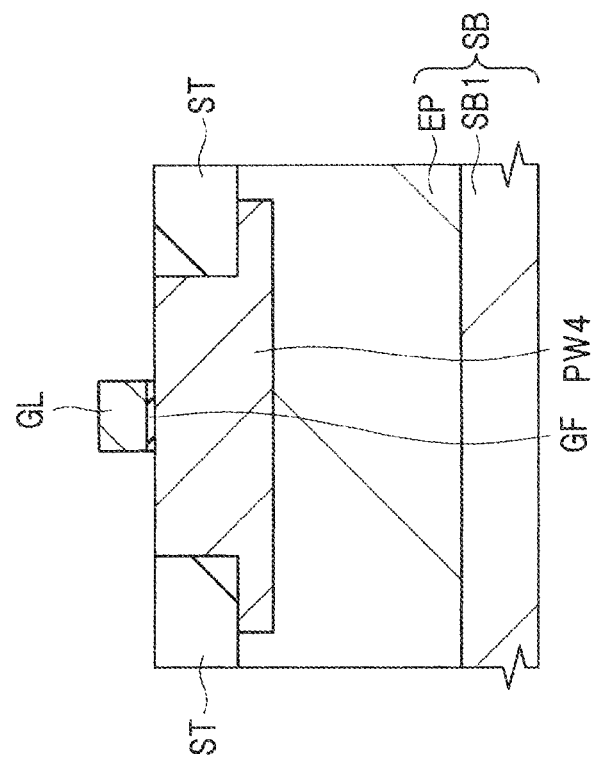
FIG. 43 is a fragmentary cross-sectional view of the semiconductor device during the manufacturing step same as that of FIG. 39.
Figure 44:
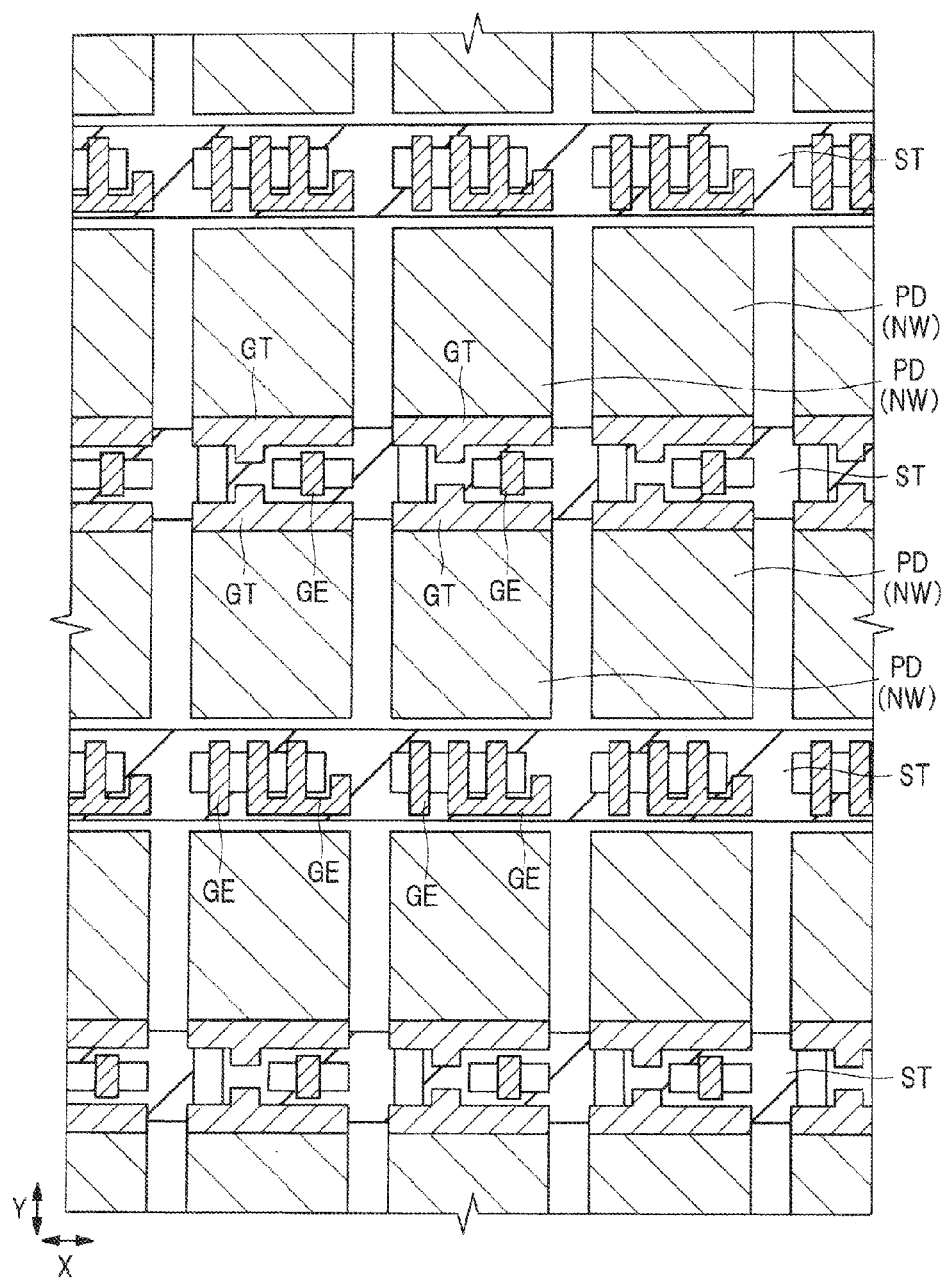
FIG. 44 is a fragmentary plan view of the semiconductor device during a manufacturing step following that of FIGS. 39 to 43.
Figure 45:
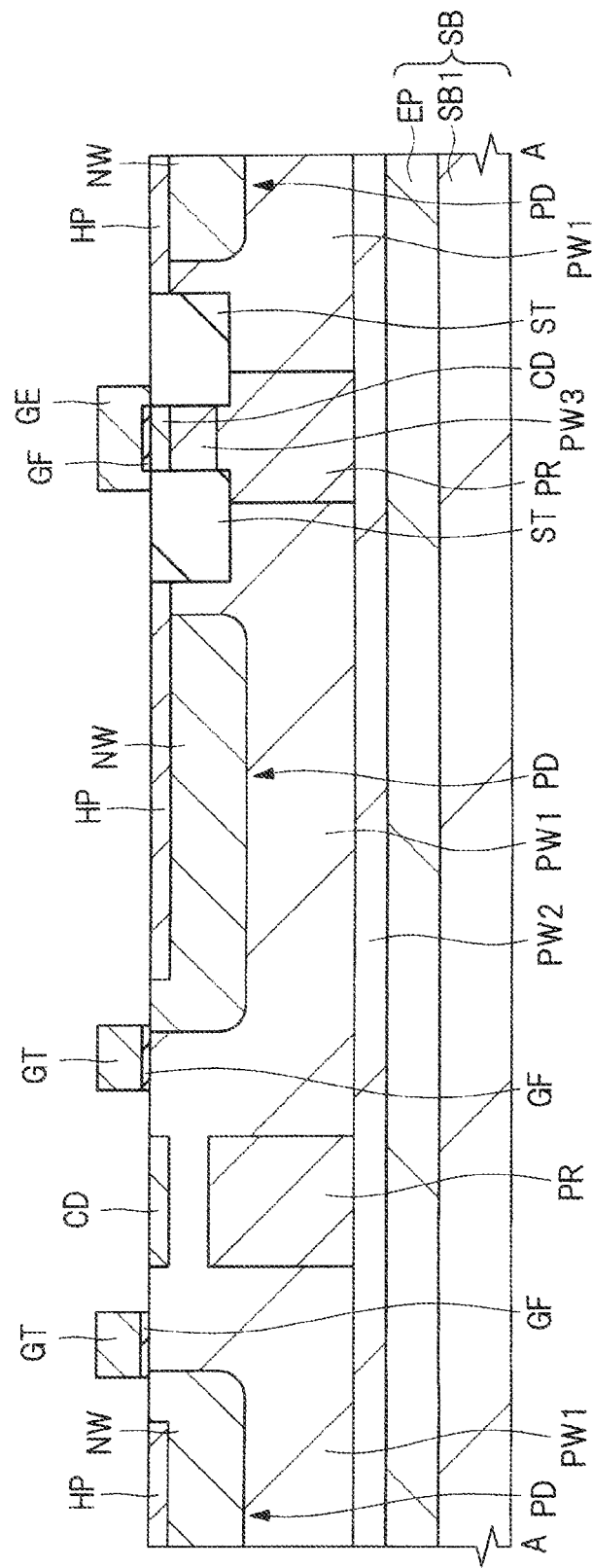
FIG. 45 is a fragmentary cross-sectional view of the semiconductor device during the manufacturing step same as that of FIG. 44.
Figure 46:
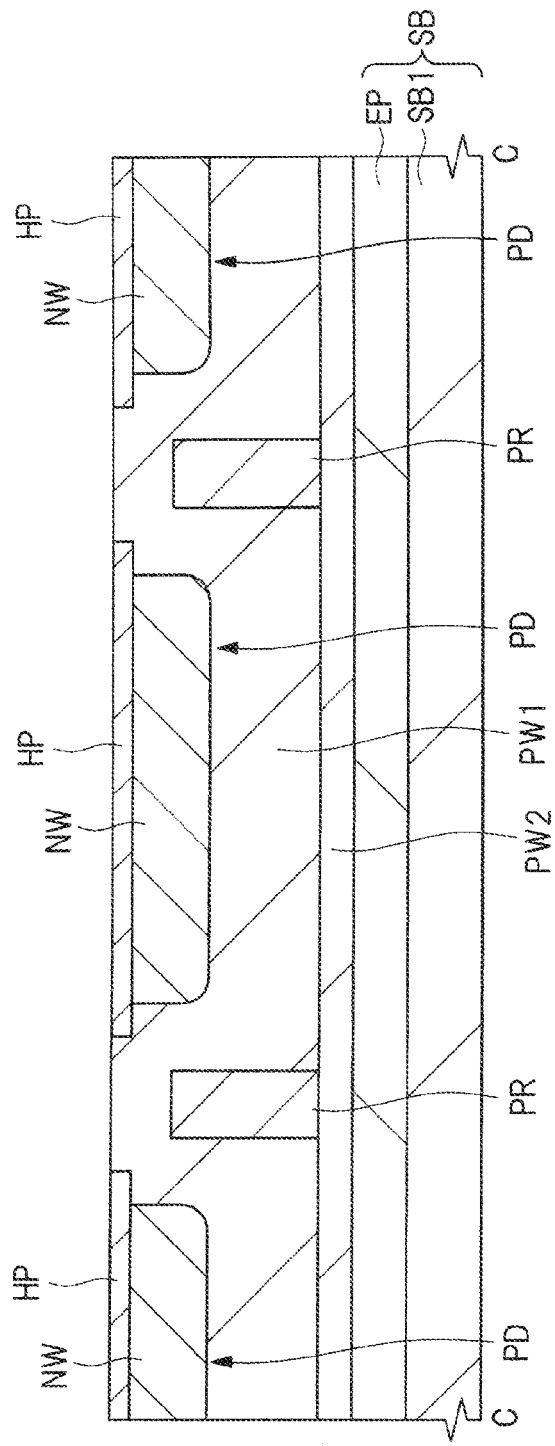
FIG. 46 is a fragmentary cross-sectional view of the semiconductor device during the manufacturing step same as that of FIG. 44.
Figure 47:
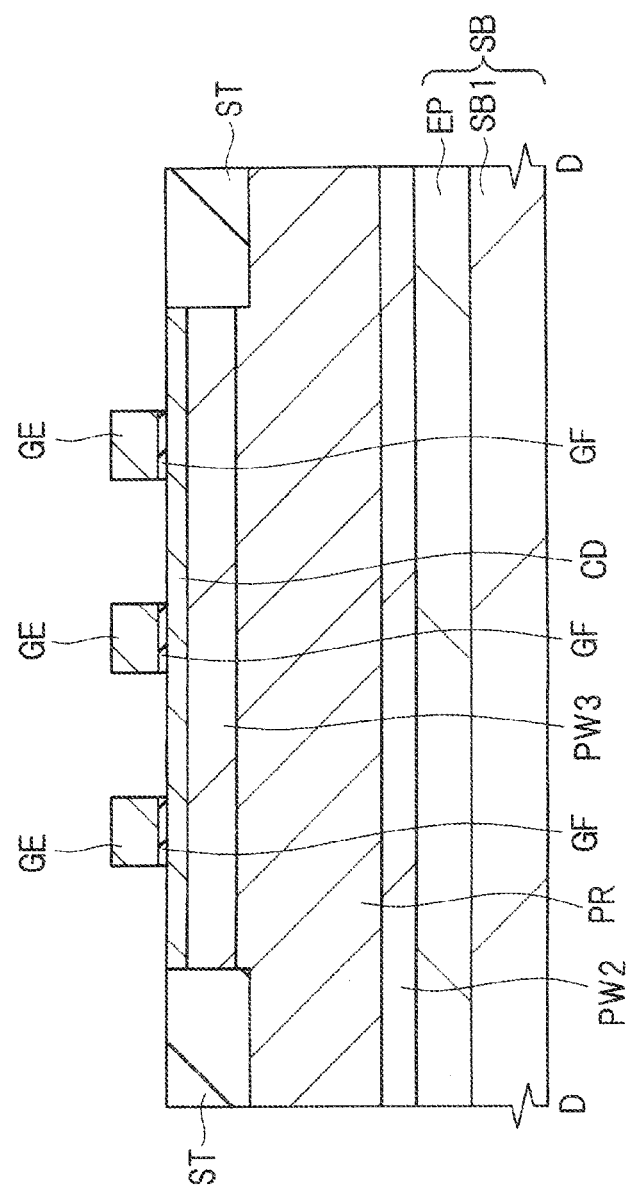
FIG. 47 is a fragmentary cross-sectional view of the semiconductor device during the manufacturing step same as that of FIG. 44.
Figure 48:
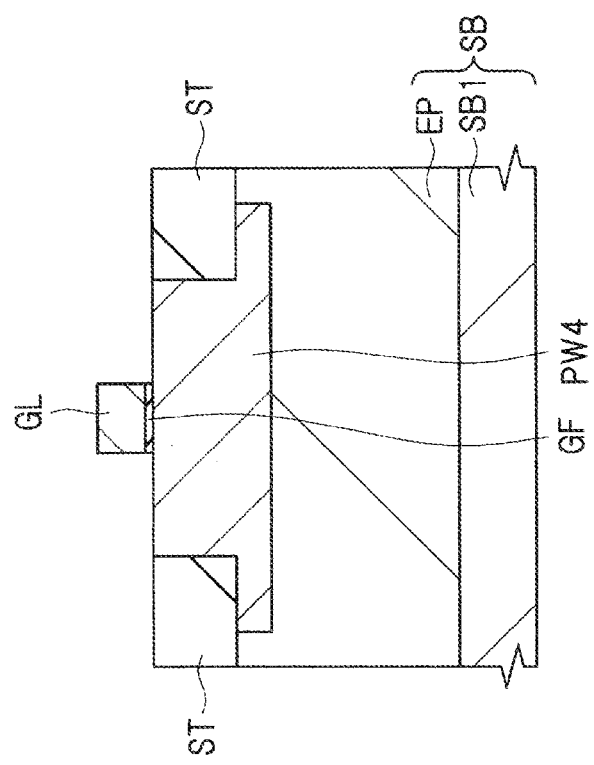
FIG. 48 is a fragmentary cross-sectional view of the semiconductor device during the manufacturing step same as that of FIG. 44.
Figure 49:
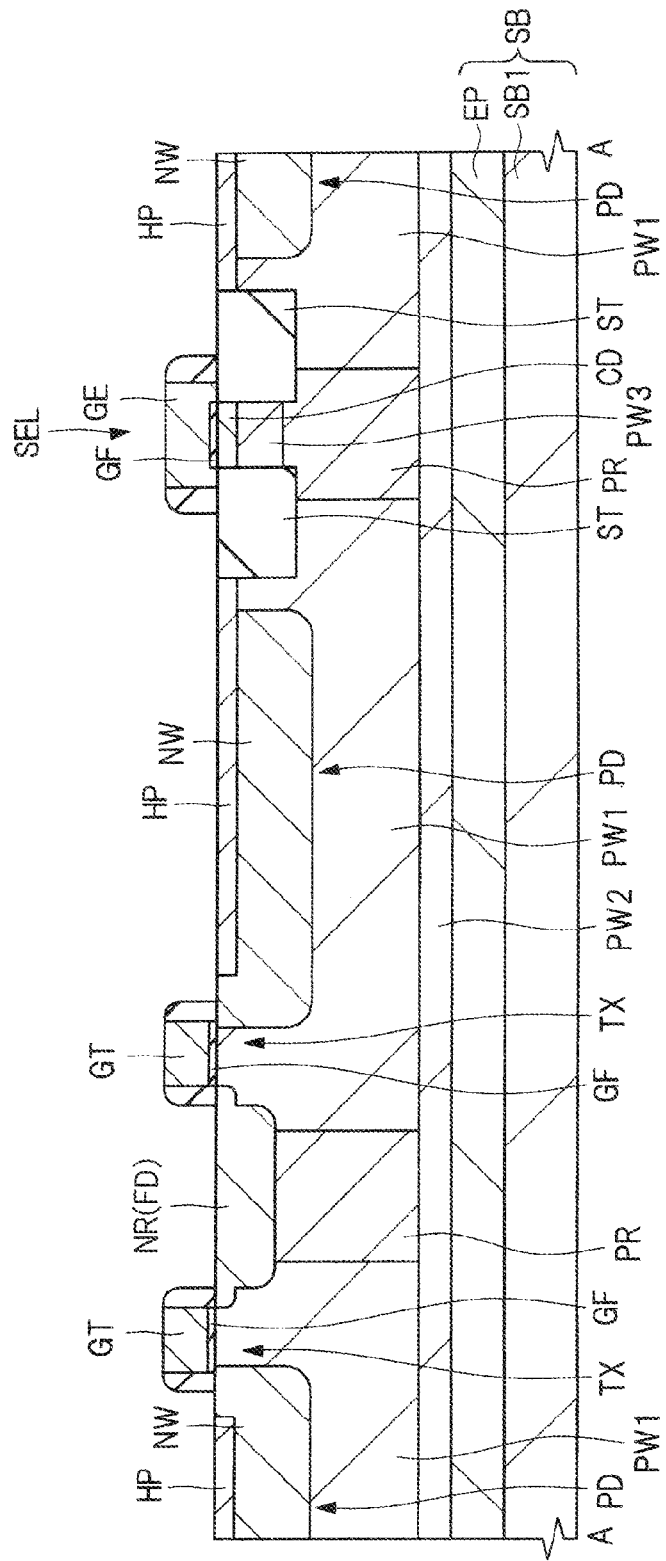
FIG. 49 is a fragmentary cross-sectional view of the semiconductor device during a manufacturing step following that of FIGS. 44 to 48.
Figure 50:
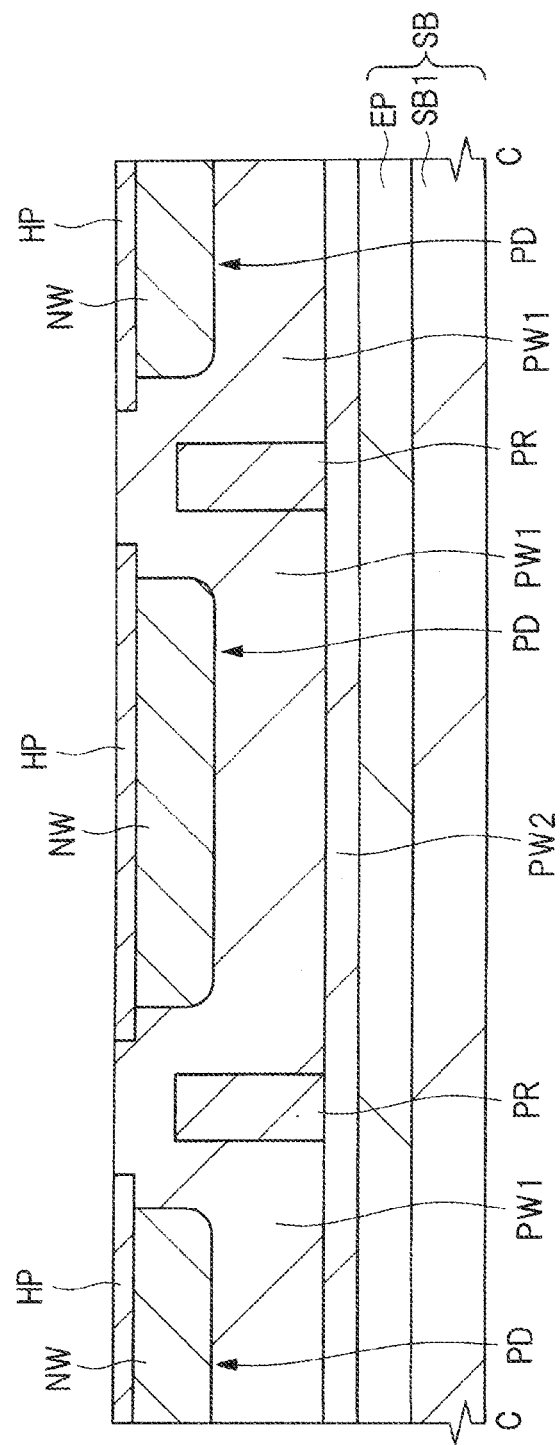
FIG. 50 is a fragmentary cross-sectional view of the semiconductor device during the manufacturing step same as that of FIG. 49.
Figure 51:
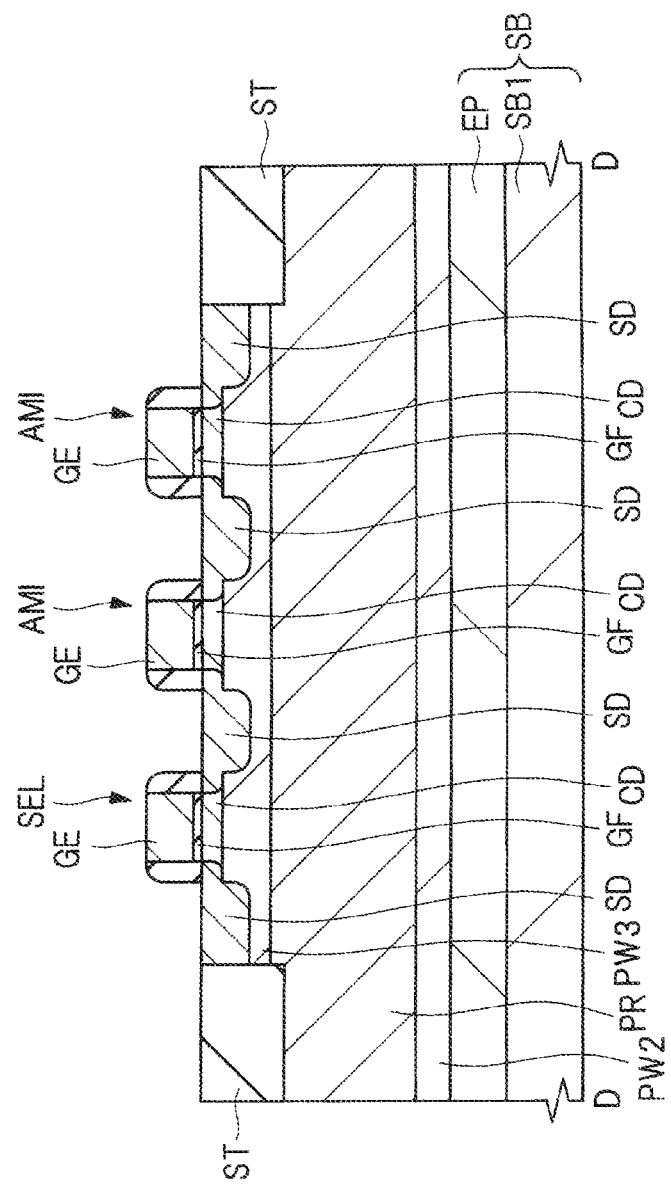
FIG. 51 is a fragmentary cross-sectional view of the semiconductor device during the manufacturing step same as that of FIG. 49.
Figure 52:
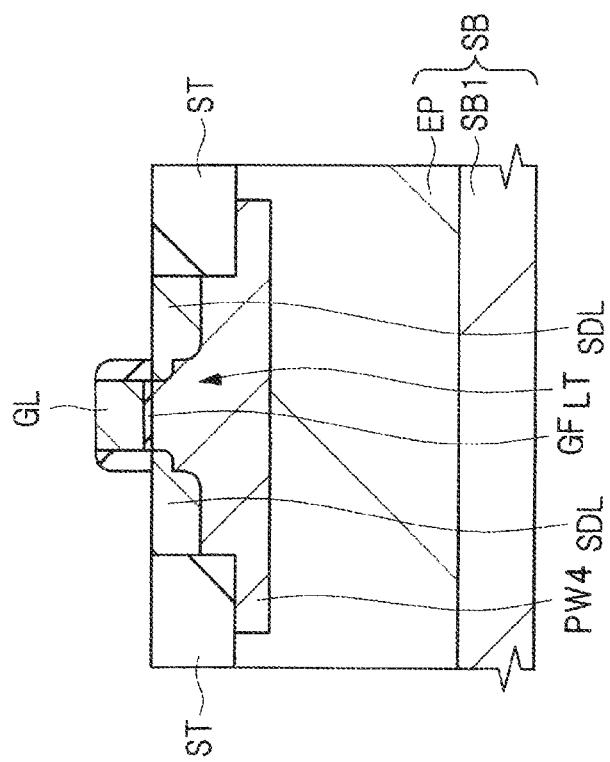
FIG. 52 is a fragmentary cross-sectional view of the semiconductor device during the manufacturing step same as that of FIG. 49.

Next, as shown in FIGS. 34 and 38, the ion implantation IM2 is performed into the semiconductor substrate SB by using the mask layer MK as an ion implantation preventive mask. In this ion implantation IM2, an impurity having a conductivity type opposite to that of the impurity implanted in the ion implantation IM1 is implanted. In short, an n type impurity is ion-implanted in this ion implantation IM2.

Figure 36:
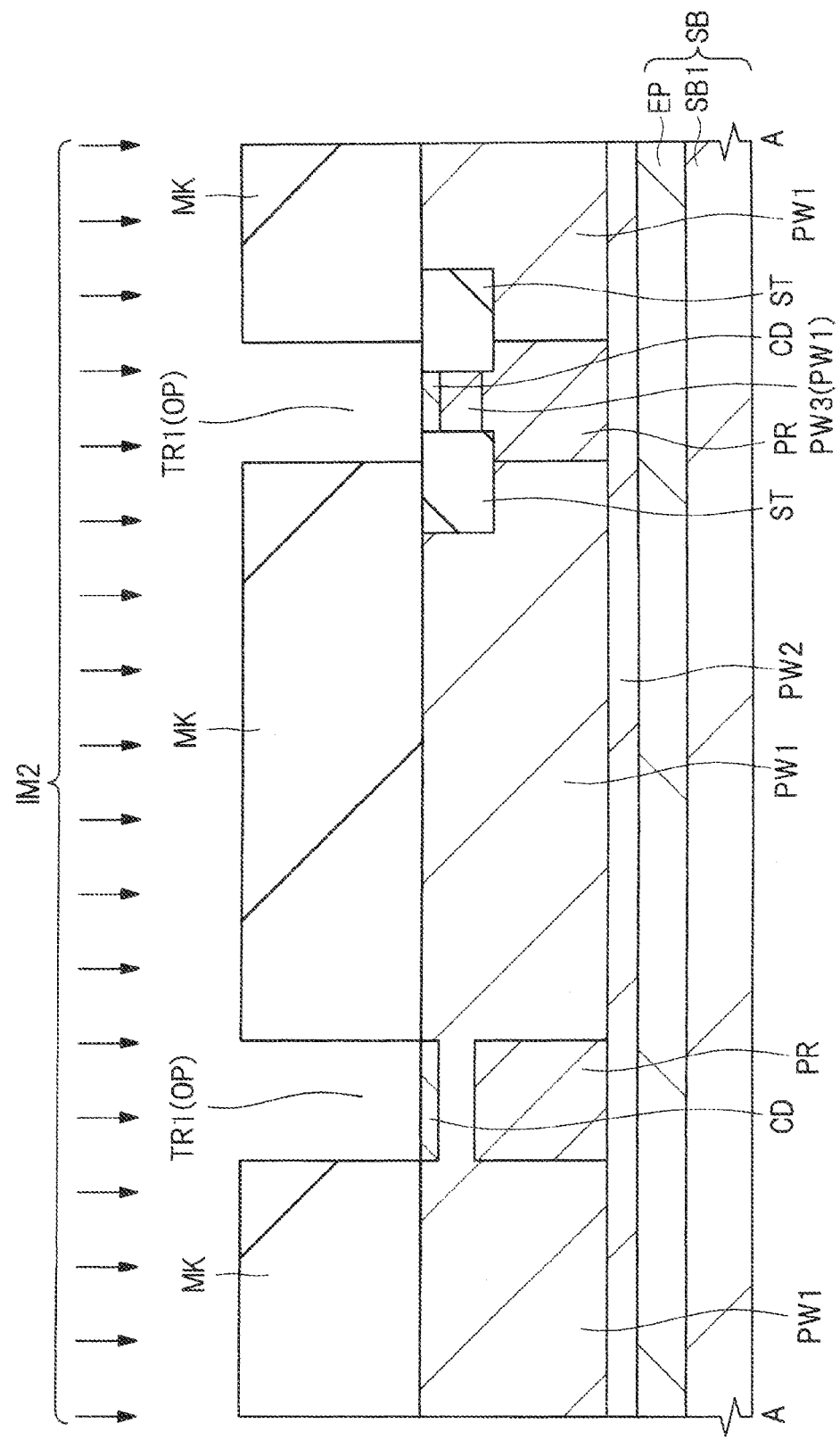
FIG. 36 is a fragmentary cross-sectional view of the semiconductor device during the manufacturing step same as that of FIG. 34.

FIGS. 36 and 38 schematically show the ion implantation IM2 by an arrow. The direction of the arrow is a traveling direction (incidence direction) of an impurity ion (ion beam) and it corresponds to the ion implantation direction. The ion implantation IM2 is oblique ion implantation. The implantation depth in the ion implantation IM2 is shallower than the implantation depth in the ion implantation IM1.

Figure 35:
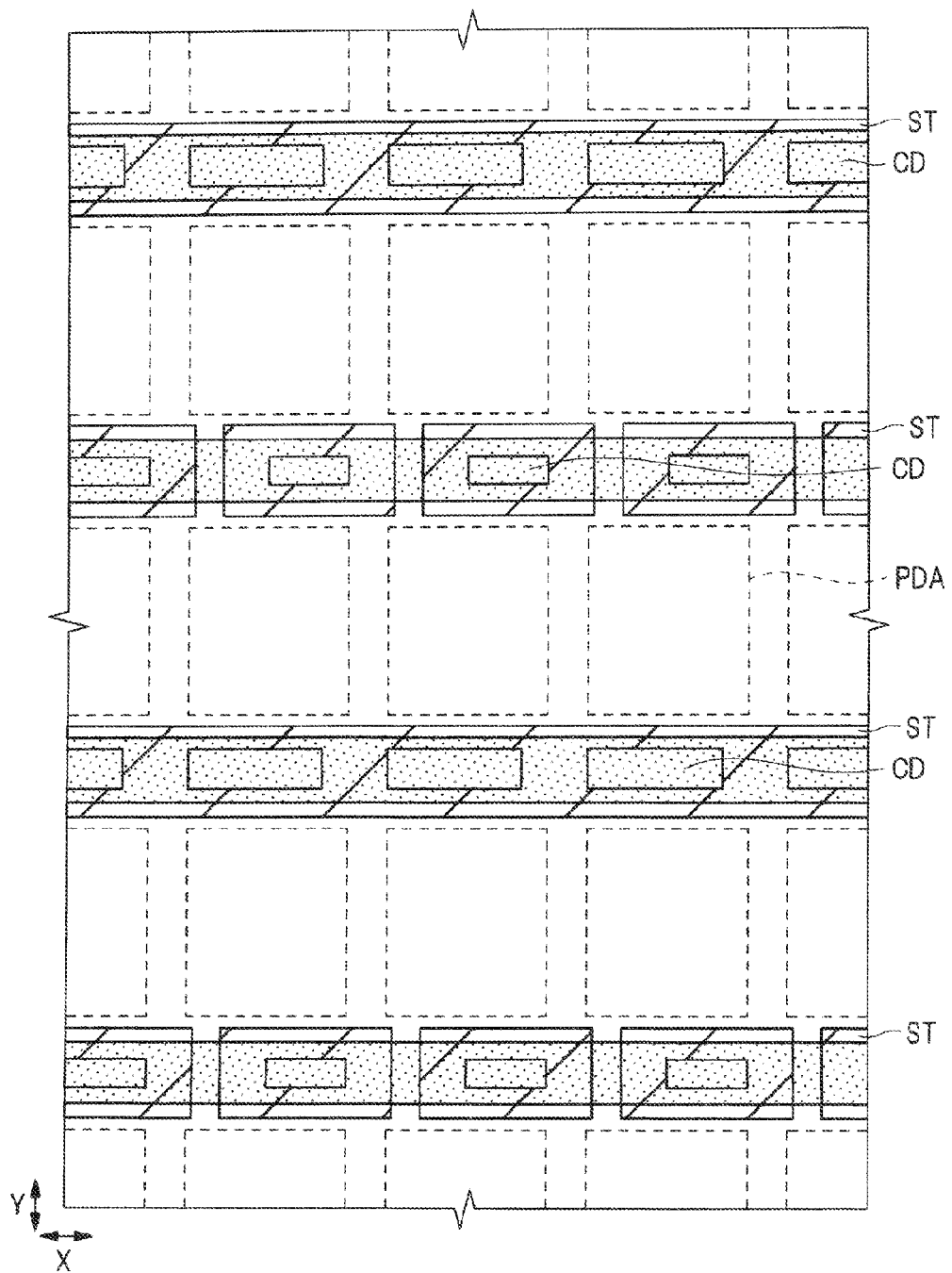
FIG. 35 is a fragmentary plan view of the semiconductor device during the manufacturing step same as that of FIG. 34.

FIG. 34 is a plan view. To make it easier to understand, the mask layer MK is hatched with oblique lines as in FIG. 24, a region in which an impurity ion is implanted by the ion implantation IM2 is hatched with dots, and the photodiode formation region PDA is shown by a dotted line. FIG. 35 is a plan view showing the same region as that of FIG. 34, in which the element isolation region ST is hatched with oblique lines as in FIG. 15, a region in which an impurity ion is implanted by the ion implantation IM2 is hatched with dots, and the photodiode formation region PDA is shown by a dotted line.

When the ion implantation IM2 is performed, since the entirety of the peripheral circuit region 2A is covered with the mask layer MK as shown in FIG. 28, no impurity is implanted (ion-implanted) into the semiconductor substrate SB in the peripheral circuit region 2A.

In the ion implantation IM2, the angle of ion implantation is set so that an impurity ion is incident on the main surface of the semiconductor substrate SB not substantially perpendicularly but obliquely. In short, the ion implantation IM2 is oblique ion implantation.

The oblique ion implantation is ion implantation performed in a direction inclined from the normal line direction of the main surface of the semiconductor substrate SB. In the oblique ion implantation, an impurity ion is incident on the main surface of the semiconductor substrate SB at an incident angle in not a substantially perpendicular direction but an oblique direction. The ion implantation direction corresponds to a direction in which an impurity ion (ion beam) is incident on the main surface of the semiconductor substrate SB.

In the ion implantation IM1, in the main surface of the semiconductor substrate SB, a p type impurity is ion-implanted into a region between the photodiode formation regions PDA adjacent to each other in the Y direction and a region between the photodiode formation regions PDA adjacent to each other in the X direction. On the other hand, in the ion implantation IM2, in the main surface of the semiconductor substrate SB, an impurity is implanted into a region between the photodiode formation regions PDA adjacent to each other in the Y direction but not into a region between the photodiode formation regions PDA adjacent to each other in the X direction.

More specifically, since in the ion implantation IM1 using vertical ion implantation, an impurity ion is implanted into the semiconductor substrate SB from both the trench TR1 extending in the X direction and the trench TR2 extending in the Y direction, an impurity-implanted plane region almost agrees with the opening portion OP in plan view. On the other hand, since in the ion implantation IM2 using an oblique ion implantation, an impurity is implanted into the semiconductor substrate SB from the trench TR1 extending in the X direction, but the semiconductor substrate SB is blocked by the mask layer MK and prevented from being implanted with an impurity ion from the trench TR2 except for a portion that intersects with the trench TR1.

In the ion implantation IM2, therefore, the ion implantation direction is set so that an impurity ion is implanted into the semiconductor substrate SB exposed from the trench TR1 but due to blocking with the mask layer MK, an impurity ion is not implanted into the semiconductor substrate SB exposed from the trench TR2 except for an intersection between the trench TR1 and the trench TR2.

More specifically, in the ion implantation IM2, the ion implantation direction is set parallel to a plane parallel to both the normal line direction of the main surface of the semiconductor substrate SB and the X direction so that without being blocked with the mask layer MK, an impurity ion can be implanted into the semiconductor substrate SB exposed from the trench TR1 extending in the X direction. From another viewpoint, the ion implantation direction is set parallel to a plane parallel to the X direction and at the same time, orthogonal to the main surface of the semiconductor substrate SB. This makes it possible, even if the ion implantation IM2 is oblique ion implantation, to implant an impurity ion into the semiconductor substrate SB at a bottom portion of the trench TR1 extending in the X direction.

In order to block, by the mask layer MK, an impurity ion from being implanted into the semiconductor substrate SB exposed from the trench TR2 except for a portion intersecting with the trench TR1, an inclination angle $\theta$ (tilt angle) of ion implantation in the ion implantation IM2 may be set to satisfy $\tan \theta > W_1/H_1$. This makes it possible to prevent an impurity ion from being implanted into the semiconductor substrate SB at the bottom portion of the trench TR2 except for the intersection between the trench TR1 and the trench TR2.

In the ion implantation IM2, therefore, it is desired to employ oblique ion implantation, to set the ion implantation direction parallel to a plane parallel to both the normal direction of the main surface of the semiconductor substrate SB and the X direction, and set the inclination angle (tilt angle) $\theta$ of the ion implantation in the ion implantation IM2 to satisfy $\tan \theta > W_1/H_1$.

Figure 37:
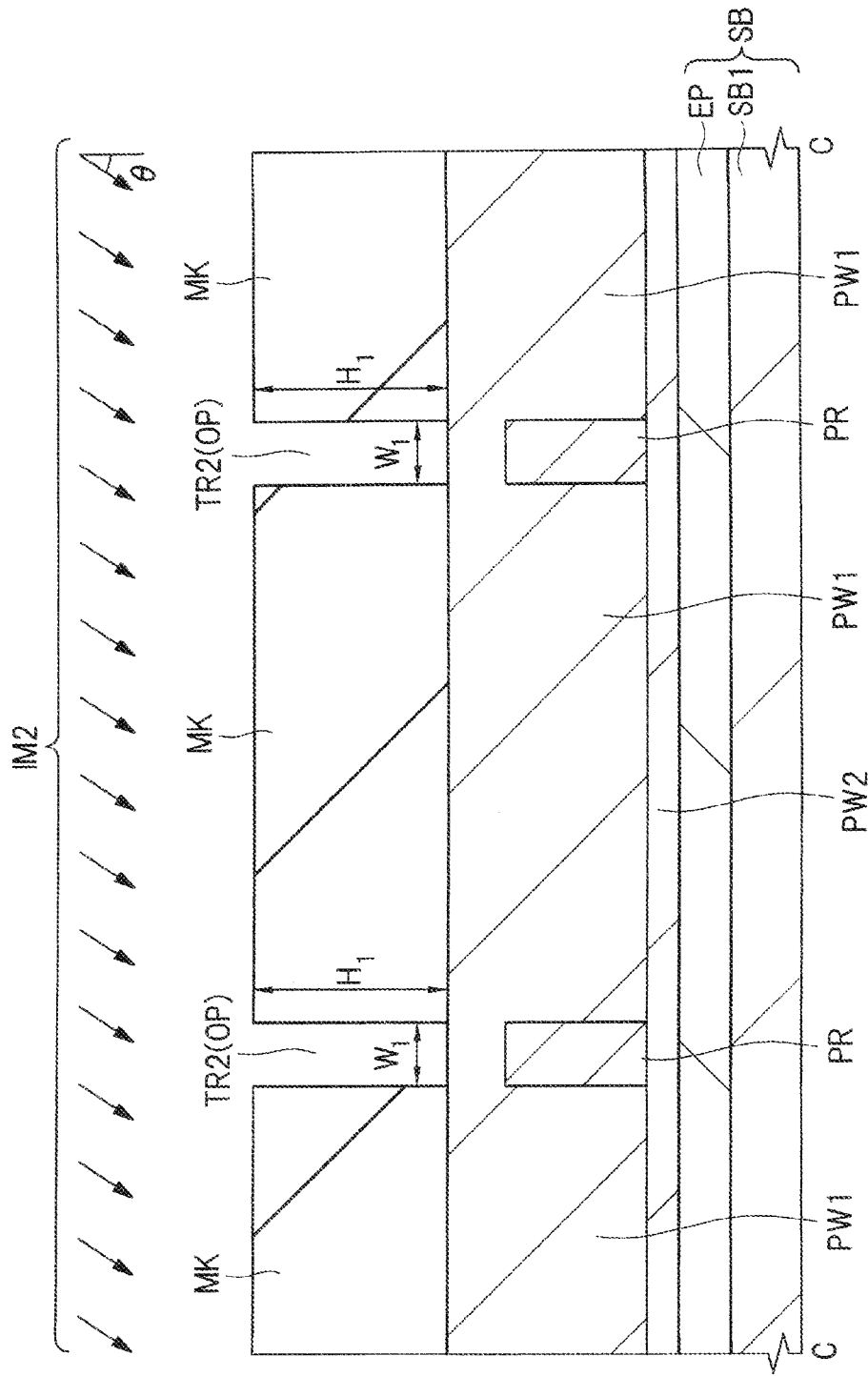
FIG. 37 is a fragmentary cross-sectional view of the semiconductor device during the manufacturing step same as that of FIG. 34.

In the above formula, $H_1$ means the height of the side wall of the trench TR2 and is shown in FIG. 37. This height $H_1$ of the side wall of the trench TR2 agrees with the thickness of the mask layer MK at a position adjacent to the trench TR2. The $W_1$ is the width $W_1$ of the trench TR2 and corresponds to the width (size), in the X direction, of the trench TR2 extending in the Y direction and is shown in FIGS. 24, 26, and 37. The $\theta$ is the inclination angle $\theta$ of ion implantation in the ion implantation IM2 and corresponds to the inclination angle of the ion implantation direction to the normal line direction of the main surface of the semiconductor substrate SB and is shown in FIG. 37. In other words, in the ion implantation IM2, an angle (intersection angle) between the ion implantation direction (incident direction of an impurity ion or ion beam) and the normal line direction of the main surface of the semiconductor substrate SB is the inclination angle $\theta$. The inclination angle $\theta$ is also called "tilt angle".

When in the ion implantation IM2, an incident angle of an impurity ion (ion beam) on the main surface of the semiconductor substrate SB is near a right angle (meaning that the inclination angle $\theta$ is sufficiently small), an impurity ion is implanted even at the bottom portion of the trench TR2 extending in the Y direction without being blocked with the mask layer MK. On the other hand, when in the ion implantation IM2, an incident angle of an impurity ion (ion beam) on the main surface of the semiconductor substrate SB is sufficiently small (meaning that the inclination angle $\theta$ is sufficiently large), ion implantation is blocked by the mask layer MK and an impurity ion is prevented from being implanted at the bottom portion of the trench TR2 except for the intersection between the trench TR1 and the trench TR2. When the inclination angle of the ion implantation IM2 is set at $\theta$, the incident angle of an impurity ion (ion beam) on the main surface of the semiconductor substrate SB in the ion implantation IM2 is represented by the following formula: $90°-\theta$. When the inclination angle $\theta$ of the ion implantation in the ion implantation IM2 is set so as to satisfy the following formula: $\tan(90°-\theta) \geq H_1/W_1$, the impurity is inevitably implanted into at least a portion of the semiconductor substrate SB at the bottom portion of the trench TR2 in addition to the intersection between the trench TR1 and the trench TR2. On the other hand, when the inclination angle $\theta$ of the ion implantation IM2 is set so as to satisfy the following formula: $\tan(90°-\theta) < H_1/W_1$, implantation of the impurity into the semiconductor substrate SB can be prevented at the bottom portion of the trench TR2 except for the intersection between the trench TR1 and the trench TR2. Here, $\tan(90°-\theta) = 1/\tan \theta$ means that $\tan(90°-\theta) < H_1/W_1$ is equivalent to $\tan \theta > W_1/H_1$. Implantation of an impurity into the semiconductor substrate SB at the bottom portion of the trench TR2 except for the intersection between the trench TR1 and the trench TR2 can therefore be prevented by setting the inclination angle $\theta$ of the ion implantation IM2 so as to satisfy the following formula: $\tan \theta > W_1/H_1$.

The $p^+$ type semiconductor region PR is formed by the ion implantation IM1. The $p^+$ type semiconductor region PR preferably extends to a position considerably deep in the semiconductor substrate SB so that the thickness of the mask layer MK necessarily becomes large and the height $H_1$ of the side wall of the trench TR2 therefore becomes high. For increasing the number of the pixels PU to be formed in the pixel region 1A or narrowing of the area of the pixel region 1A, a decrease in the width $W_2$ of the $p^+$ type semiconductor region PR is required and therefore a decrease in the width $W_1$ of the trench TR2 to some extent is desired. Since the $W_1/H_1$ ratio can be made smaller to some extent, the ion implantation IM2 can be performed to satisfy the following formula: $\tan \theta > W_1/H_1$ even without significantly increasing the inclination angle θ.

When the inclination angle θ is set excessively large, in order to implant an impurity ion into the semiconductor substrate SB between the photodiode formation regions PDA adjacent to each other in the Y direction by the ion implantation IM2 even in the pixel PU at the outermost periphery of a plurality of the pixels PU arranged in array form, the position at the end portion of the trench TR2 must be separated from the photodiode formation region PDA. This is disadvantageous for downsizing (area narrowing) of a semiconductor device because a margin (region in which no peripheral circuit can be formed) must be provided at the periphery of the pixel region 1A. From this standpoint, the inclination angle θ of the ion implantation IM2 preferably falls within a range satisfying the following formula: $\tan \theta > W_1/H_1$ and is not excessively large. For example, it is preferably 30° or less (θ≤30°). When the inclination angle θ of the ion implantation IM2 is set at 30° or less (θ≤30°), the ion implantation IM2 can be carried out easily and certainly by using a common ion implantation apparatus.

The ion implantation IM2 can be achieved by single ion implantation. This leads to reduction in the time required for the ion implantation IM2 and improvement in the throughput of the semiconductor device. In another mode, the ion implantation IM2 can be carried out by a plurality of times of ion implantation. In this case, the plurality of times of ion implantation including the ion implantation IM2 is carried out either in the same ion implantation direction or different ion implantation directions. When the plurality of times of ion implantation is performed while changing the ion implantation direction, oblique ion implantation is employed in each ion implantation and the ion implantation direction is made parallel to a plane parallel to both the normal line direction of the main surface of the semiconductor substrate SB and the X direction, and at the same time, the inclination angle is set so as to satisfy the following formula: $\tan \theta > W_1/H_1$.

In FIGS. 34 and 35, a region to be implanted with an impurity ion by the ion implantation IM2 is hatched with dots. As shown in FIGS. 34 and 35, a plane region in which an impurity has been implanted by the ion implantation IM2 almost agrees with the trench TR1 extending in the X direction in plan view. By the ion implantation IM2, however, no impurity ion is implanted into the semiconductor substrate SB at a position overlapping with the trench TR2 in plan view except for the intersection between the trench TR1 and the trench TR2.

At a position overlapping with the trench TR1 extending in the X direction in plan view, an impurity ion is implanted into the semiconductor substrate SB (including the element isolation region ST) by the ion implantation IM1 and at the same time, an impurity ion is implanted by the ion implantation IM2. At a position overlapping with the trench TR2 in plan view except for the intersection between the TR1 and the trench TR2, an impurity ion is implanted into the semiconductor substrate SB by the ion implantation IM1 but no impurity ion is implanted by the ion implantation IM2.

The ion implantation IM1 is performed to form the $p^+$ type semiconductor region PR. By the ion implantation IM1, therefore, a p type impurity is implanted.

On the other hand, the ion implantation IM2 is performed to adjust the impurity concentration of the channel formation region of the transistors to be formed later between the photodiode formation regions PDA adjacent to each other in the Y direction, more specifically, with the amplifier transistor AMI, the select transistor SEL, and the reset transistor RST. The ion implantation IM2 therefore has a function as channel doping ion implantation of transistors to be formed between the photodiodes PD adjacent to each other in the Y direction. By adjusting the impurity concentration of the channel formation region of the amplifier transistor AMI, the select transistor SEL, and the reset transistor RST by the ion implantation IM2, the threshold voltages of the transistors AMI, SEL, and RST can be controlled to a desired value.

In the ion implantation IM2, ion implantation of an n type impurity is desired, because at the time of ion implantation of a p type impurity in the ion implantation IM1, the p type impurity is inevitably implanted to some extent into the surface layer portion of the semiconductor substrate SB in the active region for the formation of the amplifier transistor AMI, the select transistor SEL, and the reset transistor RST. When the p type impurity is implanted into the surface layer portion of the semiconductor substrate SB in the active region for the formation of the amplifier transistor AMI, the select transistor SEL, and the reset transistor RST by the ion implantation IM1, the concentration of the p type impurity in the channel formation regions with these transistors AMI, SEL, and RST may become excessive to cause deviation from the desired threshold values of these transistors AMI, SEL, and RST.

The p type impurity implanted by the ion implantation IMI into the surface layer portion of the semiconductor substrate SB in the active region in which the amplifier transistor AMI, the select transistor SEL, and the reset transistor RST are to be formed can be compensated by the n type impurity implanted by the ion implantation IM2. An amount of the n type impurity implanted by the ion implantation IM2 can be adjusted to a desired value so that the conditions (implantation energy, dose, and the like) of the ion implantation IM2 can be set in consideration of the conditions (implantation energy, dose, frequency of ion implantation, and the like) of the ion implantation IM1. As a result, the impurity concentration of the channel formation region of the amplifier transistor AMI, the select transistor SEL, and the reset transistor RST can be adjusted to a desired value (optimum value) and the threshold voltage of these transistor AMI, SEL, and RST can be adjusted to a desired value (optimum value).

The trenches TR1 and TR2 are designed so that the channel formation region of the transfer transistor TX to be formed later does not overlap with the trenches TR1 and TR2 in plan view and is covered with the mask layer MK, because the $p^+$ type semiconductor region PR is formed so as to be separated to some extent from the channel region of the transfer transistor TX without overlapping with the channel formation region of the transfer transistor TX in plan view. The ion implantation IM1 therefore has little influence on the impurity concentration of the channel formation region of the transfer transistor TX. No impurity is implanted into the channel formation region of the transfer transistor TX to be formed later either by the ion implantation IM1 or by the ion implantation IM2. Since a p type impurity is not implanted by the ion implantation IM1, problem hardly occurs even if an n type impurity is not implanted by the ion implantation IM2.

On the other hand, the channel formation region of the amplifier transistor AMI, the select transistor SEL, and the reset transistor RST to be formed later overlaps with the trench TR1 in plan view so that it is not covered with the mask layer MK. If the trenches TR1 and TR2 are designed so as to cover, with the mask layer MK, the channel formation region of the amplifier transistor AMI, the select transistor SEL, and the reset transistor RST to be formed later, an increase in the distance $P_2$ (refer to FIG. 5) between the photodiodes PD adjacent to each other in the Y direction is required. The increase in the distance $P_2$ of the photodiodes PD adjacent to each other in the Y direction inevitably leads to a reduction in the number of the pixels (PU) that can be arranged in the pixel region 1A, and when the number of the pixels (PU) is the same, leads to an increase in the area of the pixel region 1A. As a result, the channel formation region of the amplifier transistor AMI, the select transistor SEL, and the reset transistor RST to be formed later overlaps with the trench TR1 in plan view. Since by the ion implantation IM1, a p type impurity is implanted into the channel formation region of the amplifier transistor AMI, the select transistor SEL, and the reset transistor RST to be formed later, it becomes necessary to compensate the p type impurity by implanting an n type impurity by the ion implantation IM2 and thereby adjusting the impurity concentration.

In the present embodiment, implantation of an impurity ion into the semiconductor substrate SB by the ion implantation IM2 is prevented at a position overlapping with the trench TR2 in plan view except for the intersection between the trenches TR1 and TR2. This means that no impurity is implanted into a region between the photodiode formation regions PDA adjacent to each other in the X direction by the ion implantation IM2, because leakage between the photodiodes PD (the n type semiconductor regions NW) adjacent to each other in the X direction is suppressed or prevented as much as possible.

Supposing that different from the present embodiment, an impurity ion is implanted by the ion implantation IM2 into the semiconductor substrate SB at a position overlapping with the trench TR2 in plan view and thereby an impurity is implanted into a region between the photodiode formation regions PDA adjacent to each other in the X direction by the ion implantation IM2. In this case, however, leakage between the photodiodes PD (the n type semiconductor regions NW) adjacent to each other in the X direction may increase. This means that the n type semiconductor regions NW including the photodiodes PD adjacent to each other in the X direction have therebetween the p type semiconductor region (the p well PW1 and the $p^+$ type semiconductor region PR). If an n type impurity is inevitably implanted by the ion implantation IM2 between the photodiodes PD (the n type semiconductor regions NW) adjacent to each other in the X direction, leakage is likely to occur between the n type semiconductor regions NW including the photodiodes PD adjacent to each other in the X direction. In short, an n type region (n type layer) is inevitably formed between the n type semiconductor regions NW adjacent to each other in the X direction and leakage is likely to occur via this n type region. It is therefore desired to prevent implantation of an n type impurity between the photodiodes PD (the n type semiconductor regions NW) adjacent to each other in the X direction as much as possible.

In the present embodiment, on the other hand, at a position overlapping, in plan view, with the trench TR2 except for the intersection between the trenches TR1 and TR2, implantation of an impurity ion into the semiconductor substrate SB by the ion implantation IM2 is prevented. An impurity ion is therefore not implanted, by the ion implantation IM2, into a region between the photodiode formation regions PDA adjacent to each other in the X direction. This makes it possible to prevent implantation of an n type impurity having a conductivity type opposite to that of the p well PW1 or $p^+$ type semiconductor region PR into a space between the photodiodes PD (the n type semiconductor regions NW) adjacent to each other in the X direction, thereby suppressing or preventing leakage between the photodiodes PD (the n type semiconductor regions NW) adjacent to each other in the X direction.

The photodiode formation regions PDA adjacent to each other in the Y direction, on the other hand, have therebetween not only the $p^+$ type semiconductor region PR but also the element isolation region ST. Even implantation of an n type impurity into a space between the photodiode formation regions PDA adjacent to each other in the Y direction by the ion implantation IM2 has little influence on the leakage between the photodiodes (the n type semiconductor regions NW) adjacent to each other in the X direction.

The $p^+$ type semiconductor region PR can be separated to some extent (for example, a distance corresponding to about the depth of the element isolation region ST) from the main surface of the semiconductor substrate SB. In the ion implantation IM1, however, there may occur a phenomenon in which a flying impurity ion collides with the side wall of the trenches TR1 and TR2 before being incident on the semiconductor substrate SB and the impurity ion thus having reduced energy is incident on the semiconductor substrate SB. In this case, the impurity ion having reduced energy remains at a shallow position in the semiconductor substrate SB and inevitably acts to increase an impurity ion concentration in the channel formation region. In addition, when the ion implantation IM1 is achieved by the multistage ion implantation, occurrence frequency of this phenomenon increases because of a higher number of implantation times, which inevitably increases the p type impurity concentration in the channel formation region further. The $p^+$ type semiconductor region PR preferably extends to a considerably deep position in the semiconductor substrate SB, but in this case, the mask layer MK must have an adequate thickness to enable the mask layer MK to function as an ion implantation preventive mask. This leads to an increase in the height of the side wall of the trenches TR1 and TR2 in the mask layer MK. Due to the increase in the height of the side wall of the trenches TR1 and TR2 in the mask layer MK, the occurrence frequency of the phenomenon in which a flying impurity ion collides with the side wall of the trenches TR1 and TR2, has reduced energy before being incident on the semiconductor substrate SB, and then is incident on the semiconductor substrate SB inevitably increases. As a result, the p type impurity concentration in the channel formation region inevitably increases further.

On the other hand, in the present embodiment, by an n type impurity implanted into the region overlapping with the trench TR1 in plan view by the ion implantation IM2, the p type impurity implanted into the surface layer portion of the semiconductor substrate SB by the ion implantation IM1 can be compensated and the impurity concentration of the surface layer portion of the semiconductor substrate SB can be controlled. By this, the impurity concentration of the channel formation region of the transistors (AMI, SEL, and RST) formed later in the region overlapping with the trench TR1 in plan view can be adjusted to a desired value (optimum value) and the threshold voltage of these transistors (AMI, SEL, and RST) can be adjusted to a desired value (optimum value).

On the other hand, in plan view, since no transistor is formed in a region between the photodiode formation regions PDA adjacent to each other in the X direction, even the p type impurity implanted, if any, into the surface layer portion of the semiconductor substrate SB by the ion implantation IM1 does not pose any problem.

In FIGS. 36 and 38, in the semiconductor substrate SB, a region (semiconductor region) implanted (injected) with an impurity by the ion implantation IM2 is indicated as a channel dope layer CD. In the ion implantation IM2, an impurity ion may be implanted in the region overlapping with the trench TR1 in plan view even when the region is the semiconductor substrate SB or the element isolation region ST. An impurity is therefore implanted by the ion implantation IM2 also into a portion of the surface layer portion of the element isolation region ST exposed from the trench TR1.

FIG. 37 shows a cross-section of not the trench TR1 but the trench TR2 so that no channel dope layer CD is formed in the cross-section of FIG. 37. This means that no channel dope layer CD is formed in a portion of the semiconductor substrate SB exposed from the trench TR2 except for the intersection between the trenches TR1 and TR2.

As shown in FIGS. 36 and 38, the channel dope layer CD is formed in a portion of the surface layer portion of the semiconductor substrate SB exposed from the trench TR1. The depth of the channel dope layer CD is preferably shallower than the depth of the element isolation region ST. This means that the bottom surface (lower surface) of the channel dope layer CD is preferably shallower than the bottom surface (lower surface) of the element isolation region ST. In other words, the bottom surface (lower surface) of the element isolation region ST is preferably deeper than the bottom surface (lower surface) of the channel dope layer CD. The implantation depth of an impurity ion in the ion implantation IM2 is therefore preferably shallower than the depth of the element isolation region ST. As a result, since an n type impurity ion is not implanted into a position deeper than the bottom surface (lower surface) of the element isolation region ST by the ion implantation IM2, the n type impurity implanted by the ion implantation IM2 can be prevented from becoming a cause of leakage between the photodiodes adjacent to each other in the Y direction.

The implantation depth in the ion implantation IM2 is set shallower than the implantation depth in the ion implantation IM1. This means that a depth of an impurity ion implanted into the semiconductor substrate SB by the ion implantation IM2 is shallower than a depth of an impurity ion implanted by the ion implantation IM1. The $p^+$ type semiconductor region PR therefore extends to a position considerably deeper than the bottom surface (lower surface) of the channel dope layer CD. Although depending on the kind of an impurity ion to be implanted, the implantation energy of the ion implantation IM2 can be made smaller than the implantation energy of the ion implantation IM1.

The implantation depth of the ion implantation IM2 is made shallower than the implantation depth of the ion implantation IM1 because only in the surface layer portion of the semiconductor substrate SB capable of functioning as a channel formation region of the transistors, a p type impurity implanted by the ion implantation IM1 is required to be compensated by an n type impurity implanted by the ion implantation IM2. Implantation of an n type impurity ion into a deep position by the ion implantation IM2 may decrease the impurity concentration of the $p^+$ type semiconductor region PR formed intentionally in the region overlapping with the trench TR1 in plan view, which may deteriorate the function of the $p^+$ type semiconductor region PR. The implantation depth of the ion implantation IM2 is therefore set small.

In the present embodiment, the same (common) mask layer MK is used as an ion implantation preventive mask for the ion implantation IM1 and the ion implantation IM2. Compared with the use of respective mask layers (photoresist patterns) as an ion implantation preventive mask for the ion implantation IM1 and the ion implantation IM2, the number of steps for forming the mask layer (photoresist pattern) can be reduced and thereby, the number of manufacturing steps of the semiconductor device can be reduced. This means that a photoresist layer application step, an exposure step, a development step, and a photoresist layer removal step can be eliminated. As a result, the manufacturing time of the semiconductor device and also the manufacturing cost of the semiconductor device can be reduced. Further, the through-put of the semiconductor device can be improved.

The photoresist pattern formation step and the removal step thereafter are preferably eliminated if possible because they may shave or contaminate the semiconductor substrate SB. When a light receiving element (photoelectric conversion element) such as photodiode PD is formed on the semiconductor substrate SB, it is desired, if possible, to eliminate the photoresist pattern formation step and the removal step thereafter and thereby prevent shaving or contamination of the semiconductor substrate SB because the characteristics of the element are likely to be influenced by the surface condition of the semiconductor substrate SB. Therefore, as in the present embodiment, the photoresist pattern formation step and the removal step thereafter can be eliminated by carrying out the ion implantation IM1 and ion implantation IM2 by using the same (common) mask layer MK so that shaving or contamination of the semiconductor substrate due to the photoresist pattern formation step and the removal step thereafter can be suppressed or prevented. As a result, the production yield of the semiconductor device can be improved. Further, the semiconductor device thus obtained can have improved reliability and improved performance.

In the present embodiment, after formation of the mask layer MK, the ion implantation IM1 and then the ion implantation IM2 is performed. In another mode, after formation of the mask layer MK, the ion implantation IM2 may be followed by the ion implantation IM1. When the ion implantation IM1 is performed by multistage ion implantation, the ion implantation IM2 may be performed during the multistage ion implantation. Anyway, the mask layer MK is shared between the ion implantation IM1 and the ion implantation IM2. When the ion implantation IM1 is carried out by multistage ion implantation, however, it is preferred to carry out the ion implantation IM2 not during the multistage ion implantation but carry out the ion implantation IM2 after completion of the multistage ion implantation or before multistage ion implantation because the ion implantation IM1 and the ion implantation IM2 are different in ion species to be implanted and ion implantation direction. This makes it possible to reduce the time or labor required for the ion implantation IM1 and IM2.

In the present embodiment, at the time of channel doping ion implantation for the formation of the n channel type peripheral transistor LT in the peripheral circuit region 2A, channel doping ion implantation for the formation of the transistors (corresponding to the transfer transistor TX, the amplifier transistor AMI, the select transistor SEL, and the reset transistor RST) in the pixel region 1A may be carried out simultaneously. In this case, if neither the ion implantation IM1 nor the ion implantation IM2 is performed, the impurity concentration of the channel formation region of the n channel type peripheral transistor LT in the peripheral circuit region 2A can be made almost equal to the impurity concentration of the channel formation region of the transistors (TX, AMI, SEL, and RST) in the pixel region 1A. In this case, the threshold voltage of the n channel type peripheral transistor LT in the peripheral circuit region 2A can be made almost equal to the threshold voltage of the transistors (TX, AMI, SEL, and RST) in the pixel region 1A.

The ion implantation IM1 is performed so as to form the $p^+$ type semiconductor region PR for isolating between the photodiodes PD adjacent to each other and it is important for improving the reliability or performance of a semiconductor device having a photoelectric conversion element such as photodiode PD. In the present embodiment, the $p^+$ type semiconductor region PR is formed by carrying out the ion implantation IM1. In the present embodiment, by carrying out the ion implantation IM1 to form the $p^+$ type semiconductor region PR, a semiconductor device having improved reliability or performance can be provided compared with the case where the ion implantation IM1 is not performed and the $p^+$ type semiconductor region is not formed.

If the ion implantation IM1 is carried out and the ion implantation IM2 is not carried out, the p type impurity concentration becomes higher in the channel formation region of the transistors (AMI, SEL, and RST) in the pixel region 1A than in the channel formation region of the n channel type peripheral transistor LT in the peripheral circuit region 2A, because the p type impurity has been implanted by the ion implantation IM1. In this case, there appears a difference in threshold voltage between the n channel type peripheral transistor LT in the peripheral circuit region 2A and the transistors (AMI, SEL, and RST) in the pixel region 1A and a difference in the threshold voltage increases. This makes it difficult to control the circuit in the semiconductor device.

In the present embodiment, on the other hand, not only the ion implantation IM1 for the formation of the $p^+$ type semiconductor region PR but also the ion implantation IM2 is performed. In the surface layer portion of the semiconductor substrate SB in the active region of the transistors (AMI, SEL, and RST) in the pixel region 1A, the p type impurity implanted by the ion implantation IM1 can be compensated by the n type impurity implanted by the ion implantation IM2. As a result, the impurity concentration of the channel formation region of the n channel type peripheral transistor LT in the peripheral circuit region 2A can be made almost equal to the impurity concentration of the channel formation region of the transistors (TX, AMI, SEL, and RST) in the pixel region 1A. Accordingly, the threshold voltage of the n channel type peripheral transistor LT in the peripheral circuit region 2A can be made almost equal to that of the transistors (TX, AMI, SEL, and RST) in the pixel region 1A. This facilitates control of the circuit in the semiconductor device and as a result, the semiconductor device can have improved performance.

After the ion implantation IM2 is performed in such a manner, the mask layer MK is removed.

Next, as shown in FIGS. 39 to 43, gate electrodes GT, GE, and GL are formed. The gate electrodes GT, GE, and GL are formed on the semiconductor substrate SB via a gate insulating film GF. The gate electrodes GT, GE, and GL are formed, for example, in the following manner.

Described specifically, first, the main surface of the semiconductor substrate SB is cleaned by washing treatment or the like and then an insulating film (for example, a silicon oxide film) for gate insulating film GF is formed on the main surface of the semiconductor substrate SB by thermal oxidation or the like. Then, a conductive film (for example, a doped polysilicon film) for gate electrode is formed on the semiconductor substrate SB, that is, on the insulating film for gate insulating film GF by using CVD (chemical vapor deposition) or the like and then the conductive film for gate electrode is patterned by photolithography and dry etching. As a result, the gate electrodes GT, GE, and GL included of a patterned conductive film can be formed.

The gate electrode GT functions as a gate electrode of the transfer transistor TX and is formed on the semiconductor substrate SB (the p well PW1) via the gate insulating film GF in the pixel region 1A. The gate electrode GE of each of the amplifier transistor AMI, the select transistor SEL, and the reset transistor RST is formed on the semiconductor substrate (the p well PW3) via the gate insulating film GF in the pixel region 1A. The gate electrode GL of the peripheral transistor LT is formed on the semiconductor substrate SB (the p well PW4) via the gate insulating film GF in the peripheral circuit region 2A. Each of the gate electrodes GT, GE, and GL may partially be located on the element isolation region ST.

Next, as shown in FIGS. 44 to 48, an n type semiconductor region NW is formed in the semiconductor substrate SB (the p well PW1) in the pixel region 1A by ion implantation. The n type semiconductor region NW can be formed by ion implantation of an n type impurity such as phosphorus (P) or arsenic (As) into the semiconductor substrate SB (the p well PW1) in the pixel region 1A.

The n type semiconductor region NW is an n type semiconductor region for the formation of the photodiode PD and the depth of (the bottom surface) of the n type semiconductor region NW is shallower than the depth of (the bottom surface) of the p well PW1 and the n type semiconductor region NW is embraced in the p well PW1. Since the n type semiconductor region NW is embraced in the p well PW1, the n type semiconductor region NW has a bottom surface and a side surface contiguous to the p well PW1.

At the time of ion implantation for the formation of the n type semiconductor region NW, by using a photoresist pattern (not shown), which has been formed in advance on the semiconductor substrate SB and has an opening portion at a formation region of the n type semiconductor region NW, as an ion implantation preventive mask, an n type impurity is ion-implanted to form the n type semiconductor region NW. At this time, since in the semiconductor substrate SB in the pixel region 1A, the formation region of the n type semiconductor region NR or active region having therein the amplifier transistor AMI, the select transistor SEL, and the reset transistor RST are covered with a photoresist pattern (not shown), no impurity ion is implanted therein. In addition, since the peripheral circuit region 2A is covered with a photoresist pattern, no impurity ion is implanted into the semiconductor substrate SB in the peripheral circuit region 2A. This means that at the time of ion implantation for the formation of the n type semiconductor region NW, an n type impurity is ion implanted selectively into the formation region of the n type semiconductor region NW while covering the semiconductor substrate SB of a region other than the formation region of the n type semiconductor region NW with a photoresist pattern (not shown). Then, the photoresist pattern (not shown) is removed.

Next, a $p^+$ type semiconductor region HP is formed in the semiconductor substrate SB in the pixel region 1A by ion implantation. The $p^+$ type semiconductor region HP can be formed by ion implantation of a p type impurity such as boron (B) into the semiconductor substrate SB (the p well PW1) in the pixel region 1A.

The p+ type semiconductor region HP is a p+ type semiconductor region heavily implanted (doped) with a p type impurity and the impurity concentration of the p+ type semiconductor region HP is higher than the impurity concentration (p type impurity concentration) of the p well PW1. The depth of (the bottom surface) of the p+ type semiconductor region HP is shallower than the depth of (the bottom surface) of the n type semiconductor region NW and the p+ type semiconductor region HP is formed mainly in the surface layer portion of the n type semiconductor region NW.

At the time of ion implantation for the formation of the p+ type semiconductor region HP, a photoresist pattern (not shown) having an opening in the formation region of the p+ type semiconductor region HP is formed in advance on the semiconductor substrate SB and with this photoresist pattern as an ion implantation preventive mask, a p type impurity is ion-implanted to form the p+ type semiconductor region HP. At the time of this ion implantation, in the semiconductor substrate SB in the pixel region 1A, no impurity ion is implanted into a region where the n type semiconductor region NR is to be formed later or the active region having therein the amplifier transistor AMI, the select transistor SEL, and the reset transistor RST because they are covered with the photoresist pattern (not shown). In addition, at the time of this ion implantation, since the entirety of the peripheral circuit region 2A is covered with a photoresist pattern, no impurity ion is implanted into the semiconductor substrate SB in the peripheral circuit region 2A. This means that at the time of ion implantation for the formation of the p+ type semiconductor region HP, the semiconductor substrate SB of a region other than the formation region of the p+ type semiconductor region HP is covered with the photoresist pattern (not shown) and a p type impurity is ion-implanted selectively into the formation region of the p+ type semiconductor region HP. Then, the photoresist pattern (not shown) is removed.

A photodiode (PN junction diode) PD is formed by the p well PW1, the n type semiconductor region NW, and the p+ type semiconductor region HP.

After formation of the p+ type semiconductor region HP by ion implantation, heat treatment, more specifically, annealing treatment for repairing crystal defects (crystal defects mainly attributable to ion implantation) is preferably performed. This annealing treatment can repair the crystal defects of the n type semiconductor region NW, the p+ type semiconductor region HP, and the like. In addition, by this annealing treatment, crystal defects in the ion-implanted regions (for example, the n type semiconductor region NW and the p+ type semiconductor region HP) can be repaired and at the same time, the implanted impurity can be activated.

Next, as shown in FIGS. 49 to 52, an n type semiconductor region NR, source and drain regions SD of each of the amplifier transistor AMI, the select transistor SE, and the reset transistor RST, and source and drain regions SDL of the peripheral transistor LT are formed. The n type semiconductor region NR, the source and drain regions SD, and the source and drain regions SDL can each be formed by ion implantation of an n type impurity. The n type semiconductor region NR, the source and drain regions SD, and the source and drain regions SDL may be formed by the same ion implantation or different ion implantation. Anyway, they are formed by ion implantation of an n type impurity into the semiconductor substrate SB.

Alternatively, the n type semiconductor region NR, the source and drain regions SD, and the source and drain regions SDL may be formed by ion implantation after forming an n type extension region having a low impurity concentration by ion implantation and then forming a sidewall insulating film called "sidewall spacer" on the side wall of each of the gate electrodes GT, GE, and GL. In this case, the n type semiconductor region NR, the source and drain regions SD, and the source and drain regions SDL each have an LDD structure. Alternatively, one or two of the n type semiconductor region NR, the source and drain regions SD, and the source and drain regions SDL may have an LDD structure and the other two or one may not.

The n type semiconductor region NR is formed in the semiconductor substrate SB (the p well PW1) on the drain side of two sides of the gate electrode GT. The drain side corresponds to a side opposite to the side on which the n type semiconductor region NW has been formed. The source and drain regions SD are formed in the semiconductor substrate SB (the p well PW3) on both sides of the gate electrode GE. The source and drain regions SDL are formed in the semiconductor substrate SB (the p well PW4) on both sides of the gate electrode GL.

Next, annealing treatment (heat treatment) is performed to activate the impurities implanted by the ion implantation performed so far.

In such a manner, the photodiode PD, the transfer transistor TX, the amplifier transistor AMI, the select transistor SEL, and the reset transistor RST are formed in the semiconductor substrate SB in the pixel region 1A, whereas the peripheral transistor LT is formed on the semiconductor substrate SB in the peripheral circuit region 2A.

Next, as shown in FIGS. 10 to 14, an insulating film is formed on the main surface of the semiconductor substrate SB and then the insulating film is patterned by photolithography and dry etching to form a cap insulating film (protective film) CP in the pixel region 1A. The cap insulating film CP can be formed, for example, from a silicon oxide film. In another mode, the cap insulating film CP may be formed after formation of the n type semiconductor region NW and the p+ type semiconductor region HP but before formation of the n type semiconductor region NR and the source and drain regions SD and SDL.

Next, a low-resistance metal silicide layer (not shown) made of nickel silicide, cobalt silicide, or the like can also be formed on the upper portion of each of the n type semiconductor region NR, the source and drain regions SD, the source and drain regions SDL, and the gate electrodes GT, GE, and GL by the salicide (self aligned silicide) technology. The metal silicide layer thus formed contributes to reduction in resistance such as diffusion resistance or contact resistance.

Next, as shown in FIGS. 10 to 14, an interlayer insulating film IL1 is formed as an insulating film on the main surface (entire main surface) of the semiconductor substrate SB so as to cover the gate electrodes GT, GE, GL and the cap insulating film CP. After formation of the interlayer insulating film IL1, the surface of the interlayer insulating film IL1 may be polished by CMP (chemical mechanical polishing) to planarize the upper surface of the interlayer insulating film IL1.

Next, as shown in FIGS. 10 to 14, the interlayer insulating film IL1 is dry etched using, as an etching mask, a photoresist pattern (not shown) formed on the interlayer insulating film IL1 to form a contact hole (through-hole) in the interlayer insulating film IL1. Then, a conductive plug PG made of tungsten (W) or the like is formed as a coupling conductor portion in the contact hole of the interlayer insulating film IL1. The plug PG can be formed, for example, by forming a conductive film for plug PG on the interlayer insulating film IL1 to fill the contact hole therewith and then removing an unnecessary portion of the conductive film outside the contact hole by CMP or etch back.

Next, as shown in FIGS. 10 to 14, interlayer insulating films IL2 to IL4 and wirings M1 to M3 are formed on the interlayer insulating film IL1 having therein the plug PG.

For example, the interlayer insulating film IL2 is formed on the interlayer insulating film IL1 and then a wiring trench is formed in the interlayer insulating film IL2 by photolithography and dry etching. Then, a barrier conductor film is formed on the interlayer insulating film IL2 including the bottom surface and inner wall of the wiring trench. After deposition of a thin copper film as a seed film on the barrier conductor film by sputtering or the like, a copper plating film is deposited as a main conductor film on the seed film by electroplating and with this copper plating film, the wiring trench is filled. Then, an unnecessary portion of the copper plating film, the seed film, and the barrier conductor film outside the wiring trench are removed by CMP or the like to form a first-layer wiring M1 in the wiring trench.

Further, similarly, as shown in FIGS. 10 to 14, the interlayer insulting film IL3 is formed on the interlayer insulating film IL2 having therein the wiring M1; the wiring M2 is formed in the interlayer insulating film IL3; the interlayer insulating film IL4 is formed on the interlayer insulating film IL3 having therein the wiring M2; and then the wiring M3 is formed in the interlayer insulating film IL4. The wiring M1 is formed by the single damascene process, but the wiring M2 and the wiring M3 can be formed by either the single damascene or dual damascene process.

In the interlayer insulating film IL3, a via portion placed between the wiring M2 and the wiring M1 and coupling the wiring M2 to the wiring M1 is formed, while in the interlayer insulating film IL4, a via portion placed between the wiring M3 and the wiring M2 and coupling the wiring M3 to the wiring M2 is formed.

Next, a microlens (not shown) as an on-chip lens may be attached onto the uppermost interlayer insulating film IL4 so as to overlap, in plan view, with the n type semiconductor region NW including the photodiode PD. The microlens and the interlayer insulating film IL4 may have therebetween a color filter.

By the above-mentioned steps, the semiconductor device of the present embodiment can be manufactured.

In the present embodiment, charges stored in the photodiode PD (the n type semiconductor region NW) and transferred to the floating diffusion FD (the n type semiconductor region NR) by the transfer transistor TX are electrons. In another mode, the conductivity type described in the present embodiment may be inverted. In this case, charges stored in the photodiode PD and transferred to the floating diffusion FD by the transfer transistor TX are holes. Since the mobility of electrons is higher than that of holes, it is preferred that as in the present embodiment, the charges stored in the photodiode PD and transferred to the floating diffusion FD by the transfer transistor TX are electrons.

<Main Characteristics and Advantages>

The various characteristics and advantages of the present embodiment have already been described above so that some of the main characteristics will be described here.

The semiconductor device of the present embodiment has a semiconductor substrate SB, a plurality of photodiodes PD arranged in array form in the X direction and in the Y direction intersecting with the X direction in the main surface of the semiconductor substrate SB, a $p^+$ type semiconductor region PR formed in the semiconductor substrate SB so as to surround each of the photodiodes PD in plan view, and a plurality of transistors placed between the photodiodes PD adjacent to each other in the Y direction on the main surface of the semiconductor substrate SB. The photodiodes PD are formed as a photoelectric conversion element.

The method of manufacturing the semiconductor device of the present embodiment has a step of forming, on the semiconductor substrate SB, a mask layer MK having an opening portion OP at a region where a $p^+$ type semiconductor region PR is to be formed and a step of forming a $p^+$ type semiconductor region PR in the semiconductor substrate SB by ion implantation of a p type impurity into the semiconductor substrate SB by using the mask layer as an ion implantation preventive mask (ion implantation IM1). The method of manufacturing a semiconductor device further has a step of implanting an n type impurity into the semiconductor substrate SB by using the mask layer MK as an ion implantation preventive mask (ion implantation IM2). In the step of implanting an n type impurity into the semiconductor substrate SB by using the mask layer MK as an ion implantation preventive mask (ion implantation IM2), the impurity ion is implanted into a first region corresponding to a region between the photodiodes PD adjacent to each other in the Y direction, but the impurity ion is not implanted into a second region corresponding to a region between the photodiodes PD adjacent to each other in the X direction.

In the present embodiment, an n type impurity is implanted into the first region corresponding to the region between the photodiodes PD adjacent to each other in the Y direction by the step of implanting an type impurity (ion implantation IM2) so that the characteristics of a transistor placed between the photodiodes PD adjacent to each other in the Y direction can be controlled. For example, the impurity concentration of a channel formation region of a transistor placed between the photodiodes PD adjacent to each other in the Y direction can be adjusted to control the threshold voltage to a desired value. On the other hand, the n type impurity is not implanted into the second region corresponding to a region between the photodiodes PD adjacent to each other in the X direction by the above-mentioned step of implanting an n type impurity (ion implantation IM2) so that it is possible to prevent implantation of an n type impurity from deteriorating the function of the $p^+$ type semiconductor region PR placed between the photodiodes PD adjacent to each other in the X direction. Accordingly, the semiconductor device thus obtained can have improved performance and improved reliability. In addition, the ion implantation (ion implantation IM1) of a p type impurity for the formation of the $p^+$ type semiconductor region P and the ion implantation (ion implantation IM2) of an n type impurity are carried out using the same mask layer MK. As a result, the number of manufacturing steps of the semiconductor device can be reduced and therefore a manufacturing cost of the semiconductor device can be reduced. Further, since the step of forming a mask layer for ion implantation and a step of removing the mask layer can be eliminated, shaving or contamination of the semiconductor substrate SB can be suppressed or prevented. As a result, the production yield of the semiconductor device can be improved. Further, the semiconductor device thus obtained can have improved reliability.

The region between photodiodes PD adjacent to each other in the Y direction substantially agrees with the region between the photodiode formation regions PDA adjacent to each other in the Y direction and the region between the photodiodes PD adjacent to each other in the X direction substantially agrees with the region between the photodiode formation regions PDA adjacent to each other in the X direction. Therefore, the first region corresponding to the region between the photodiodes PD adjacent to each other in the Y direction means, before formation of the photodiodes PD, the region between the photodiode formation regions PDA adjacent to each other in the Y direction, while it means, after formation of the photodiodes PD, the region between the photodiodes PD adjacent to each other in the Y direction. The second region corresponding to the region between the photodiodes PD adjacent to each other in the X direction means, before formation of the photodiodes PD, the region between the photodiode formation regions PDA adjacent to each other in the X direction, while it means, after formation of the photodiodes PD, the region between the photodiodes PD adjacent to each other in the X direction.

Further, in the present embodiment, various improvements are applied to the constitution or layout of the component elements, the ion implantation IM1, the ion implantation IM2, and the mask layer MK, but an overlapping description is omitted here.

The invention made by the present inventors has been described specifically based on its embodiment. It is needless to say that the invention is not limited to or by the embodiment but can be changed in various ways without departing from the gist of the invention.

What is claimed is:

1. A method of manufacturing a semiconductor device having a semiconductor substrate, a plurality of photoelectric conversion elements placed in array form in a first direction and a second direction intersecting therewith in a main surface of the semiconductor substrate, a first semiconductor region of a first conductivity type formed in the semiconductor substrate to surround each of the photoelectric conversion elements in plan view, and a plurality of transistors placed between the photoelectric conversion elements adjacent to each other in the second direction in the main surface of the semiconductor substrate, comprising the steps of:
   (a) providing the semiconductor substrate;
   (b) forming the first semiconductor region with the first conductivity type in the semiconductor substrate; and
   (c) forming the photoelectric conversion elements each having a second semiconductor region of a second conductivity type opposite to the first conductivity type and the transistors in and on the semiconductor substrate, respectively;
   wherein the step (b) further comprises the steps of:
   (b1) forming, over the semiconductor substrate, a mask layer having an opening portion at a region in which the first semiconductor region is to be formed; and
   (b2) forming the first semiconductor region of the first conductivity type in the semiconductor substrate by ion implantation of an impurity of the first conductivity type into the semiconductor substrate by using the mask layer as an ion implantation preventive mask;
   wherein the method further comprises the step of:
   (d) carrying out ion implantation of an impurity of the second conductivity type into the semiconductor substrate by using the mask layer as an ion implantation preventive mask;
   wherein in the step (d), in the main surface of the semiconductor substrate, ion implantation into a first region corresponding to a region between the photoelectric conversion elements adjacent to each other in the second direction is performed but ion implantation into a second region corresponding to a region between the photoelectric conversion elements adjacent to each other in the first direction is not performed.

2. The method of manufacturing a semiconductor device according to claim 1,
   wherein the photoelectric conversion elements are each a photodiode.

3. The method of manufacturing a semiconductor device according to claim 2,
   wherein the first semiconductor region has a depth greater than a depth of the second semiconductor region.

4. The method of manufacturing a semiconductor device according to claim 1,
   wherein the first semiconductor region is formed in lattice form in plan view in the semiconductor substrate.

5. The method of manufacturing a semiconductor device according to claim 1,
   wherein the second semiconductor region is formed in a third semiconductor region of the first conductivity type formed in the semiconductor substrate and surrounded by the first semiconductor region in plan view, and
   wherein the first semiconductor region has an impurity concentration higher that of the third semiconductor region.

6. The method of manufacturing a semiconductor device according to claim 1,
   wherein in the step (b2), the first semiconductor region is formed by carrying out ion implantation a plurality of times at varied implantation energies while using the mask layer as an ion implantation preventive mask.

7. The method of manufacturing a semiconductor device according to claim 1,
   wherein an implantation depth in the step (d) is shallower than an implantation depth in the step (b2).

8. The method of manufacturing a semiconductor device according to claim 1,
   wherein the ion implantation in the step (d) functions as channel doping ion implantation for the transistors.

9. The method of manufacturing a semiconductor device according to claim 1,
   wherein the photoelectric conversion elements adjacent to each other in the first direction has no transistor therebetween.

10. The method of manufacturing a semiconductor device according to claim 1, further comprising the step of:
    (e) forming an element isolation region having an insulator in the main surface of the semiconductor substrate;
    wherein after the steps (e) and (c), the photoelectric conversion elements adjacent to each other in the second direction have therebetween the element isolation region and an active region surrounded by the element isolation region in plan view.

11. The method of manufacturing a semiconductor device according to claim 1,
    wherein, after the steps (e) and (c), the photoelectric conversion elements adjacent to each other in the first direction do not have therebetween the element isolation region.

12. The method of manufacturing a semiconductor device according to claim 11,
    wherein in the first region, the element isolation region has therebelow the first semiconductor region.

13. The method of manufacturing a semiconductor device according to claim 1, wherein ion implantation in the step (b2) is vertical ion implantation.

14. The method of manufacturing a semiconductor device according to claim 1,
wherein ion implantation in the step (d) is oblique ion implantation.

15. The method of manufacturing a semiconductor device according to claim 14,
wherein the opening portion of the mask layer has a plurality of first trenches each extending in the first direction and a plurality of second trenches each extending in the second direction, and
wherein the first trenches and the second trenches intersect with each other.

16. The method of manufacturing a semiconductor device according to claim 15,
wherein in the step (b2), a direction of ion implantation is set so as to implant an impurity ion into a portion of the semiconductor substrate exposed from the first trenches and a portion of the semiconductor substrate exposed from the second trenches; and
wherein in the step (d), a direction of ion implantation is set so as to implant an impurity ion into a portion of the semiconductor substrate exposed from the first trenches but so as not to implant the impurity ion into a portion of the semiconductor substrate exposed from the second trenches except for intersections between the first trenches and the second trenches, blocked by the mask layer.

17. The method of manufacturing a semiconductor device according to claim 16,
wherein the direction of ion implantation in the step (d) is parallel to a plane parallel to both a normal line direction of the main surface of the semiconductor substrate and the first direction.

18. The method of manufacturing a semiconductor device according to claim 17,
wherein the following formula: $\tan \theta > W1/H1$ is satisfied, in which $\theta$ represents an inclination angle of the direction of ion implantation in the step (d) to the normal line direction of the main surface of the semiconductor substrate, W1 represents a width of each of the second trenches in the first direction, and H1 represents a height of the side wall of each of the second trenches.

19. The method of manufacturing a semiconductor device according to claim 1,
wherein the first conductivity type is a p type and the second conductivity type is an n type.

* * * * *